(12) United States Patent
Yang

(10) Patent No.: US 10,622,310 B2
(45) Date of Patent: Apr. 14, 2020

(54) METHOD FOR FABRICATING GLASS SUBSTRATE PACKAGE

(71) Applicant: Ping-Jung Yang, Hsin-Chu (TW)

(72) Inventor: Ping-Jung Yang, Hsin-Chu (TW)

(73) Assignee: Ping-Jung Yang, Hsin-Chu (TW)

( * ) Notice: Subject to any disclaimer, the term of this patent is extended or adjusted under 35 U.S.C. 154(b) by 112 days.

(21) Appl. No.: 15/261,956

(22) Filed: Sep. 11, 2016

(65) Prior Publication Data

US 2017/0047313 A1 Feb. 16, 2017

Related U.S. Application Data

(63) Continuation-in-part of application No. 14/036,256, filed on Sep. 25, 2013, now Pat. No. 9,615,453.

(Continued)

(51) Int. Cl.
*H01L 25/16* (2006.01)
*H01L 23/538* (2006.01)
(Continued)

(52) U.S. Cl.
CPC .......... *H01L 23/5384* (2013.01); *H01L 23/15* (2013.01); *H01L 23/49811* (2013.01);
(Continued)

(58) Field of Classification Search
CPC ............. H01L 23/5384; H01L 51/0096; H01L 23/49833; H01L 23/49827;
(Continued)

(56) References Cited

U.S. PATENT DOCUMENTS

| 4,221,047 A | 9/1980 | Narken et al. |
| 4,639,543 A | 1/1987 | Fang |

(Continued)

FOREIGN PATENT DOCUMENTS

| WO | 2012/0068271 | 3/2012 |
| WO | 2013/138452 | 9/2013 |

*Primary Examiner* — Anthony J Frost

(57) ABSTRACT

A display device comprises a display panel substrate and a glass substrate over said display panel substrate, wherein said display panel substrate comprises multiple contact pads, a display area, a first boundary, a second boundary, a third boundary and a fourth boundary, wherein said display area comprises a first edge, a second edge, a third edge and a fourth edge, wherein said first boundary is parallel to said third boundary and said first and third edges, wherein said second boundary is parallel to said fourth boundary and said second and fourth edges, wherein a first least distance between said first boundary and said first edge, wherein a second least distance between said second boundary and said second edge, a third least distance between said third boundary and said third edge, a fourth distance between said fourth boundary and said fourth edge, and wherein said first, second, third and fourth least distances are smaller than 100 micrometers, and wherein said glass substrate comprising multiple metal conductors through in said glass substrate and multiple metal bumps are between said glass substrate and said display panel substrate, wherein said one of said metal conductors is connected to one of said contact pads through one of said metal bumps.

20 Claims, 64 Drawing Sheets

Related U.S. Application Data

(60) Provisional application No. 62/219,249, filed on Sep. 16, 2015, provisional application No. 61/705,649, filed on Sep. 26, 2012.

(51) Int. Cl.
  *H01L 23/15* (2006.01)
  *H01L 23/498* (2006.01)
  *H01L 51/00* (2006.01)
  *H01L 23/00* (2006.01)

(52) U.S. Cl.
  CPC .. *H01L 23/49827* (2013.01); *H01L 23/49833* (2013.01); *H01L 51/0096* (2013.01); *H01L 23/49816* (2013.01); *H01L 23/49822* (2013.01); *H01L 24/05* (2013.01); *H01L 24/13* (2013.01); *H01L 24/16* (2013.01); *H01L 25/16* (2013.01); *H01L 2224/03462* (2013.01); *H01L 2224/0401* (2013.01); *H01L 2224/0558* (2013.01); *H01L 2224/05124* (2013.01); *H01L 2224/05144* (2013.01); *H01L 2224/05147* (2013.01); *H01L 2224/05155* (2013.01); *H01L 2224/05572* (2013.01); *H01L 2224/05624* (2013.01); *H01L 2224/05644* (2013.01); *H01L 2224/05647* (2013.01); *H01L 2224/05655* (2013.01); *H01L 2224/1146* (2013.01); *H01L 2224/11334* (2013.01); *H01L 2224/11462* (2013.01); *H01L 2224/131* (2013.01); *H01L 2224/13005* (2013.01); *H01L 2224/1308* (2013.01); *H01L 2224/13022* (2013.01); *H01L 2224/13076* (2013.01); *H01L 2224/13109* (2013.01); *H01L 2224/13111* (2013.01); *H01L 2224/13144* (2013.01); *H01L 2224/13147* (2013.01); *H01L 2224/13155* (2013.01); *H01L 2224/16147* (2013.01); *H01L 2224/16237* (2013.01); *H01L 2224/2919* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48228* (2013.01); *H01L 2224/48465* (2013.01); *H01L 2224/73204* (2013.01); *H01L 2224/73265* (2013.01); *H01L 2924/12042* (2013.01); *H01L 2924/12044* (2013.01); *H01L 2924/1461* (2013.01); *H01L 2924/15311* (2013.01); *H01L 2924/181* (2013.01); *H01L 2924/30107* (2013.01); *Y02E 10/549* (2013.01); *Y10T 428/10* (2015.01); *Y10T 428/1036* (2015.01)

(58) Field of Classification Search
  CPC ............... H01L 23/49811; H01L 23/15; H01L 2224/05155; H01L 2224/05144; H01L 2224/05572; H01L 2224/13109; H01L 2224/13022; H01L 2224/11462; H01L 2224/1146; H01L 2224/11334; H01L 2224/05655; H01L 2224/05647; H01L 2224/05644; H01L 2224/03462; H01L 24/05; H01L 2224/0558; H01L 2224/13005; H01L 2224/16147; H01L 2224/45139; H01L 2224/45124; H01L 2224/05624; H01L 23/49822; H01L 23/49816; H01L 2924/30107; H01L 2924/15311; H01L 2924/1461; H01L 2224/73265; H01L 2224/73204; H01L 2224/48465; H01L 2224/48228; H01L 2224/48091; H01L 2224/45147; H01L 2224/45144; H01L 2224/32225; H01L 2224/2919; H01L 2224/16237; H01L 2224/13155; H01L 2224/13147; H01L 2224/13144; H01L 2224/13111; H01L 2224/131; H01L 2224/05147; H01L 2224/05124; H01L 2224/0401; H01L 25/16; H01L 24/16; H01L 24/13; H01L 2924/12044; H01L 2924/12042; H01L 2924/181; H01L 2224/13076; H01L 2224/1308; Y10T 428/10; Y10T 428/1036; Y02E 10/549

See application file for complete search history.

(56) References Cited

U.S. PATENT DOCUMENTS

| | | | |
|---|---|---|---|
| 4,975,103 A | 12/1990 | Ackermann et al. | |
| 5,294,238 A | 3/1994 | Fukada et al. | |
| 5,705,855 A * | 1/1998 | Carson .................... | H01L 24/10 257/668 |
| 6,156,413 A | 12/2000 | Tomari et al. | |
| 6,177,707 B1 | 1/2001 | Dekker et al. | |
| 6,194,762 B1 | 2/2001 | Yamazaki et al. | |
| 6,309,901 B1 | 10/2001 | Tahon et al. | |
| 6,339,197 B1 | 1/2002 | Fushie et al. | |
| 6,539,750 B1 | 4/2003 | Takagi et al. | |
| 6,673,698 B1 | 1/2004 | Lin et al. | |
| 6,691,409 B2 | 2/2004 | Suzuki et al. | |
| 6,772,514 B2 | 8/2004 | Ogura et al. | |
| 6,799,438 B2 | 10/2004 | Herzbach et al. | |
| 6,839,946 B2 | 1/2005 | Ylilammi et al. | |
| 6,894,358 B2 | 5/2005 | Leib et al. | |
| 6,989,604 B1 | 1/2006 | Woo et al. | |
| 7,038,309 B2 | 5/2006 | Hsu et al. | |
| 7,071,521 B2 | 7/2006 | Leib et al. | |
| 7,072,018 B2 | 7/2006 | Mori et al. | |
| 7,091,589 B2 | 8/2006 | Mori et al. | |
| 7,259,080 B2 | 8/2007 | Quenzer et al. | |
| 7,279,771 B2 | 10/2007 | Sunohara et al. | |
| 7,285,834 B2 | 10/2007 | Leib et al. | |
| 7,337,540 B2 | 3/2008 | Kurosawa | |
| 7,362,403 B2 | 4/2008 | Uehara | |
| 7,476,623 B2 | 1/2009 | Schreder et al. | |
| 7,749,900 B2 | 7/2010 | Li et al. | |
| 7,808,799 B2 | 10/2010 | Kawabe | |
| 7,993,510 B2 | 8/2011 | En | |
| 8,207,453 B2 | 6/2012 | Ma et al. | |
| 2002/0038725 A1 | 4/2002 | Suzuki et al. | |
| 2002/0145197 A1 | 10/2002 | Ohta et al. | |
| 2002/0159243 A1 | 10/2002 | Ogawa et al. | |
| 2005/0012217 A1 | 1/2005 | Mori et al. | |
| 2006/0006539 A1 | 1/2006 | Matsui et al. | |
| 2006/0020371 A1 | 1/2006 | Ham | |
| 2007/0045841 A1 | 3/2007 | Cho et al. | |
| 2007/0268581 A1* | 11/2007 | Palmateer ............. | B81B 7/0038 359/512 |
| 2008/0054457 A1 | 3/2008 | Lin et al. | |
| 2008/0080111 A1 | 4/2008 | Lin et al. | |
| 2008/0113505 A1 | 5/2008 | Sparks | |
| 2008/0129439 A1 | 6/2008 | Nishikawa | |
| 2008/0149384 A1 | 6/2008 | Kawabe | |
| 2008/0150623 A1 | 6/2008 | Lin et al. | |
| 2008/0283277 A1 | 11/2008 | Muramatsu et al. | |
| 2008/0284014 A1 | 11/2008 | Lin et al. | |
| 2008/0318361 A1 | 12/2008 | Han | |
| 2009/0109655 A1* | 4/2009 | Shinozaki ......... | G02F 1/133603 362/97.1 |
| 2009/0174065 A1 | 7/2009 | Hayashi et al. | |
| 2009/0273073 A1 | 11/2009 | Tachibana et al. | |
| 2010/0164030 A1 | 7/2010 | Oggioni et al. | |
| 2010/0200898 A1 | 8/2010 | Lin et al. | |
| 2010/0246152 A1 | 9/2010 | Lin et al. | |
| 2010/0290191 A1 | 11/2010 | Lin et al. | |
| 2011/0026232 A1 | 2/2011 | Lin et al. | |
| 2011/0065250 A1 | 3/2011 | Tokunaga | |

(56) References Cited

U.S. PATENT DOCUMENTS

2011/0089574 A1 4/2011 Itoh
2011/0147055 A1* 6/2011 Ma .................... H01L 21/4803
 174/255
2011/0169017 A1* 7/2011 Stainer ................ H01L 27/3248
 257/88
2011/0242050 A1* 10/2011 Byun ................... G06F 3/0418
 345/174

* cited by examiner

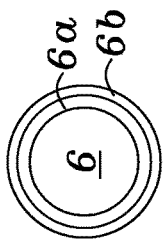
Fig. 5c
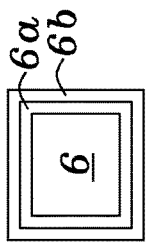
Fig. 5f
Fig. 5i
Fig. 5b
Fig. 5e
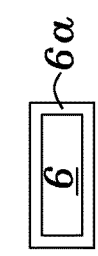
Fig. 5h
Fig. 5a
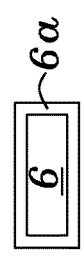
Fig. 5d
Fig. 5g

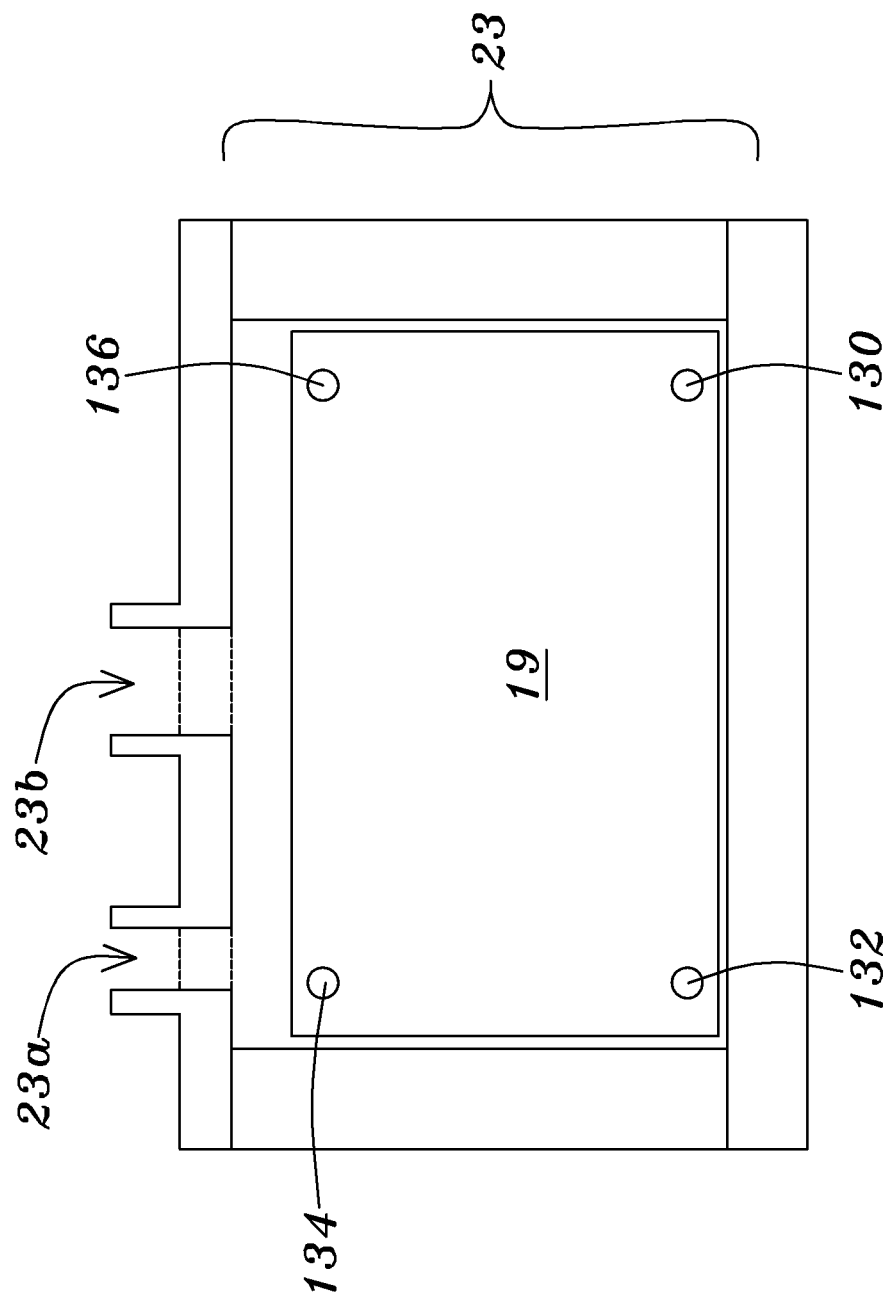

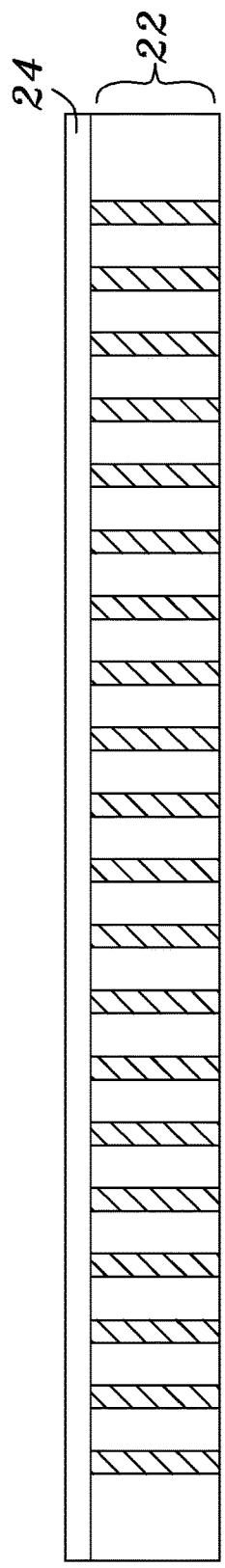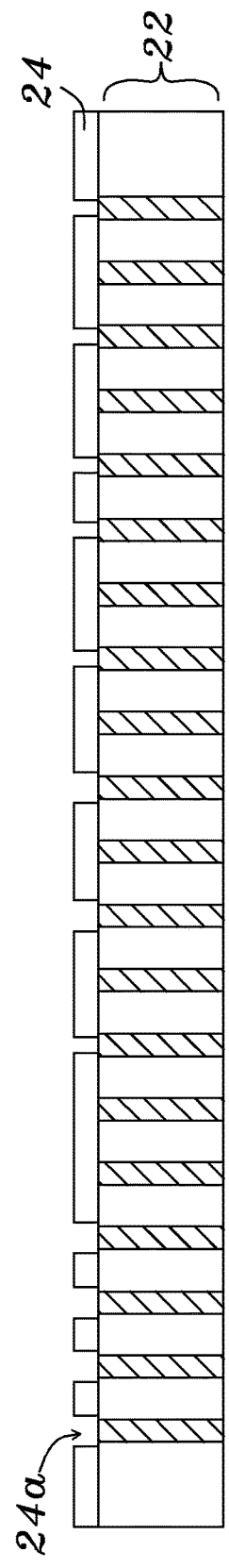
Fig. 9a
Fig. 9b

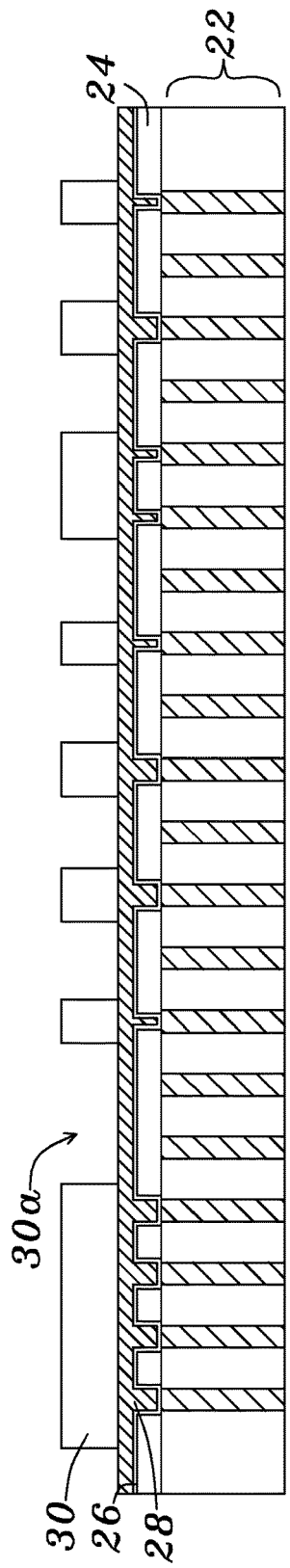
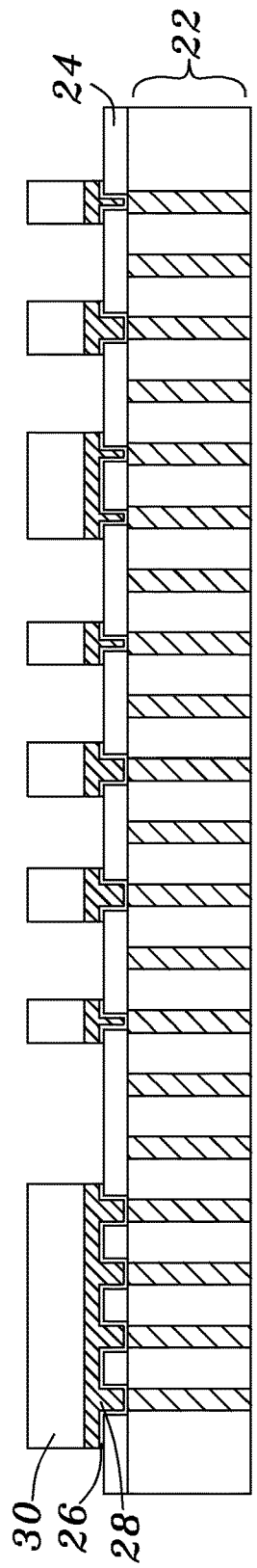
Fig. 9e
Fig. 9f

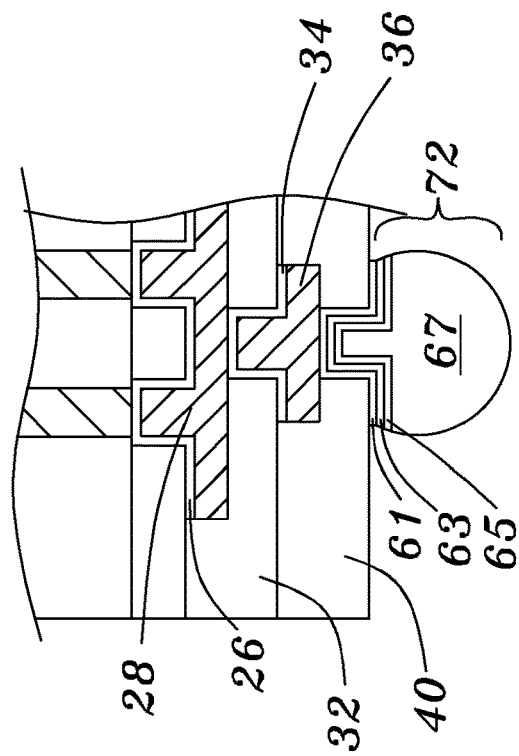
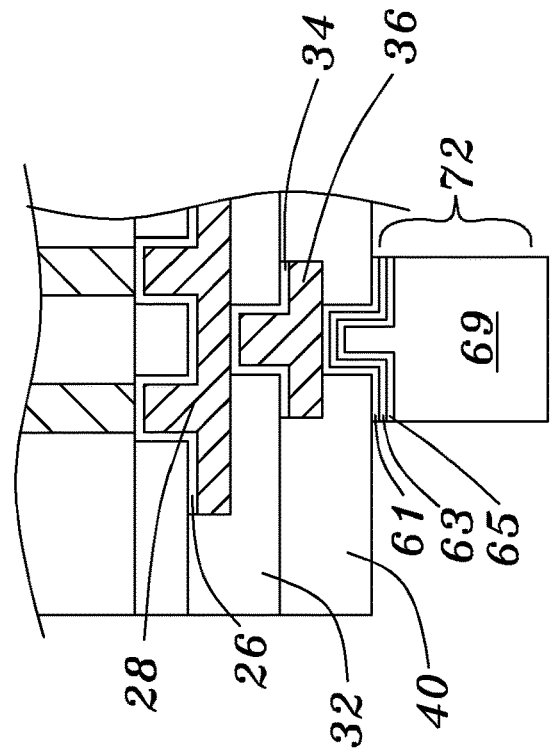
Fig. 9v

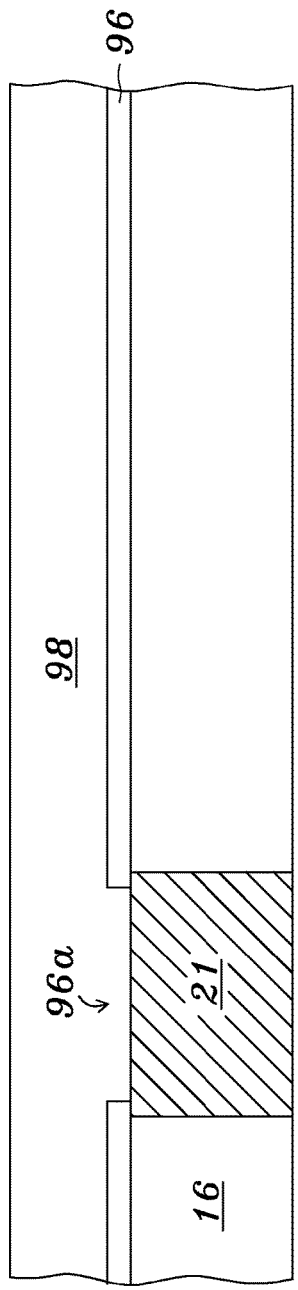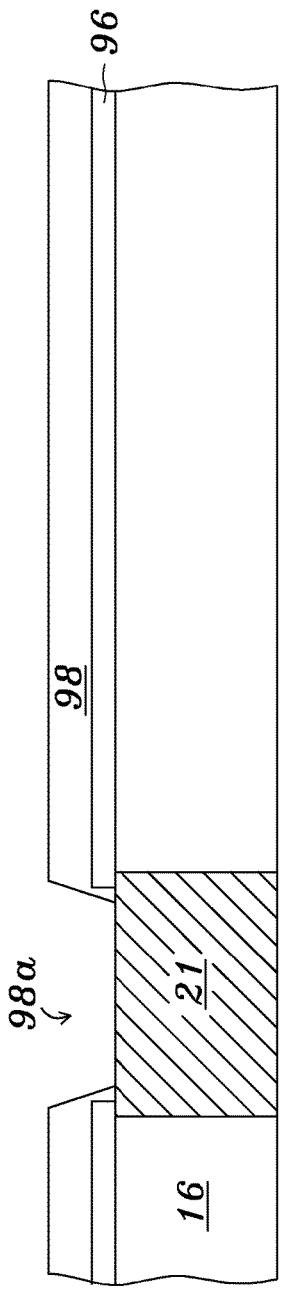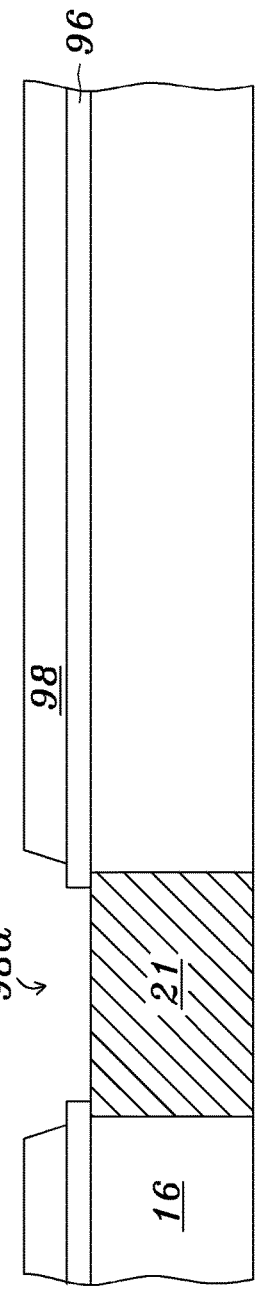

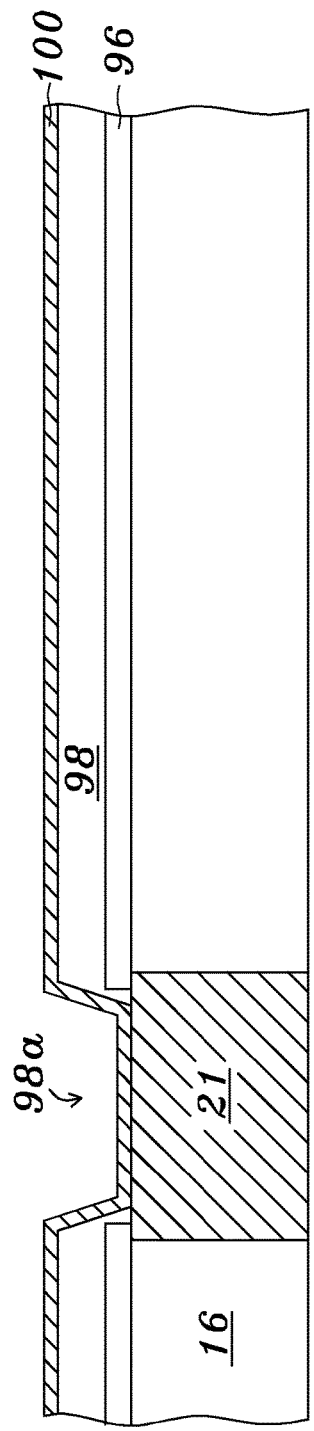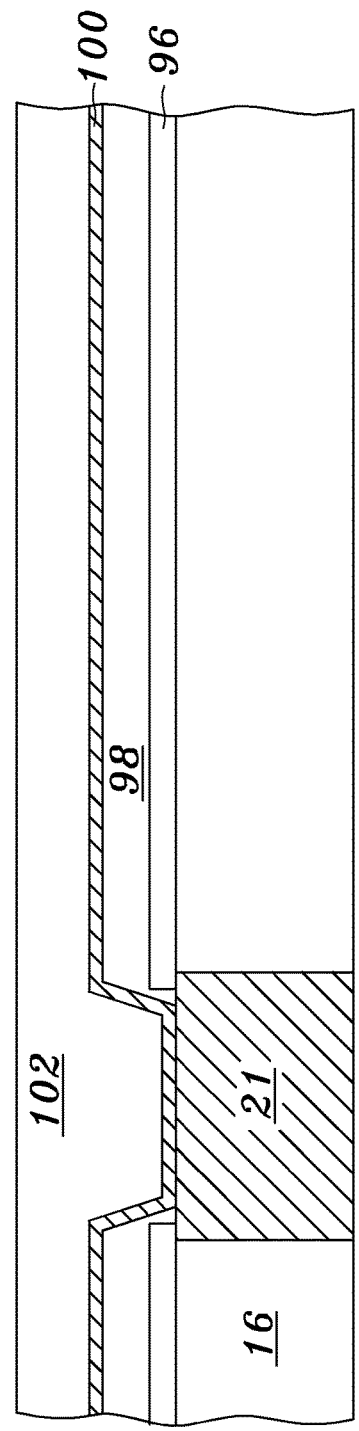

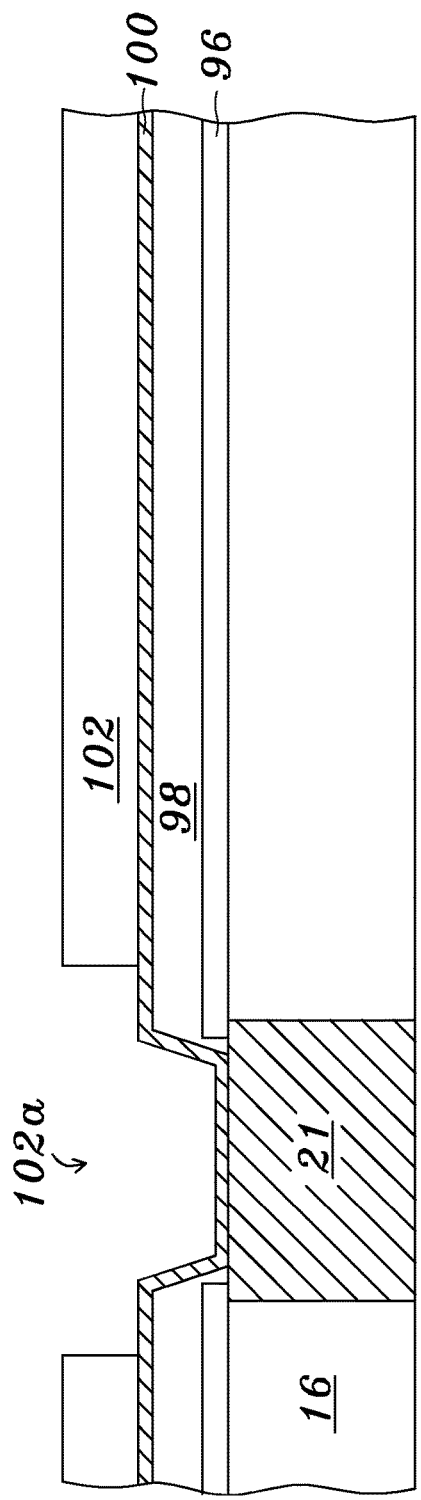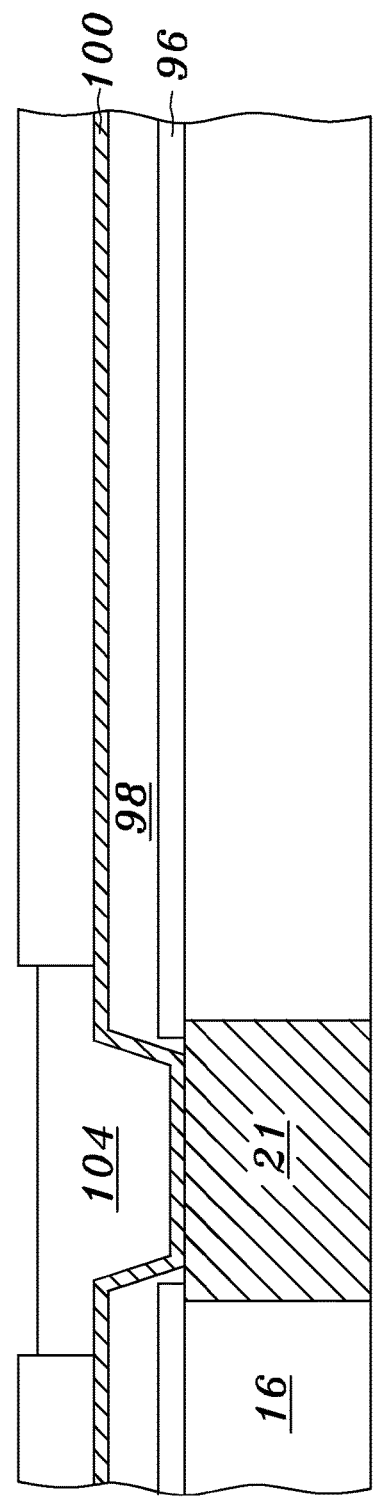

METHOD FOR FABRICATING GLASS SUBSTRATE PACKAGE

CROSS-REFERENCE TO RELATED APPLICATIONS

This application claims the benefit of priority from U.S. Provisional Patent Application Ser. No. 62/219,249, filed Sep. 16, 2015, all of which is incorporated herein by reference in their entirety. This application is a continuation-in-part of application Ser. No. 14/036,256, filed Sep. 25, 2013, which claims the benefit of priority from U.S. Provisional Patent Application Ser. No. 61/705,649, filed Sep. 25, 2013, all of which is incorporated herein by reference in their entirety.

BACKGROUND OF THE DISCLOSURE

Field of the Disclosure

The patent disclosure a method and structure to manufacture a glass substrate, and disclosed embodiments relate to one or more chip building a system on the glass substrate.

Brief Description of the Related Art

As is well known, microelectronic devices have a tendency to be minimized and thinned with its functional development and a semiconductor package mounted on a mother board is also following the tendency in order to realize a mounting of high integration.

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges.

Glass can be used as an interposer to bridge between one or more IC chips and a printed circuit board. In many respects, when used as an interposer/substrate and without the requirement for active devices, glass can be a good substitute for a silicon interposer. The advantages of glass in comparison to silicon as an interposer lie in its much lower material cost. Glass also has a CTE closely matched to silicon, so that reliability of interconnects, especially microbonds, can be expected to be quite good. Glass has some disadvantages in comparison to silicon—notably its lower thermal conductivity and the difficulty in forming Through Glass Vias (TGV's). Both of these topics are discussed elsewhere in this patent.

SUMMARY OF THE DISCLOSURE

Embodiments of the present disclosure provide A display device comprises a display panel substrate and a glass substrate over said display panel substrate, wherein said display panel substrate comprises multiple contact pads, a display area, a first boundary, a second boundary, a third boundary and a fourth boundary, wherein said display area comprises a first edge, a second edge, a third edge and a fourth edge, wherein said first boundary is parallel to said third boundary and said first and third edges, wherein said second boundary is parallel to said fourth boundary and said second and fourth edges, wherein a first least distance between said first boundary and said first edge, wherein a second least distance between said second boundary and said second edge, a third least distance between said third boundary and said third edge, a fourth distance between said fourth boundary and said fourth edge, and wherein said first, second, third and fourth least distances are smaller than 100 micrometers, and wherein said glass substrate comprising multiple metal conductors through in said glass substrate and multiple metal bumps are between said glass substrate and said display panel substrate, wherein said one of said metal conductors is connected to one of said contact pads through one of said metal bumps.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

FIG. 5a-5i illustrate the shape and structure of the Z-axis traces, in accordance with the present disclosure.

FIGS. 11a-11i illustrates an embossing process to form the metal layer on the glass substrate, in accordance with the present disclosure.

Figure 1:
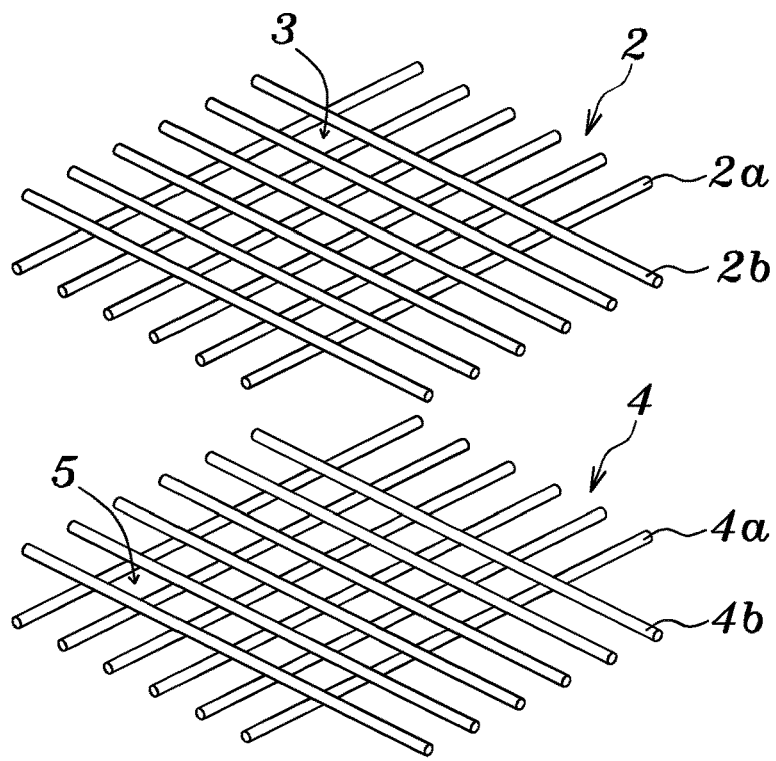
FIG. 1 illustrates a three-dimensional view of a X-axis nets and a Y-axis nets, in accordance with the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DISCLOSURE

FIG. 1 illustrates a three-dimensional view of a net 2, 4, wherein the net 4 is under the net 2, wherein the net 2 comprises multiple Y-axis traces 2a and multiple X-axis traces 2b under the Y-axis traces 2a, and wherein the net 4 comprises multiple Y-axis traces 4a and multiple X-axis traces 4b under the Y-axis traces 4a. Multiple gaps 3, 5 form in the net 2 and 4. Each of the traces 2a, 2b, 4a and 4b is easily move to change the size of gaps 3 and gaps 5. The diameter (or width) of traces 2a, 2b, 4a and 4b are the same, such as between 10 and 30 micrometers, between 20 and 100 micrometers, between 40 and 150 micrometers, between 50 and 200 micrometers, between 200 and 1000 micrometers or between 500 and 10000 micrometers. The traces 2a, 2b, 4a and 4b may be metal traces or polymer traces, such as copper traces, copper-gold alloy traces, copper-gold-palladium alloy traces, copper-gold-silver alloy traces, copper-platinum alloy traces, copper-iron alloy traces, copper-nickel alloy traces, copper-tungsten traces, tungsten traces, brass wires, zinc plated brass wires, stainless wires, nickel plated stainless wires, phosphor bronze wires, copper plated the aluminum wires, aluminum traces, phenolic resin traces, epoxy resin traces, melamine-formaldehyde resin traces or polysiloxanes resin traces. The cross-section shape of traces 2a, 2b, 4a and 4b may be a circular shape, a Square shape, an oblong shape, a rectangle shape or a flat shape.

Figure 2:
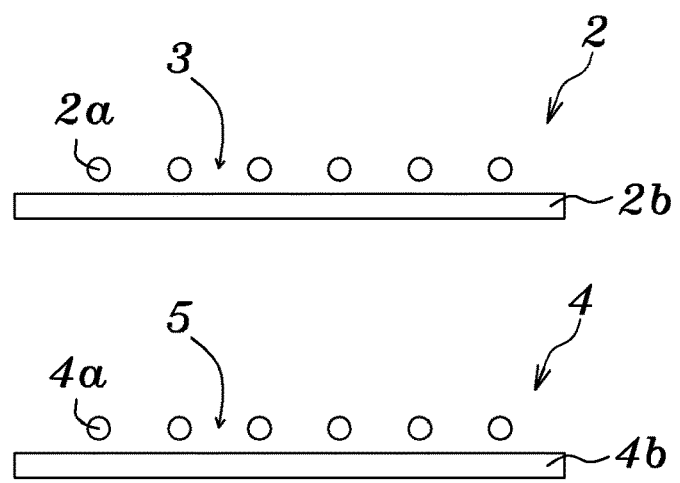
FIG. 2 illustrates a cross-section view of the X-axis nets and the Y-axis nets, in accordance with the present disclosure.

FIG. 2 illustrates a cross-section view of the net 2 and the net 4. The gaps 3 and gaps 5 are aligned with each other.

Figure 3:
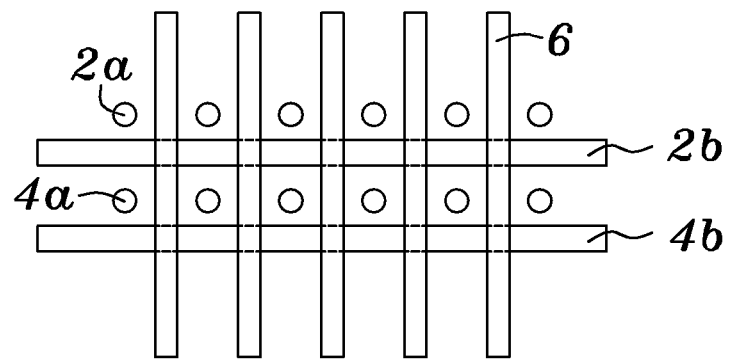
FIG. 3 illustrates a cross-section view of the Z-axis traces crossed to the X-axis nets and the Y-axis nets, in accordance with the present disclosure.

Next, referring to FIG. 3, multiple metal traces 6 are crossed the net 2 and the net 4 through the gaps 3 and gaps 5. The diameter (or width) of metal traces 6 is between 10 and 30 micrometers, between 20 and 100 micrometers, between 40 and 150 micrometers, between 50 and 200 micrometers, between 200 and 1000 micrometers or between 500 and 10000 micrometers. The traces 6 may be metal traces, such as copper traces, copper-gold alloy traces, copper-gold-palladium alloy traces, copper-gold-silver alloy traces, copper-platinum alloy traces, copper-iron alloy traces, copper-nickel alloy traces, copper-tungsten traces, tungsten traces, brass wires, zinc plated brass wires, stainless wires, nickel plated stainless wires, phosphor bronze wires, copper plated the aluminum wires, aluminum traces, titanium-containing layer plated the copper wires, tantalum-containing layer plated the copper wires. The cross-section shape of traces 6 may be a circular shape, a square shape, an oblong shape, a rectangle shape or a flat shape. The diameter (or width) of traces 6 may be the same with the traces 2a, 2b, 4a and 4b or different with the traces 2a, 2b, 4a and 4b.

Furthermore, we proposed the material of the traces 6 is copper-tungsten alloy, wherein the copper in the copper-tungsten alloy is 50 percent and the tungsten in the copper-tungsten alloy is 50 percent, the copper in the copper-tungsten alloy is 60 percent and the tungsten in the copper-tungsten alloy is 40 percent, the copper in the copper-tungsten alloy is 70 percent and the tungsten in the copper-tungsten alloy is 30 percent, the copper in the copper-tungsten alloy is 80 percent and the tungsten in the copper-tungsten alloy is 20 percent, the copper in the copper-tungsten alloy is 90 percent and the tungsten in the copper-tungsten alloy is 10 percent, the copper in the copper-tungsten alloy is 40 percent and the tungsten in the copper-tungsten alloy is 60 percent, the copper in the copper-tungsten alloy is 30 percent and the tungsten in the copper-tungsten alloy is 70 percent.

Figure 4:
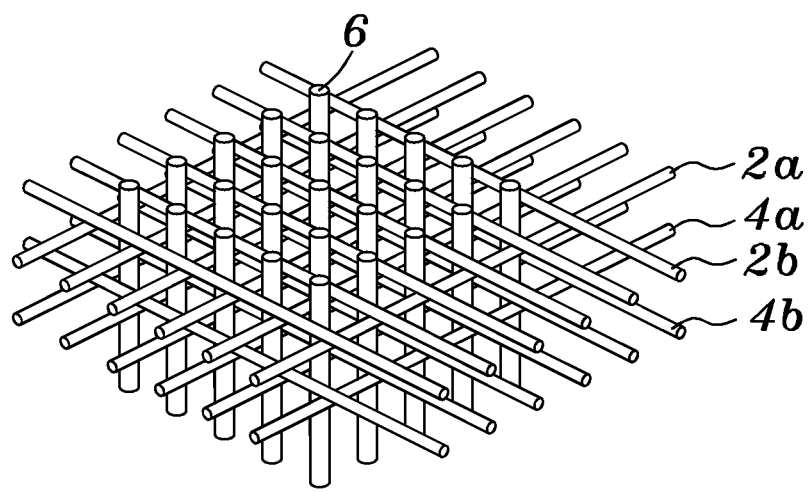
FIG. 4 illustrates a three-dimensional view of the Z-axis traces, X-axis nets and the Y-axis nets, in accordance with the present disclosure.

FIG. 4 illustrates a three-dimensional view of a net 2, 4 and traces 6.

FIG. 5a-5i illustrates the shape and structure of the traces 6. In FIG. 5a, the cross-section shape of traces 6 is a circular shape. In FIG. 5d, the cross-section shape of traces 6 is a square shape. In FIG. 5g, the cross-section shape of traces 6 is a rectangle shape. In FIG. 5b, the cross-section shape of traces 6 is a circular shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5e, the cross-section shape of traces 6 is a square shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5h, the cross-section shape of traces 6 is a rectangle shape and a first covering layer 6a is cover on the traces 6, wherein the first covering layer 6a may be a metal layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5c, the cross-section shape of traces 6 is a circular shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5f, the cross-section shape of traces 6 is a square shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer. In FIG. 5i, the cross-section shape of traces 6 is an oblong shape and a second covering layer 6b is cover on the first covering layer 6a, wherein the second covering layer 6b may be an adhesion layer, such as a nickel-containing layer, a zinc-containing layer, a titanium-containing layer, a tantalum-containing layer, a silver-containing layer, a chromium-containing layer and wherein the first covering layer 6a may be an anti-oxidation layer, such as an oxide-containing layer.

Next, FIGS. 6a-6j are illustrated a 1$^{st}$ process of forming a glass substrate of the invention. Please referring to FIG. 6a, the traces 6 are stretched to a suitable length L1, e.g., smaller than 5 meters, such as between 0.5 and 1 meter, or between 1 and 3 meters. In the same time, the net 4 is moved down to a suitable location. The pitch t1 between the traces 2a, 2b, 4a, 4b is greater than the diameter (or width) of traces 6.

Figure 6A:
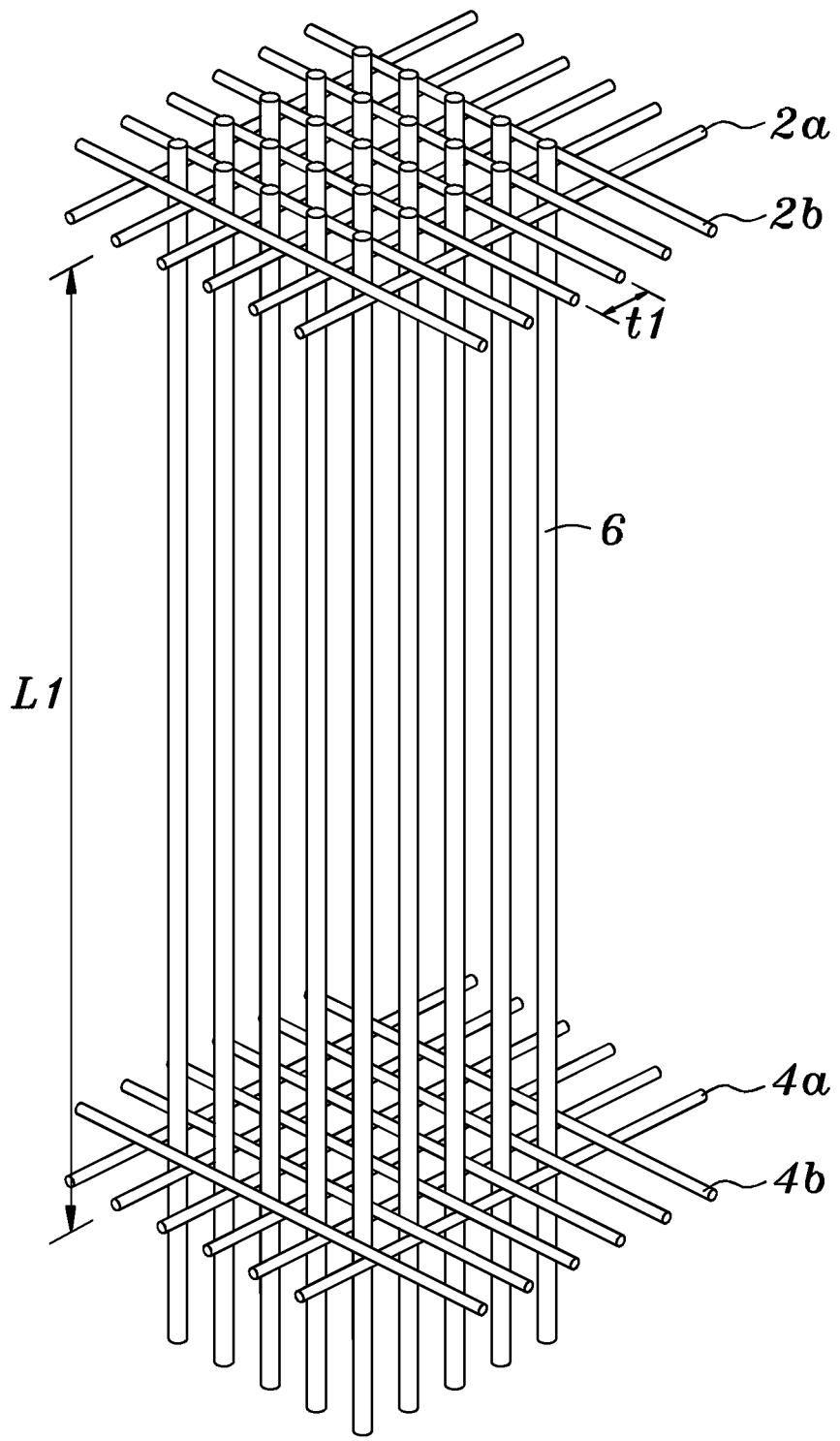
FIGS. 6a-6j are illustrate a $1^{st}$ process of forming a glass substrate, in accordance with the present disclosure.
Figure 6B:
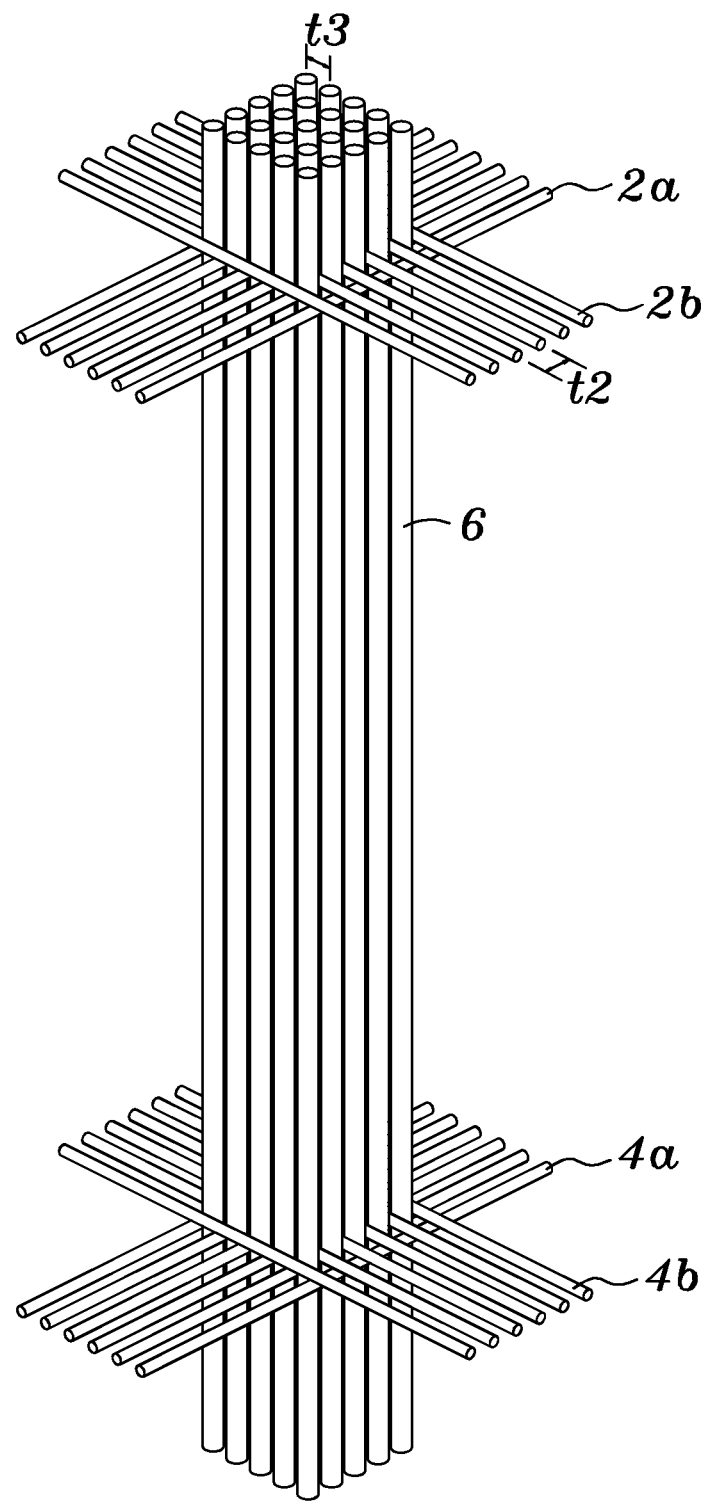

Next, referring to FIG. 6b, the traces 2a, 2b, 4a and 4b are moved to change the pitch t1 to a pitch t2, then the traces 6 are closed up to a pitch t3. The pitch t3 substantially the same with the diameter (or width) of the traces 2a, 2b, 4a and 4b, such as between 5 and 20 micrometers, between 20 and 50 micrometers, between 30 and 80 micrometers, between 20 and 100 micrometers, between 40 and 150 micrometers, between 50 and 200 micrometers, between 200 and 1000 micrometers or between 500 and 10000 micrometers. In the same time, may be apply a force to stretch the traces 6, 2a, 2b, 4a and 4b and make the traces 6 keep strength and keep the pitch t3 fixed.

Figure 6C:
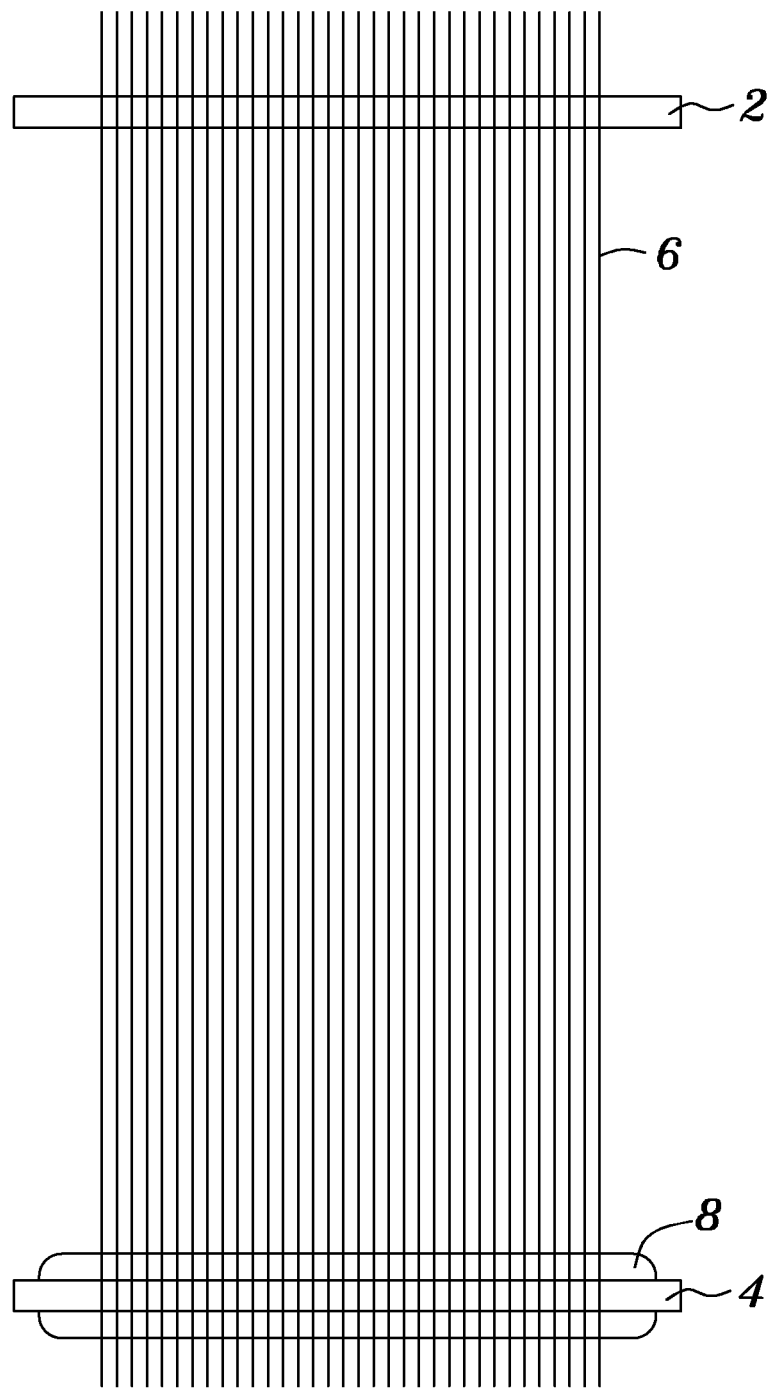

Next, referring to FIG. 6c, a thermal resistance layer 8 is formed on surfaces of the net 4. The thermal resistance layer 8 may be a polymer layer, such as a thermosetting resin, phenolic resin, epoxy resin, melamine-formaldehyde resin, polysiloxanes resin, plaster layer, wherein the thermal resistance layer 8 has a heat deflection temperature between 400 and 900° C. When a liquid thermal resistance layer 8 formed on the net 4 and the thermal resistance layer 8 permeated the net 4 through the gaps 5, wherein the thermal resistance layer 8 cover the gaps 5 between traces 4a, traces 4b and traces 6, then curing the thermal resistance layer 8. The thermal resistance layer 8 has a thickness between 0.05 and 1 meter.

Figure 6D:
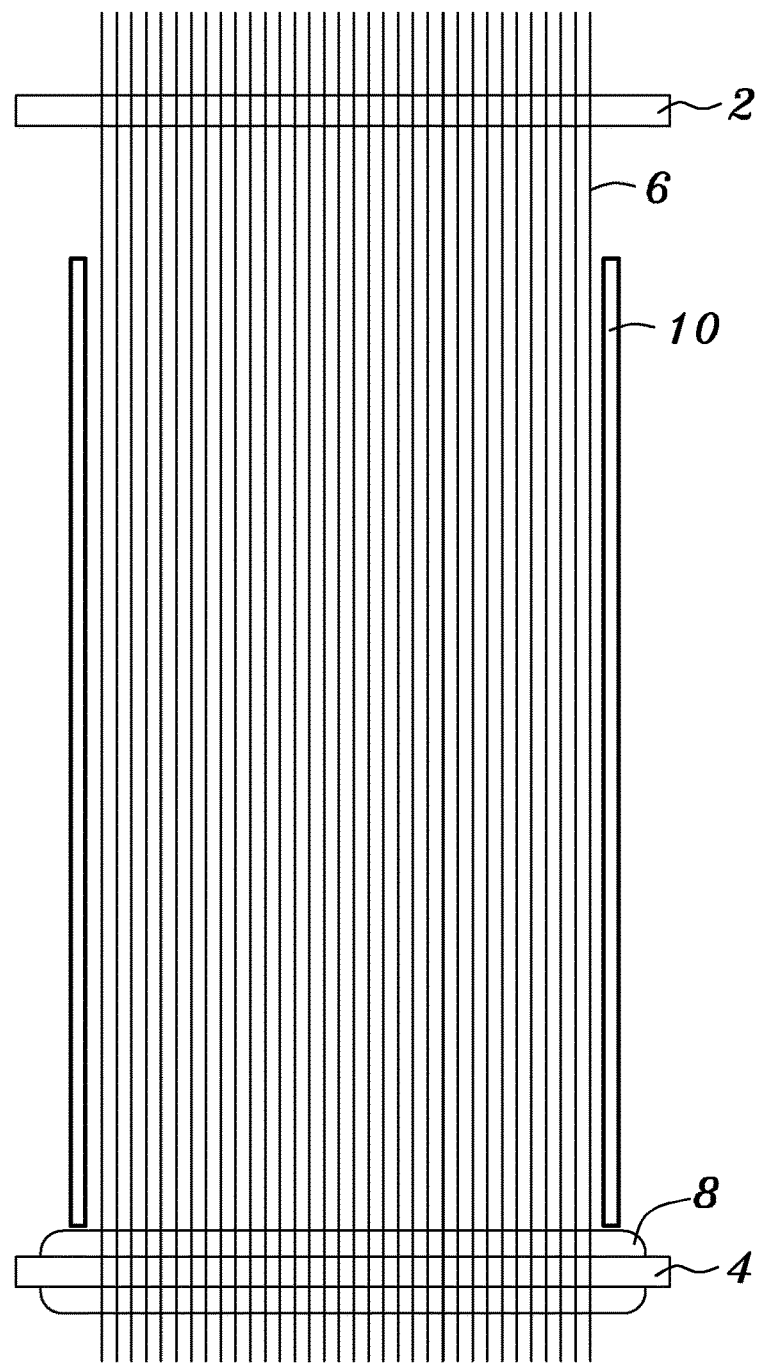

比 Next, referring to FIG. 6d, a mold 10 is provided between the net 2 and the net 4, wherein the mold 10 surrounds the traces 6 and on the thermal resistance layer 8. The mold 10 is hold up by a machine or a device. The mold 10 may be a metal mold, a ceramics mold or a polymer mold, which has a heat deflection temperature between 400° C. and 900° C. or between 800° C. and 1300° C.

Figure 6E:
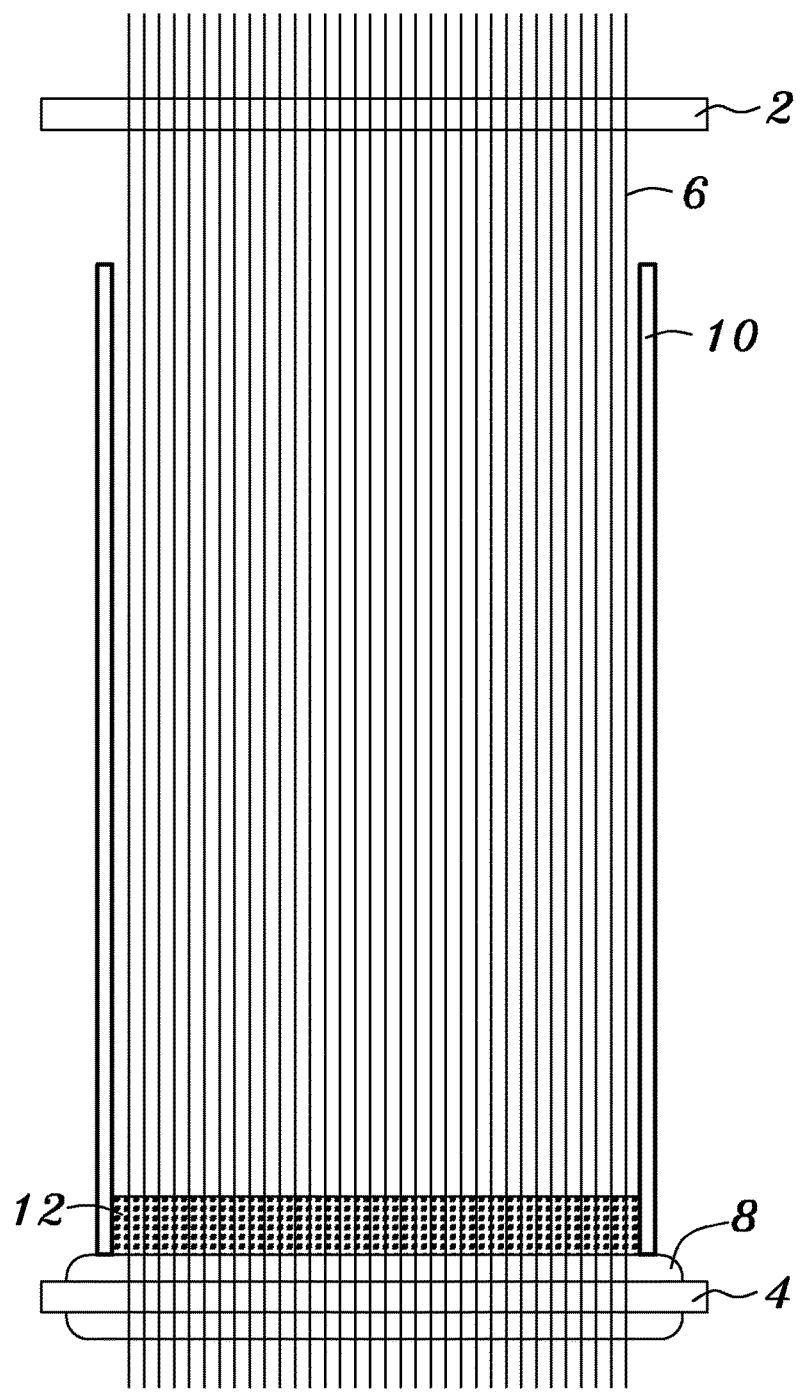

Next, referring to FIG. 6e, a fixed layer 12 is formed on the thermal resistance layer 8, wherein the fixed layer 12 may be a glass layer or a polymer layer. When the material of the fixed layer 12 is glass, the fixed layer 12 is a high temperature liquid to form on the thermal resistance layer 8, and then the fixed layer 12 down to a suitable temperature becomes a solid state. The fixed layer 12 has a thickness between 0.01 and 1 meter. The bottom of traces 6 are fixed by the fixed layer 12.

Figure 6F:
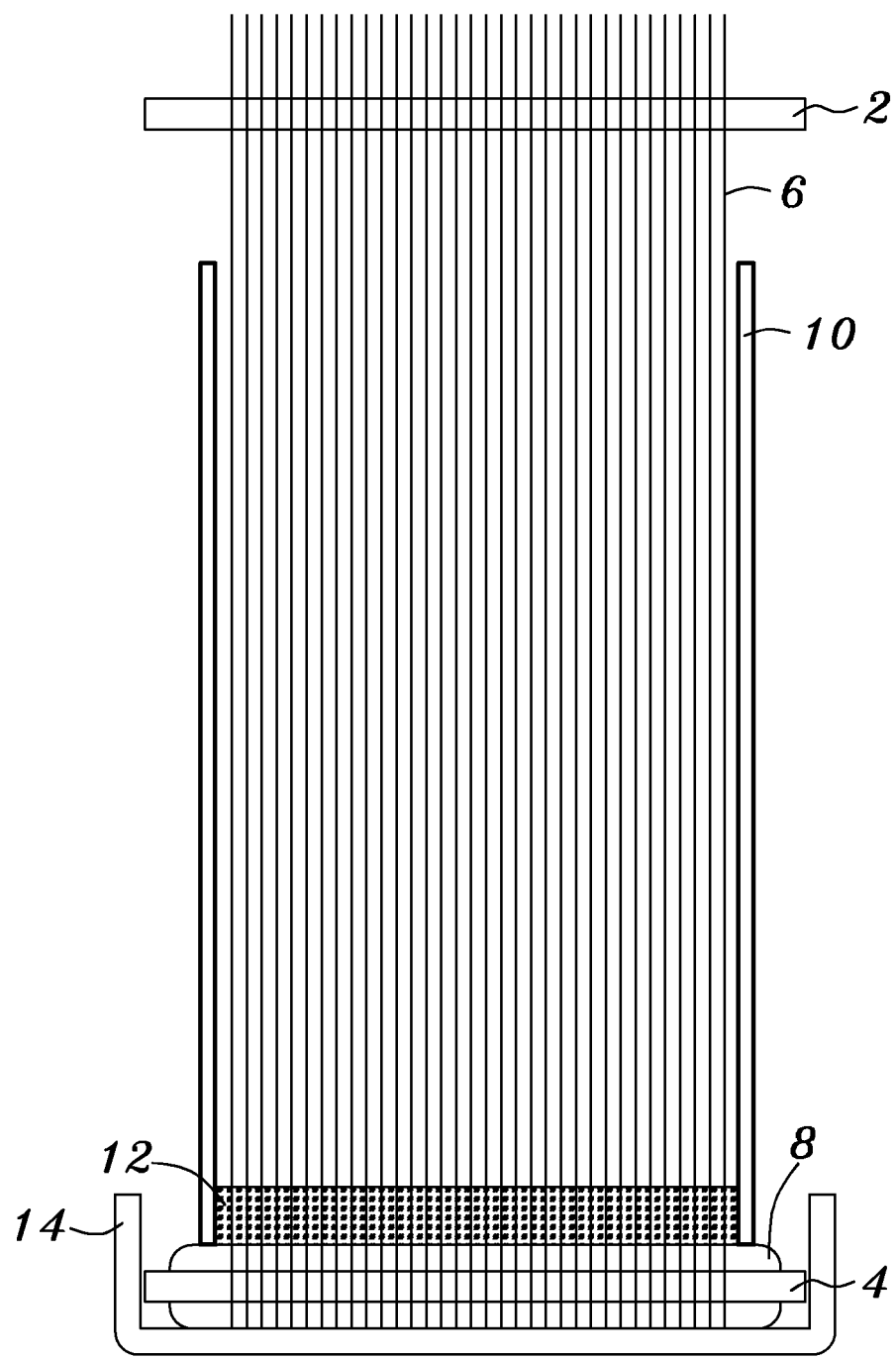

Next, referring to FIG. 6f, the traces 6 under the net 4 are cut. A tank 14 carries the mold 10, net 4 and the fixed layer 12.

Figure 6G:
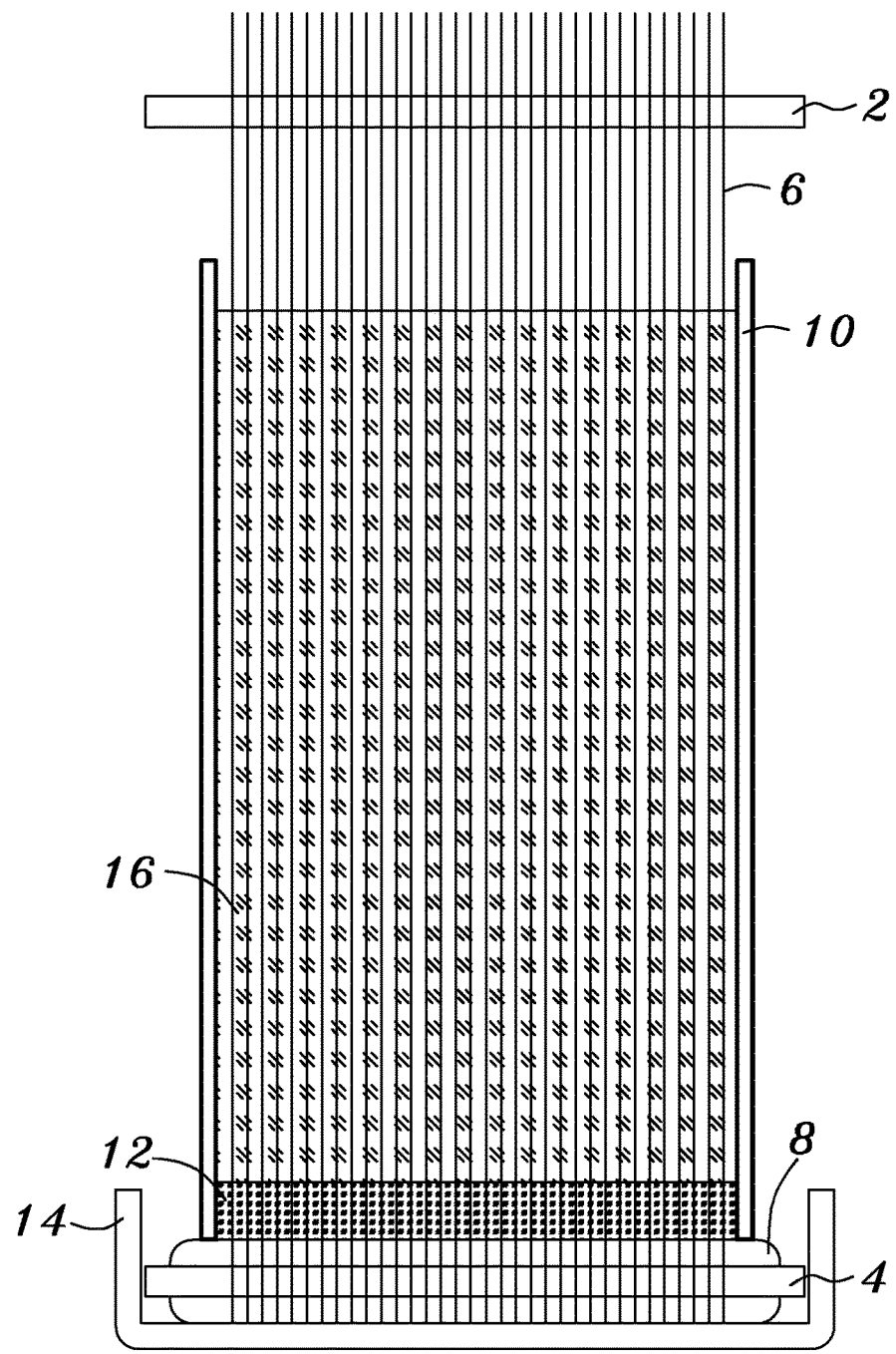

Next, referring to FIG. 6g, a glass layer (liquid form) 16 is formed on the fixed layer 12. The glass layer 16 is a high temperature liquid to form on the fixed layer 12 and fill in the mold 10, and then the glass layer 16 down to a suitable temperature becomes a solid state, wherein the glass layer 16 has a glass transition temperature between 300° C. and 900° C., between 500° C. and 800° C., between 900° C. and 1200° C. or between 1000° C. and 1800° C. The glass layer 16 is a low melting point glass material, wherein the glass layer 16 has a melting point between 300° C. and 900° C., 800° C. and 1300° C., between 900° C. and 1600° C., between 1000° C. and 1850° C., or between 1000° C. and 2000° C., wherein the melting point may smaller than 1500° C. The glass layer 16 has a thickness greater than 0.5 meters or greater than 0.1 meter. Furthermore, there is a few bubbles or no bubble in glass layer 16, for example, there is zero to 3 bubbles in one cubic meter of the glass layer 16, 1 to 10 bubbles in one cubic meter of the glass layer 16, 5 to 30 bubbles in one cubic meter of the glass layer 16 or 20 to 60 bubbles in one cubic meter of the glass layer 16, wherein the bubble has a diameter between 0.0001 and 0.001 centimeters, between 0.001 and 0.05 centimeters, between 0.05 and 0.1 centimeters or between 0.05 and 0.5 centimeters. The glass layer 16 may be remove bubbles through multiple laminating process, squeezing process and heating process.

The glass layer 16 refers to an amorphous solid. The material of the glass layer 16 may be included soda-lime glass, boro-silicate glass, alumo-silicate glass, fluoride glasses, phosphate glasses or chalcogen glasses. For example, the composition of the soda-lime glass comprises $SiO_2$ (74%), $Na_2O$ (13%), CaO (10.5%), $Al_2O_3$ (1.3%), $K_2O$ (0.3%), SO3 (0.2%), MgO (0.2%), Fe2O3 (0.04%), TiO2 (0.01%), the composition of the boro-silicate glass comprises $SiO_2$ (81%), $B_2O_3$ (12%), $Na_2O$ (4.5%), $Al_2O_3$ (2.0%), the composition of the phosphate glasses comprises a percentage of the $P_2O_5$ material between 3% and 10% or between 5% and 20%.

A glass, once formed into a solid body, is capable of being softened and perhaps remitted into a liquid form. The "glass transition temperature" of a glass material is a temperature below which the physical properties of the glass are similar to those of a solid and above which the glass material behaves like a liquid.

If a glass is sufficiently below the glass transition temperature, molecules of the glass may have little relative mobility. As a glass approaches the glass transition temperature, the glass may begin to soften and with increasing temperature the glass will ultimately melt into the liquid state. Thus, a glass body may be softened to an extent sufficient to enable manipulation of the body's shape, allowing for the formation of holes or other features in the glass body. Once the desired form is obtained, glass is usually annealed for the removal of stresses. Surface treatments, coatings or lamination may follow to improve the chemical durability (glass container coatings, glass container internal treatment), strength (toughened glass, bulletproof glass, windshields), or optical properties (insulated glazing, anti-reflective coating).

Furthermore, the glass layer 16 may be replaced by a polymer layer. When the polymer cured to a solid state. The polymer layer has an expansion coefficient between 3 and 10 ppm/° C.

Figure 6H:
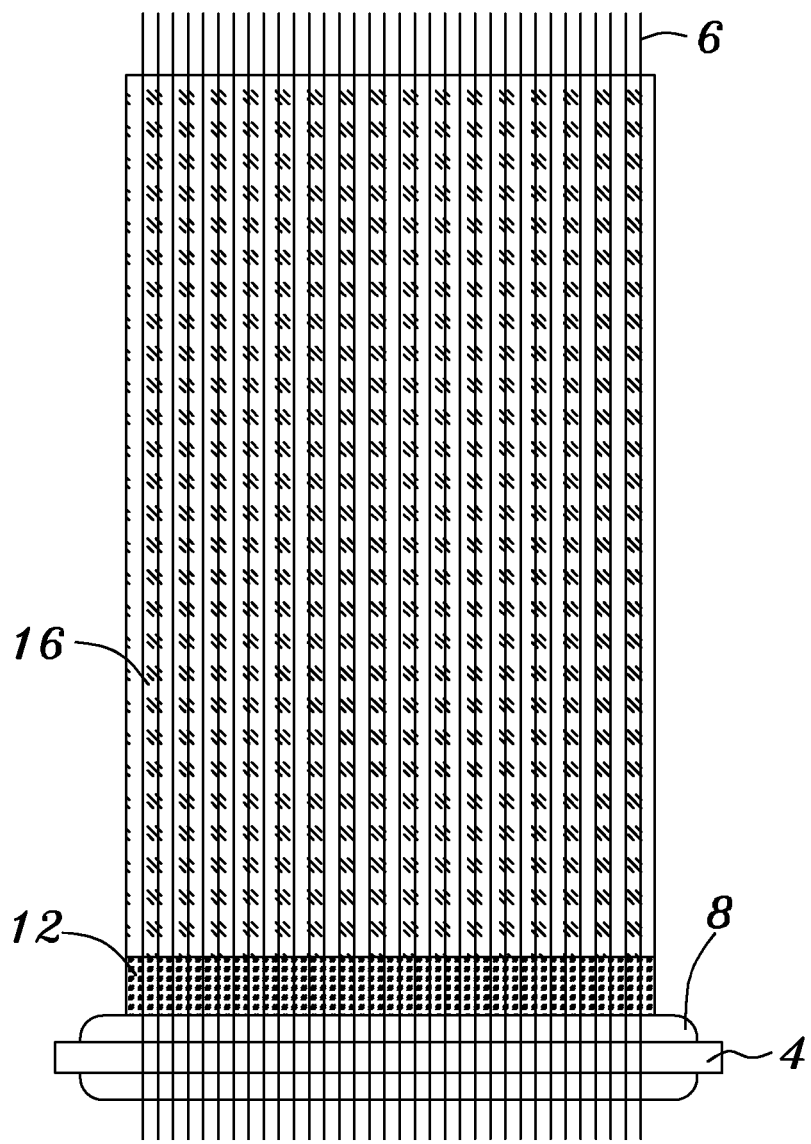

Next, referring to FIG. 6h, the mold 10 and the tank 14 are removed and cut the traces 6 from net 2.

Figure 6I:
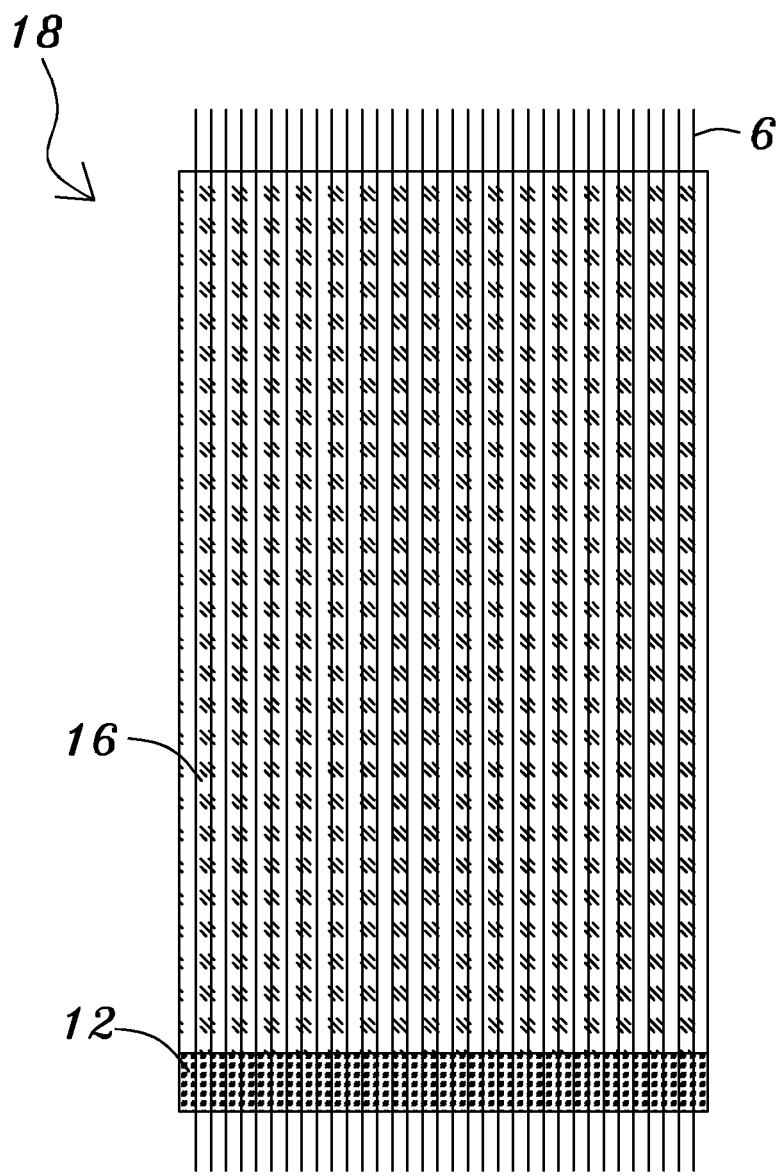

Next, referring to FIG. 6i, the net 4 and the thermal resistance layer 8 are removed, and then a column 25 is produced.

Figure 6J:
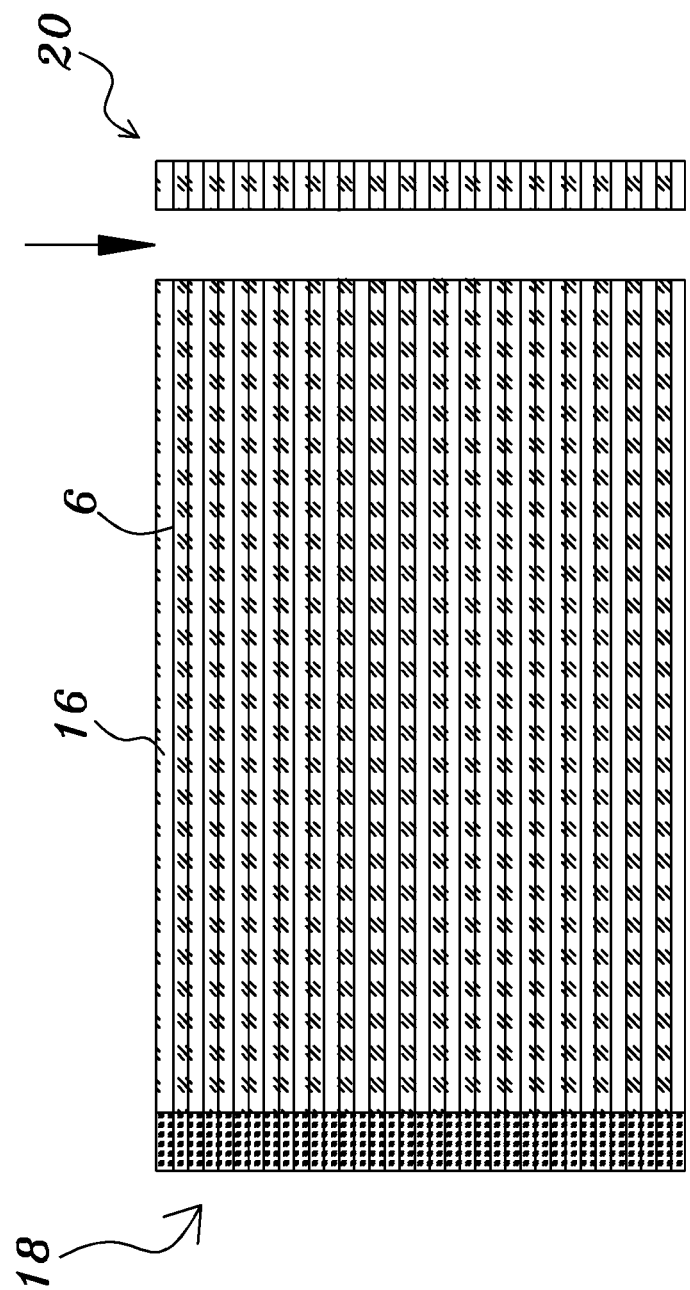
Figure 6K:
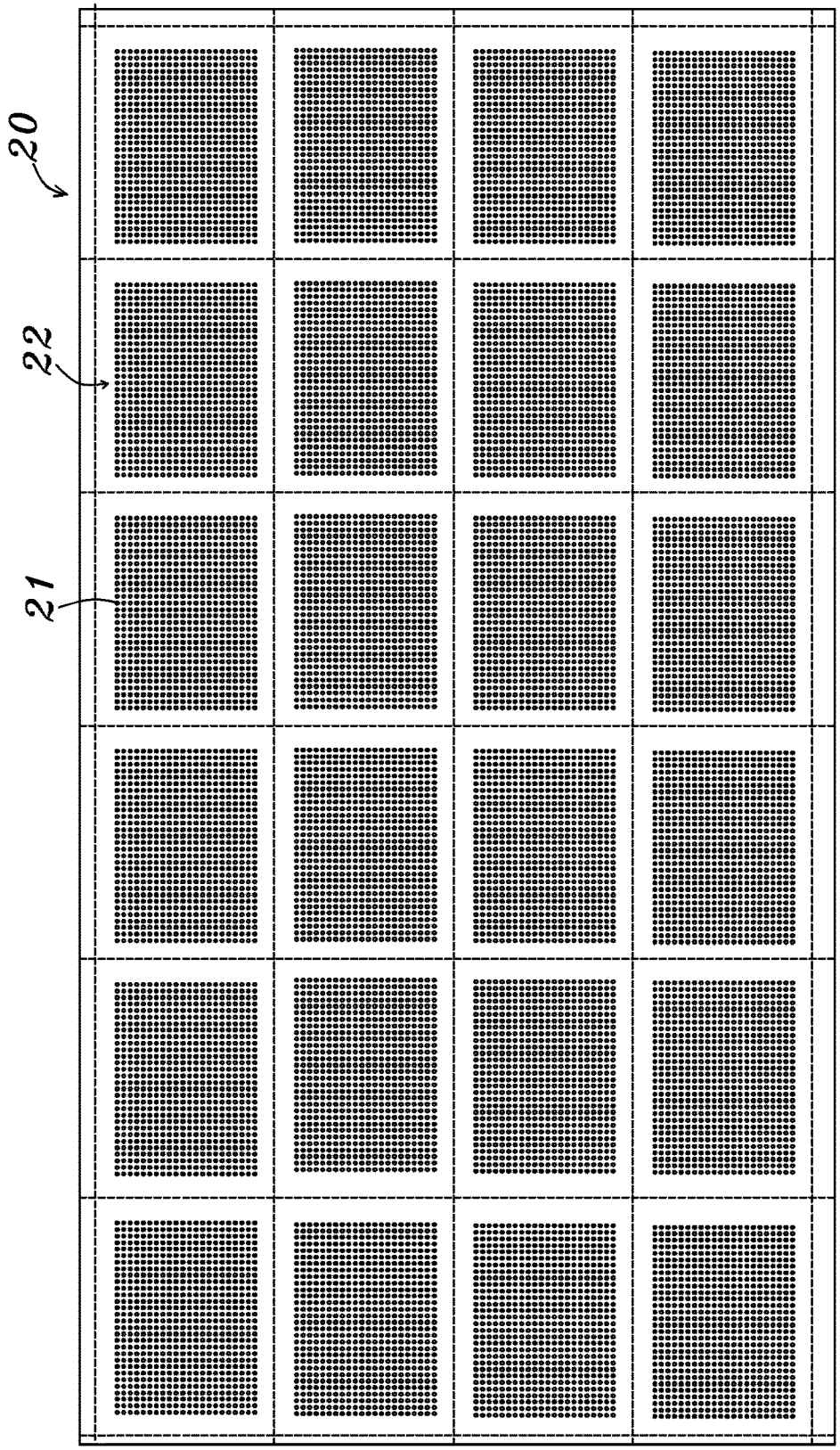
FIGS. 6k-6n illustrate a top views of the $1^{st}$ process of forming the glass substrate, in accordance with the present disclosure.

Next, referring to FIG. 6j, the traces 6 out of the column 25 are removed and cutting the column 25 to produce multiple first substrates 20, wherein the first substrate 20 has a thickness between 20 and 100 micrometers, between 50 and 150 micrometers, between 100 and 300 micrometers or between 150 and 2000 micrometers or greater than 1000 micrometers. The first substrates 20 may be make a planarization process using a suitable process, such as a chemical mechanical polishing (CMP) procedure, mechanical grinding, or laser drilling Next, referring to FIG. 6k, the first substrate 20 comprises multiple second substrates 22. The second substrates 22 are well-regulated an array in the first substrate 20. Each of the second substrates 22 has multiple metal plugs 21, wherein the metal plug 21 is formed from metal traces 6. The metal plug 21 has the same material and structure with metal trace 6.

Figure 6N:
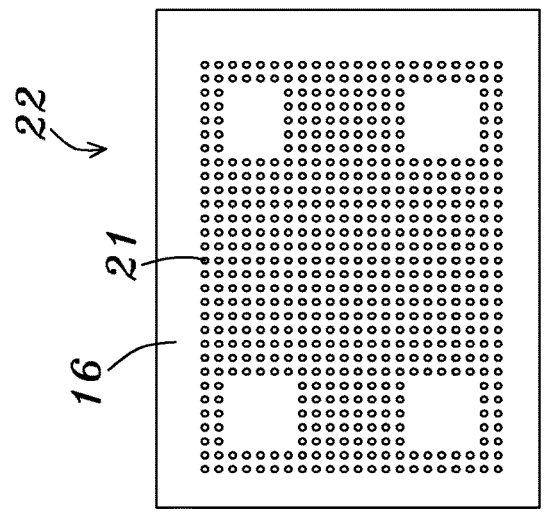
Figure 6M:
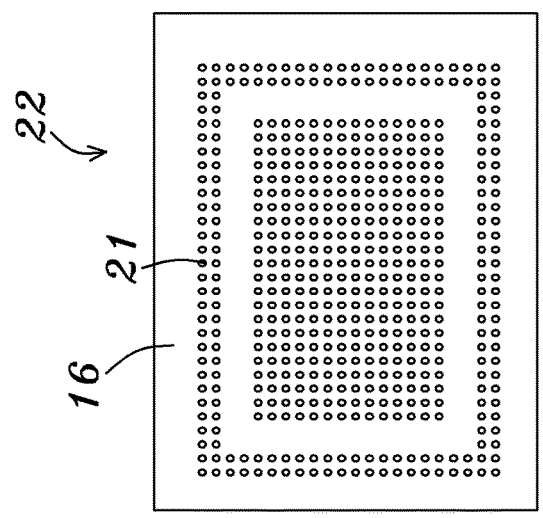
Figure 6L:
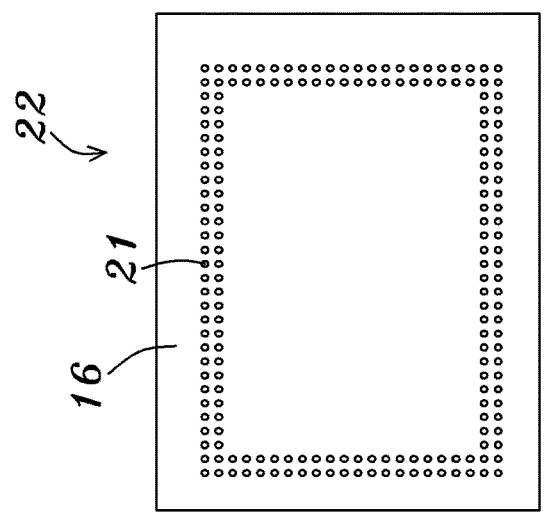

Next, referring to FIG. 6l-6n, the metal plugs 21 may be arranged different types, such as FIG. 6l, the metal plugs 21 are arranged on the side portions of the second substrate 22, or such as FIG. 6m, the metal plugs 21 are arranged on the side portions and center portion of the second substrate 22, or such as FIG. 6n, some portions of the second substrate 22 are not arranged the metal plugs 21.

Figure 7B:
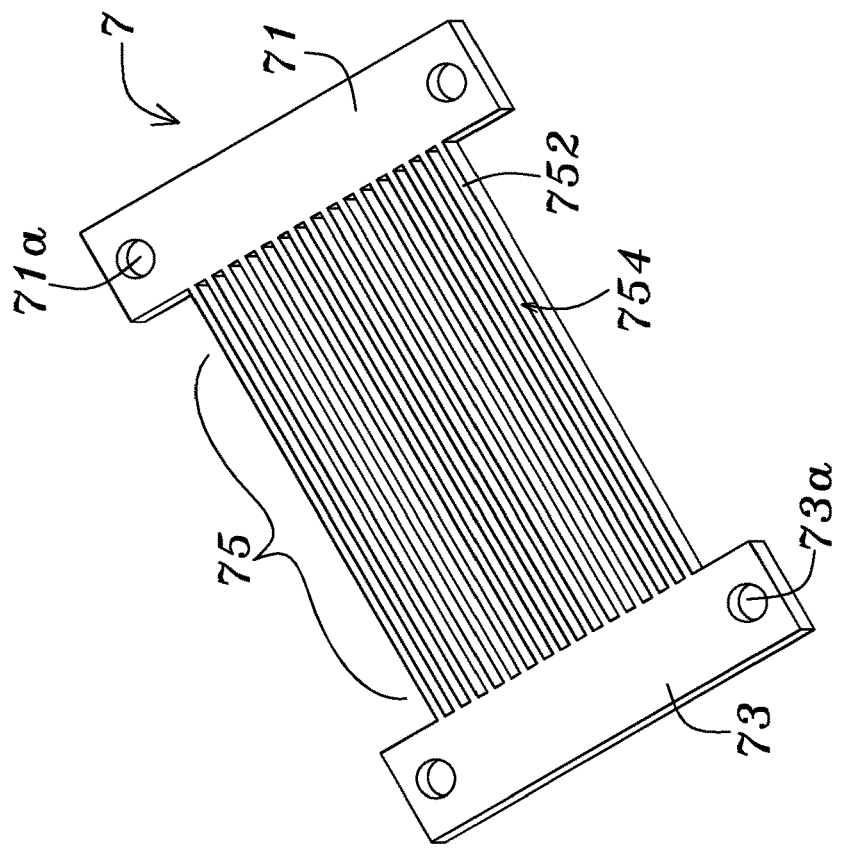
FIGS. 7a-7o are illustrate a $2^{nd}$ process of forming the glass substrate, in accordance with the present disclosure.
FIGS. 7p-7r illustrate a top views of the $2^{nd}$ process of forming the glass substrate, in accordance with the present disclosure.
Figure 7A:
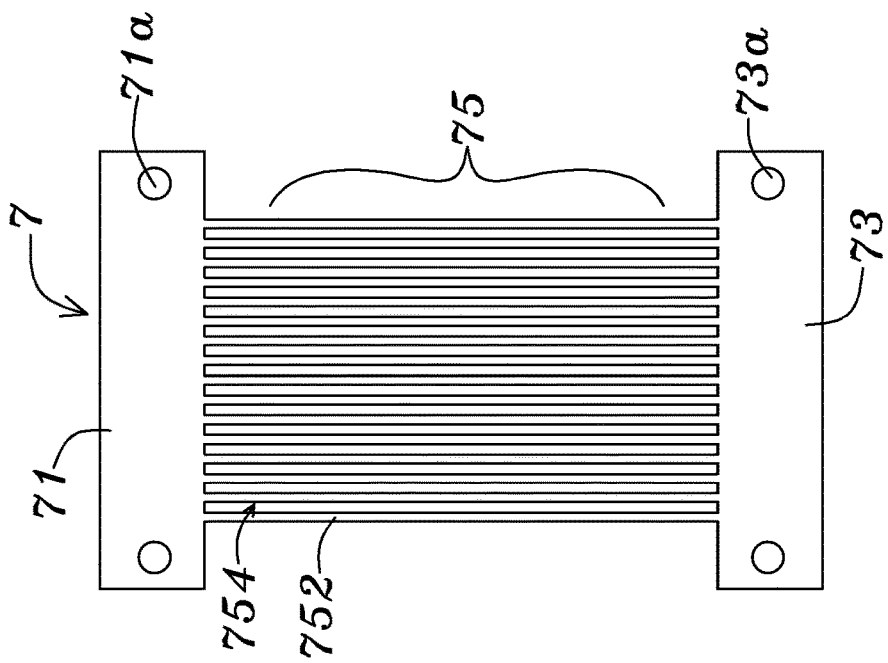

FIG. 7a-7m are illustrated a $2^{nd}$ process of forming a glass substrate of the invention. Please referring to FIG. 7a-7b, there is illustrated a first metal plate 7 in FIG. 7a, illustrated a three-dimensional view of the first metal plate 7 in FIG. 7b. The first metal plate 7 has a thickness between 25 micrometers and 1000 micrometers, between 20 micrometers and 500 micrometers, between 30 micrometers and 400 micrometers or between 20 micrometers and 250 micrometers. The first metal plate 7 comprising a first portion 71, a second portion 73 and a third portion 75 between the first portion 71 and second portion 73, wherein the third portion 75 comprises multiple non-circular metal traces 752 are connected to the first portion 71 and the second portion 73, wherein a cross-section view of the non-circular trace 752 comprising a square shape or a rectangle shape. One of the non-circular trace 752 has a width greater than the thickness of one of the non-circular trace 752, such as between 150 micrometers and 3000 micrometers, between 300 micrometers and 1500 micrometers, between 200 micrometers and 800 micrometers or between 100 micrometers and 500 micrometers. Multiple gaps 754 are between each two non-circular traces 752, wherein the gap 754 is between 50 micrometers and 3000 micrometers, between 300 micrometers and 1500 micrometers, between 200 micrometers and 800 micrometers or between 150 micrometers and 500 micrometers. The first metal plate 7 comprises a copper metal layer, copper-gold alloy metal layer, copper-gold-palladium alloy metal layer, copper-gold-silver alloy metal layer, copper-platinum alloy metal layer, copper-iron alloy metal layer, copper-nickel alloy metal layer, copper-tungsten metal layer, tungsten metal layer, brass metal layer, zinc plated brass metal layer, stainless metal layer, nickel plated stainless metal layer, phosphor bronze metal layer, copper plated the aluminum metal layer or aluminum metal layer. There are two holes 71a in the first portion 71, wherein the hole 71a has a diameter between 600 micrometers and 2000 micrometers, between 1000 micrometers and 3000 micrometers or between 2000 micrometers and 5000 micrometers. There are two holes 73a corresponding to the hole 71a in the first portion 71, wherein the hole 73a has a diameter between 600 micrometers and 2000 micrometers, between 1000 micrometers and 3000 micrometers or between 2000 micrometers and 5000 micrometers, wherein a first least distance between the two holes 71a is substantially the same to a second least distance between the two holes 73a.

Figure 7D:
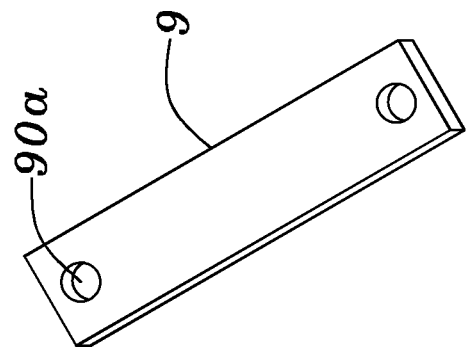
Figure 7C:
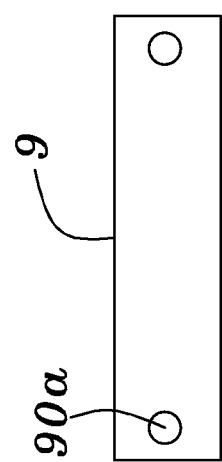

Next, referring to FIG. 7c-7d, there is illustrated a second metal plate 9 in FIG. 7c, illustrated a three-dimensional view of the second metal plate 9 in FIG. 7d. The second metal plate 9 has a thickness between 25 micrometers and 600 micrometers, between 20 micrometers and 300 micrometers, between 30 micrometers and 250 micrometers or between 25 micrometers and 180 micrometers. There are two holes 90a in the second metal plate 9, wherein the hole 90a has a diameter between 600 micrometers and 2000 micrometers, between 1000 micrometers and 3000 micrometers or between 2000 micrometers and 5000 micrometers, wherein a third least distance between the two holes 90a is substantially the same to a second least distance between the two holes 73a and substantially the same to the first least distance between the two holes 71a. The second metal plate 9 comprises a copper metal layer, copper-gold alloy metal layer, copper-gold-palladium alloy metal layer, copper-gold-silver alloy metal layer, copper-platinum alloy metal layer, copper-iron alloy metal layer, copper-nickel alloy metal layer, copper-tungsten metal layer, tungsten metal layer, brass metal layer, zinc plated brass metal layer, stainless metal layer, nickel plated stainless metal layer, phosphor bronze metal layer, copper plated the aluminum metal layer or aluminum metal layer.

Figure 7E:
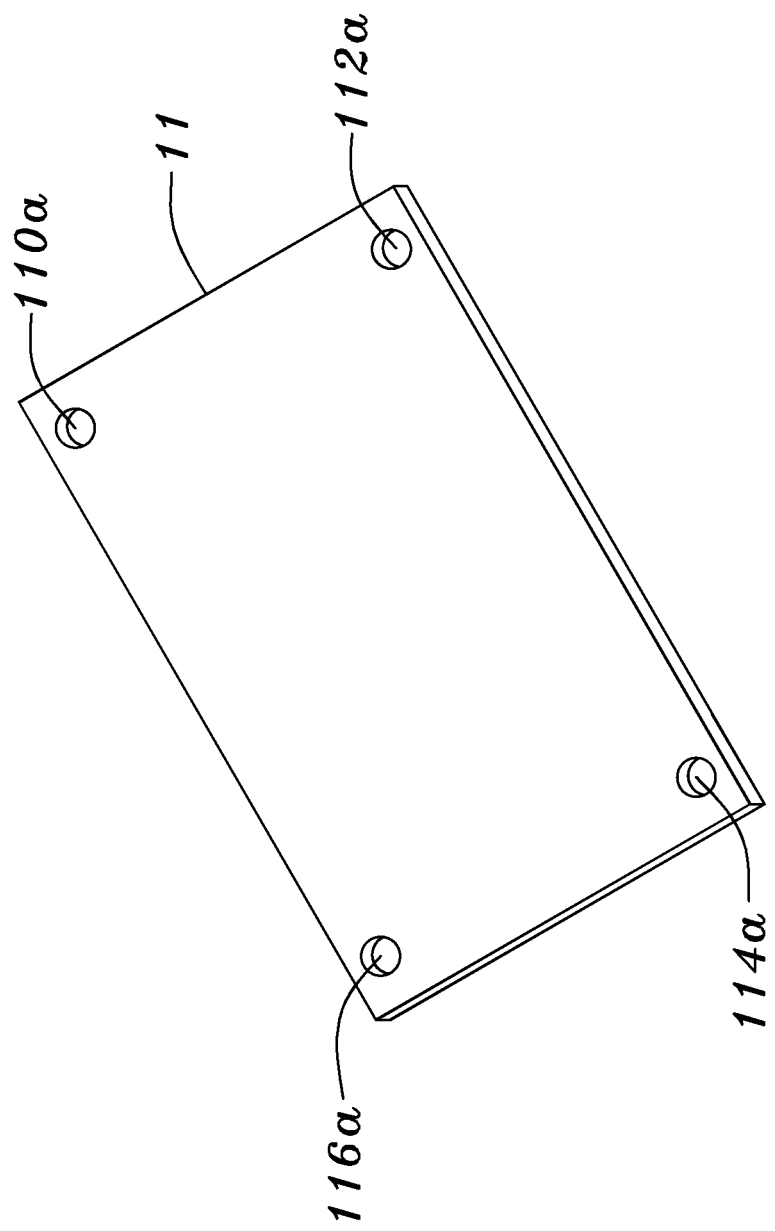
Figure 7F:
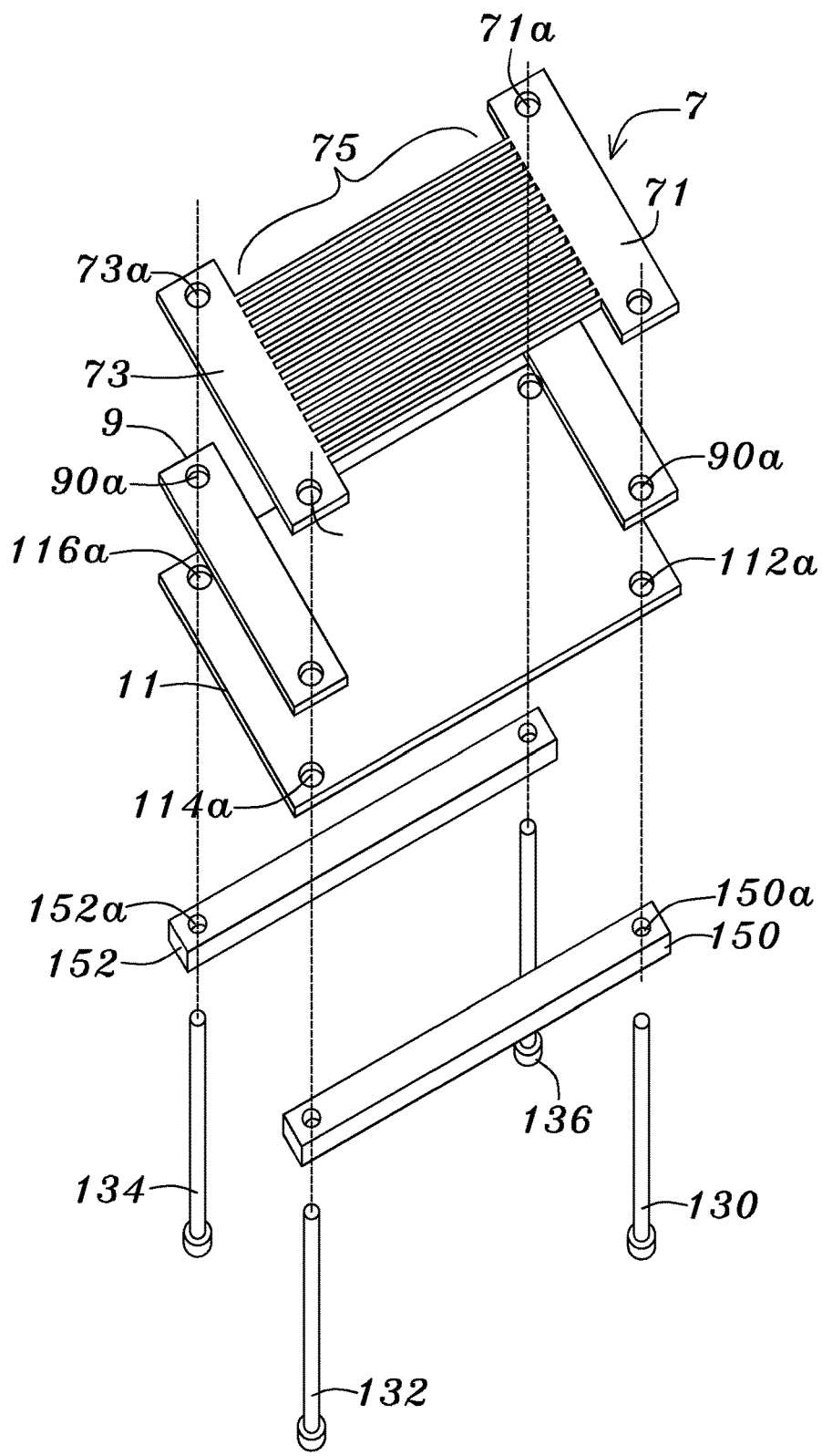
Figure 7G:
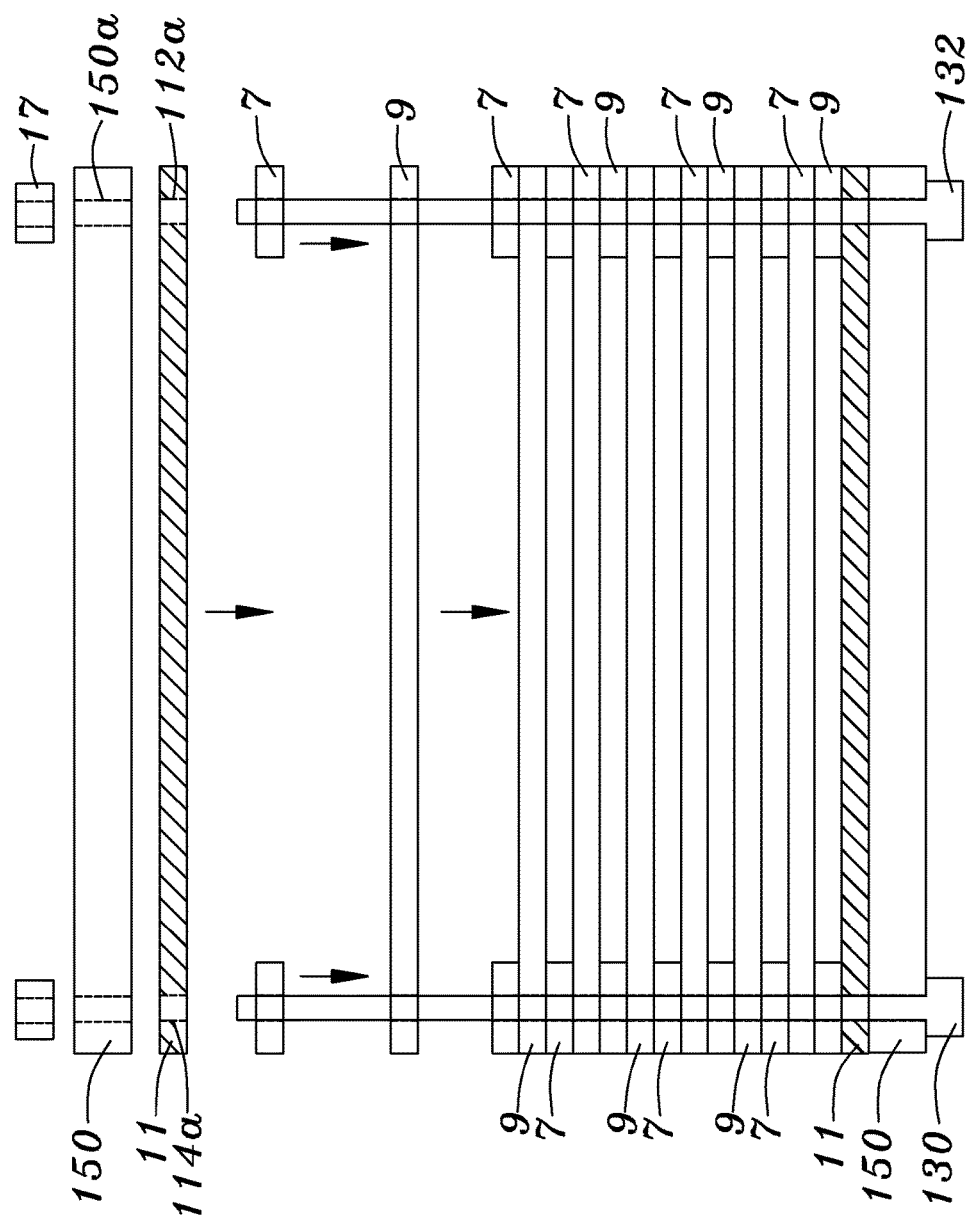
Figure 7H:
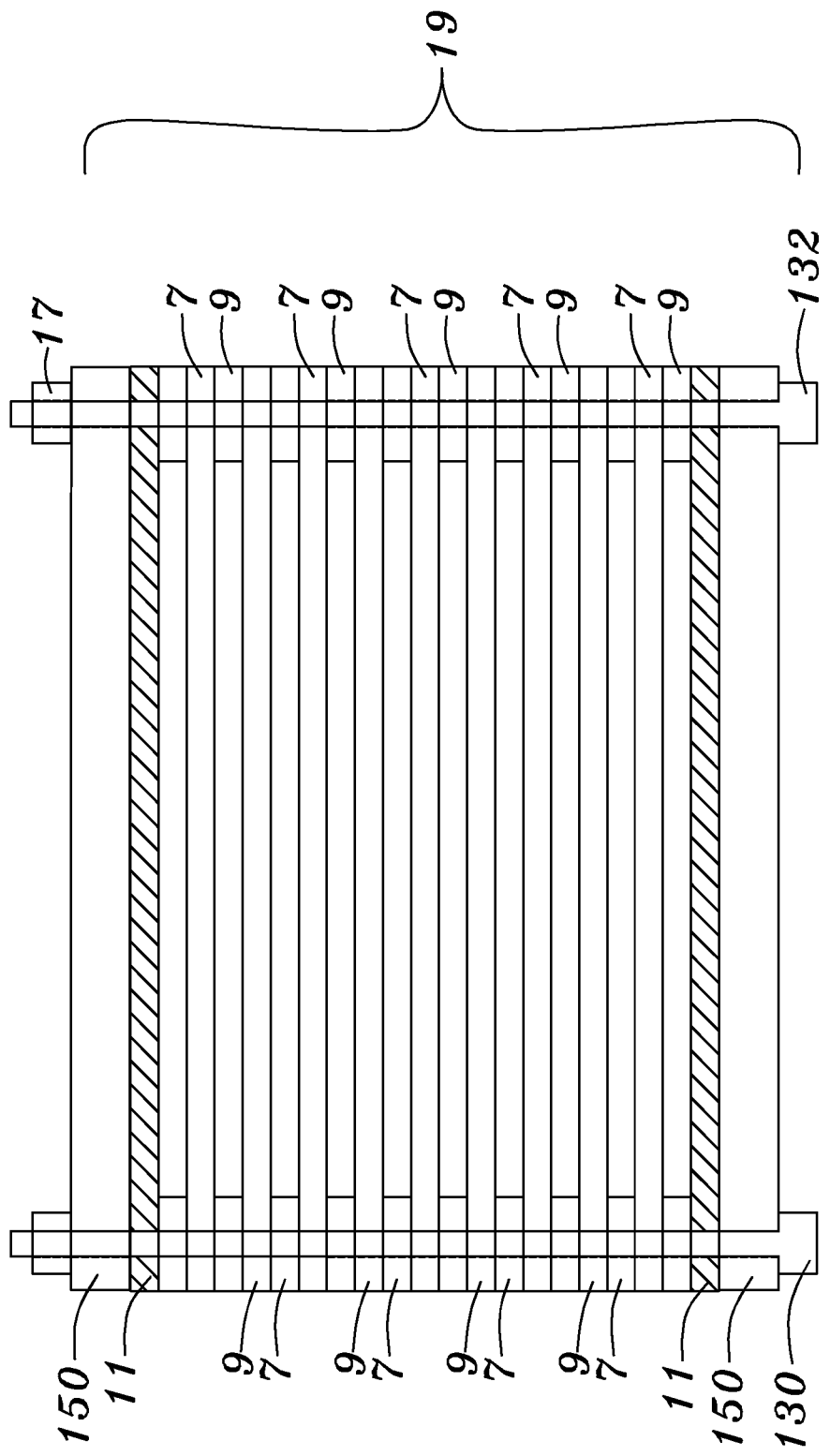
Figure 7I:
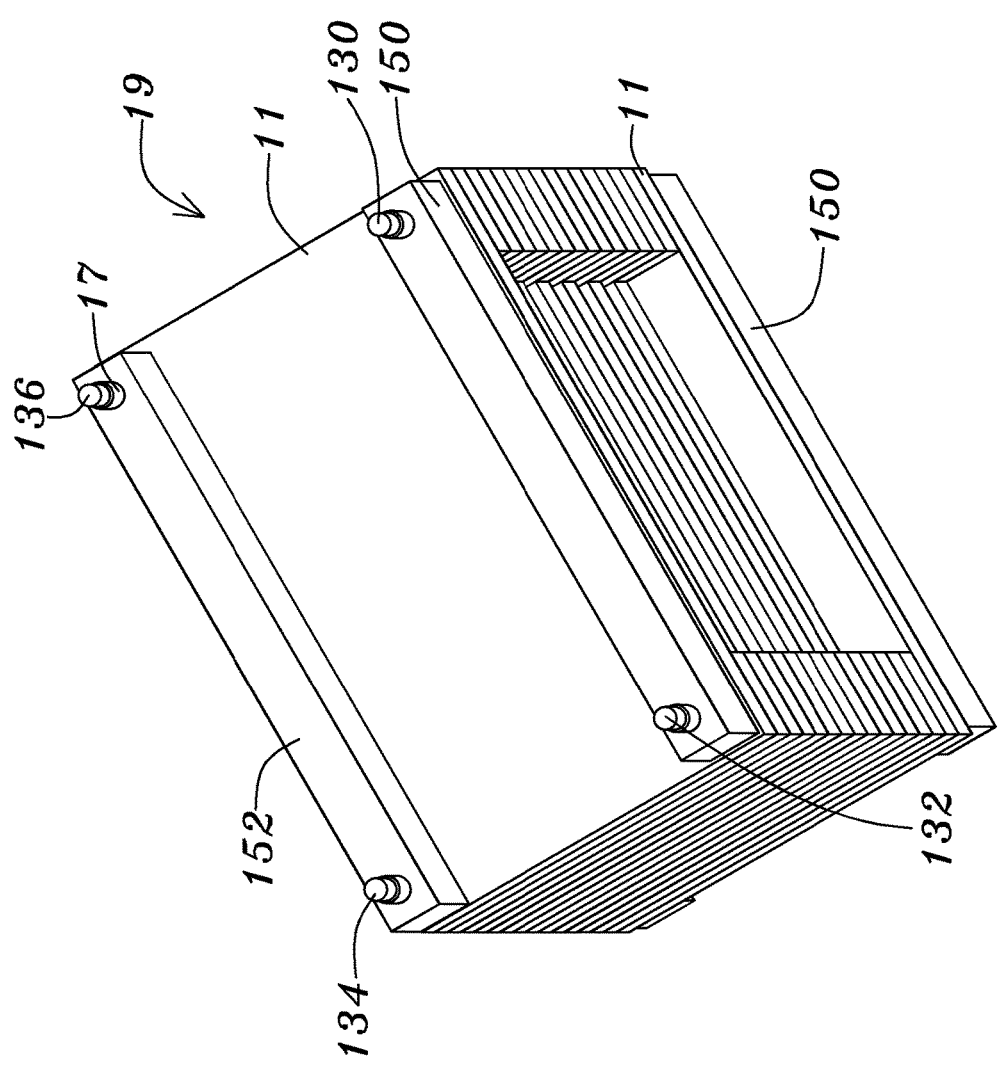

Next, referring to FIG. 7e, there is illustrated a three-dimensional view of a third metal plate 11 in FIG. 7e. The third metal plate 11 has a thickness between 25 micrometers and 600 micrometers, between 20 micrometers and 300 micrometers, between 30 micrometers and 250 micrometers or between 25 micrometers and 180 micrometers. There are four holes 110a, 112a, 114a, 116a in the third metal plate 11, wherein the hole 110a, 112a, 114a, 116a have a diameter between 600 micrometers and 2000 micrometers, between 1000 micrometers and 3000 micrometers or between 2000 micrometers and 5000 micrometers, wherein a fourth least distance between the two hole 110a and hole 112a and a fifth least distance between the two hole 114a and hole 116a are substantially the same to a second least distance between the two holes 73a and substantially the same to the first least distance between the two holes 71a. The third metal plate 11 comprises a copper metal layer, copper-gold alloy metal layer, copper-gold-palladium alloy metal layer, copper-gold-silver alloy metal layer, copper-platinum alloy metal layer, copper-iron alloy metal layer, copper-nickel alloy metal layer, copper-tungsten metal layer, tungsten metal layer, brass metal layer, zinc plated brass metal layer, stainless metal layer, nickel plated stainless metal layer, phosphor bronze metal layer, copper plated the aluminum metal layer or aluminum metal layer.

Next, referring to FIG. 7f-FIG. 7i, providing two bolts 130, 132 pass through two holes 150a of a fixing metal plate 150 and providing two bolts 134, 136 pass through two holes 152a of a fixing metal plate 152 respectively. Next, the bolts 130, 132, 134, 136 are passing through the holes 110a, 112a, 114a, 116a of the third metal plate 11 respectively and the third metal plate 11 is formed on the fixing metal plate 150 and the fixing metal plate 152. Next, the bolts 130, 132 are passing through the hole 90a of the second metal plate 9 and the bolts 134, 136 are passing through the hole 90a of another the second metal plate 9, then the second metal plates 9 are formed on the third metal plate 11. Next, the bolts 130, 132, 134, 136 are passing through the holes 71a, 73a of the first metal plate 7 respectively and the first metal plate 7 is formed on the second metal plates 9. Next, repeating to site another the second metal plates 9 on another the first metal plate 7 sequentially until to expose a top of the bolts 130, 132, 134, 136. Next, the top of the bolts 130, 132, 134, 136 are passing through the holes 110a, 112a, 114a, 116a of another the third metal plate 11 respectively and the third metal plate 11 is formed on the second metal plates 9. Next, The top of the bolts 130, 132 are passing through two holes 150a of another the fixing metal plate 150 and the top of the bolts 134, 136 are passing through two holes 152a of another the fixing metal plate 152 respectively, then the fixing metal plates 150, 152 are formed on the third metal plate 11. Finally, providing four sleeve nuts 17 lock on the top of the bolts 130, 132, 134, 136. Then, multiple the first metal plates 7, multiple the second metal plates 9, two the third metal plates 11, two fixing metal plates 150 and two fixing metal plates 152 forming a metal trace block 19.

Next, referring to FIG. 7j the metal trace block 19 is put in a mold 23. The mold 23 may be a metal mold, a ceramics mold or a polymer mold, which has a heat deflection temperature between 400° C. and 900° C. or between 800° C. and 1300° C. The mold 23 comprises a gas inlet 23a and a liquid input 23b, wherein the gas inlet 23a is used to input $N_2$ gas and the liquid input 23b is used to input the liquid form glass layer.

Figure 7K:
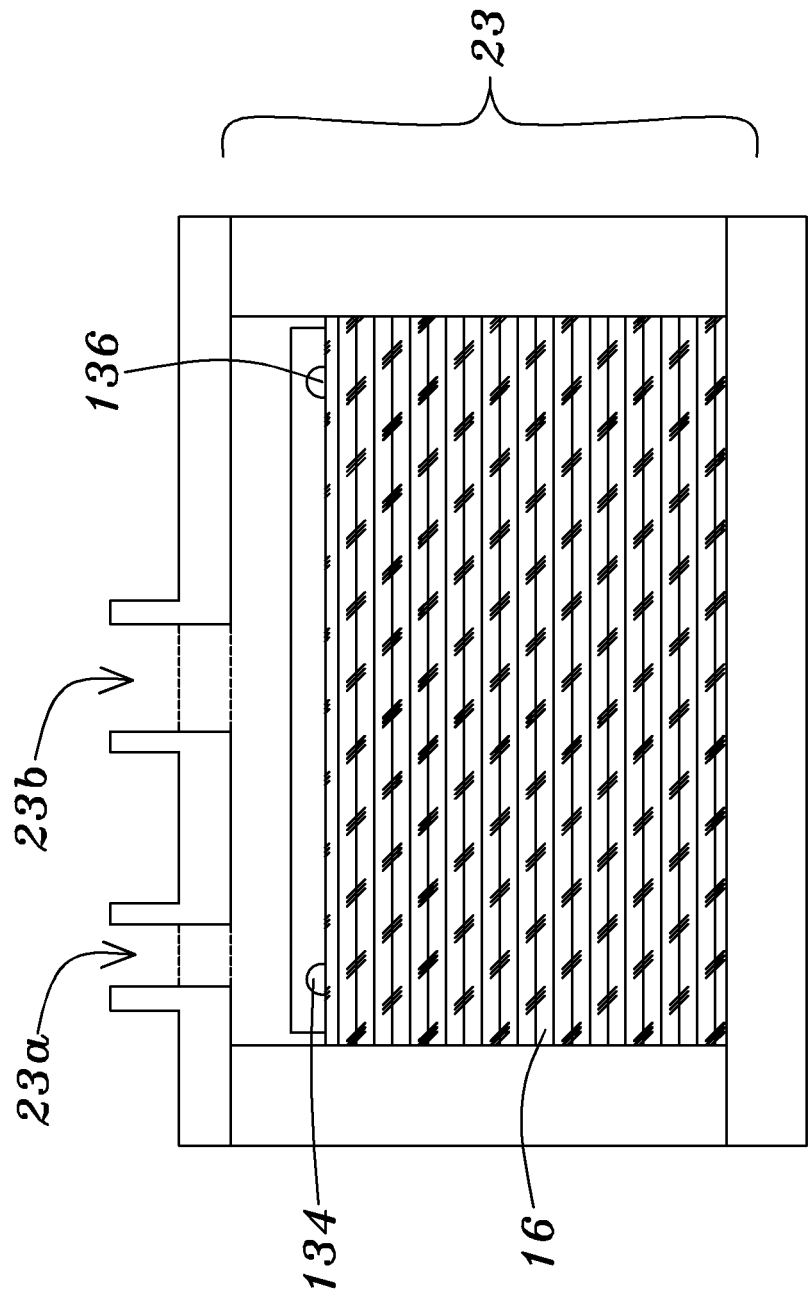
Figure 71:
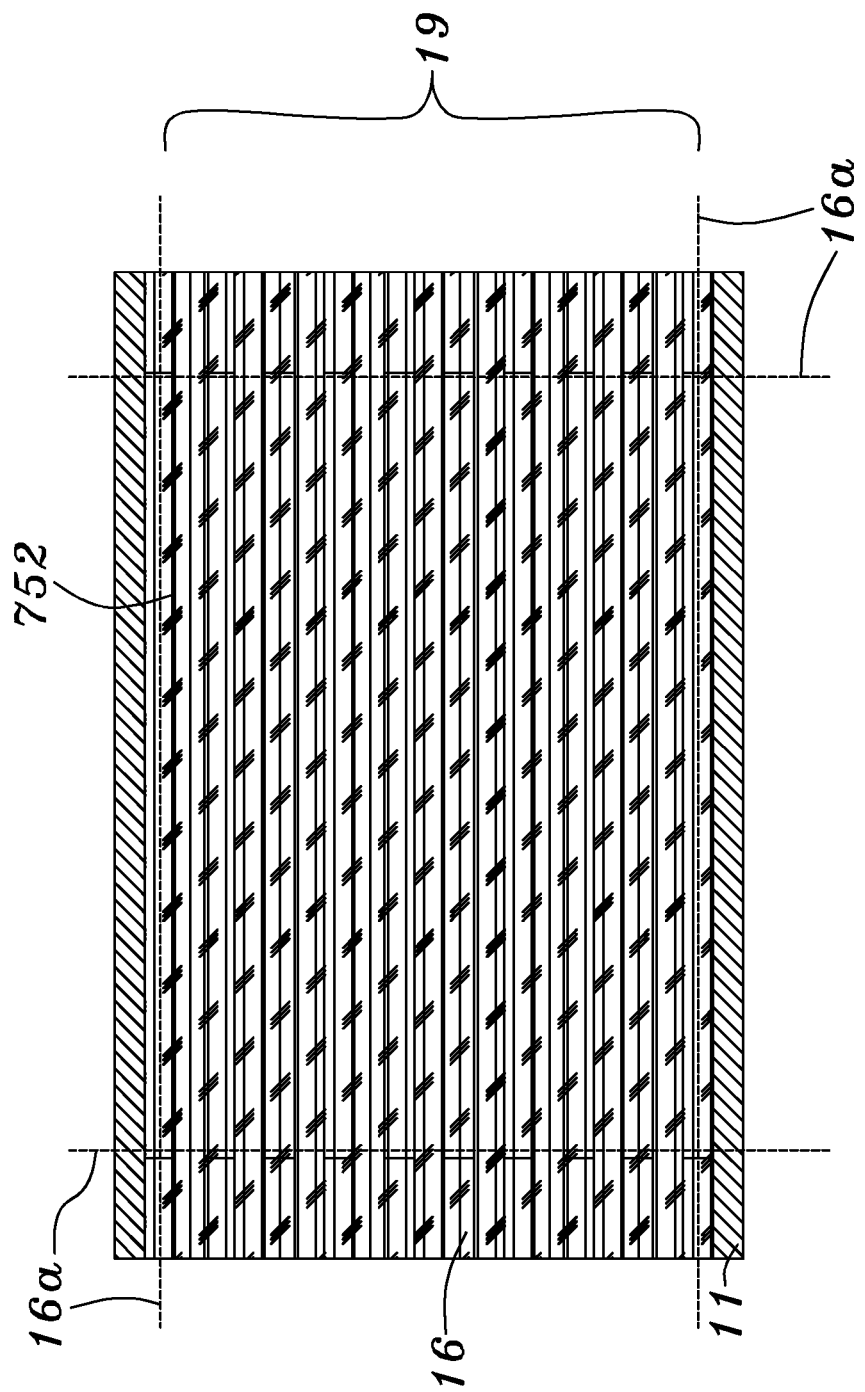

Next, referring to FIG. 7k, the glass layer (liquid form) 16 fill in the mold 23. The glass layer 16 is a high temperature liquid and fill in the mold 23, and then the glass layer 16 down to a suitable temperature becomes a solid state, wherein the glass layer 16 has a glass transition temperature between 300° C. and 900° C., between 500° C. and 800° C., between 900° C. and 1200° C. or between 1000° C. and 1800° C. The glass layer 16 is a low melting point glass material, wherein the glass layer 16 has a melting point between 300° C. and 900° C., 800° C. and 1300° C., between 900° C. and 1600° C., between 1000° C. and 1850° C., or between 1000° C. and 2000° C., wherein the melting point may smaller than 1500° C. Furthermore, there is a few bubbles or no bubble in glass layer 16, for example, there is zero to 3 bubbles in one cubic meter of the glass layer 16, 1 to 10 bubbles in one cubic meter of the glass layer 16, 5 to 30 bubbles in one cubic meter of the glass layer 16 or 20 to 60 bubbles in one cubic meter of the glass layer 16, wherein the bubble has a diameter between 0.0001 and 0.001 centimeters, between 0.001 and 0.05 centimeters, between 0.05 and 0.1 centimeters or between 0.05 and 0.5 centimeters. The glass layer 16 may be remove bubbles through multiple laminating process, squeezing process and heating process.

Figure 7M:
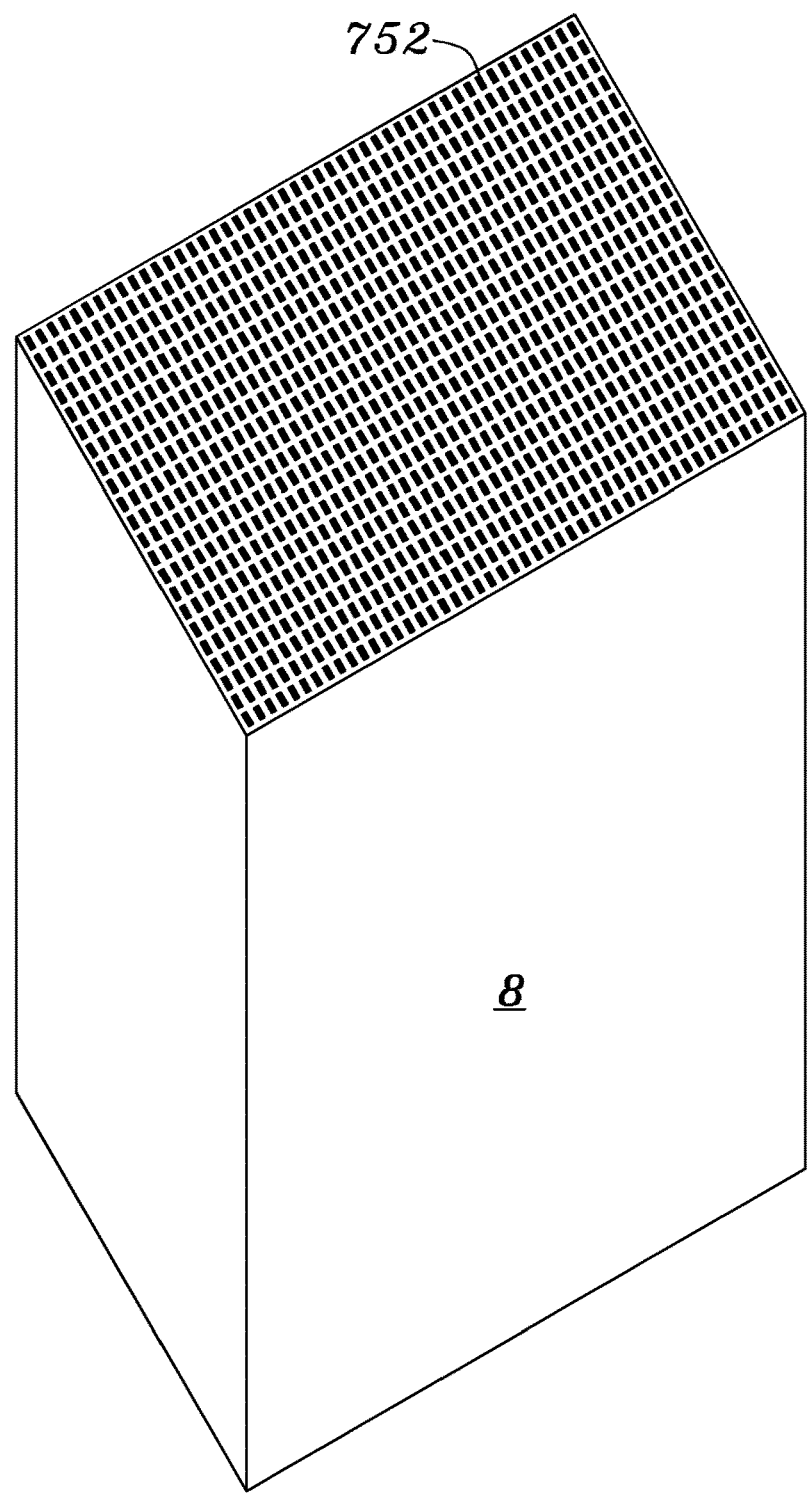

Next, referring to FIG. 7l, the mold 23 is removed and cut the glass layer 16 along a cutting line 16a to remove the fixing metal plate 150, the fixing metal plate 152, the first portion 71 of the first metal plate 7, the second portion 73 of the first metal plate 7 and two the third metal plates 11, and then the column 25 is produced, showed in the FIG. 7m.

Figure 7N:
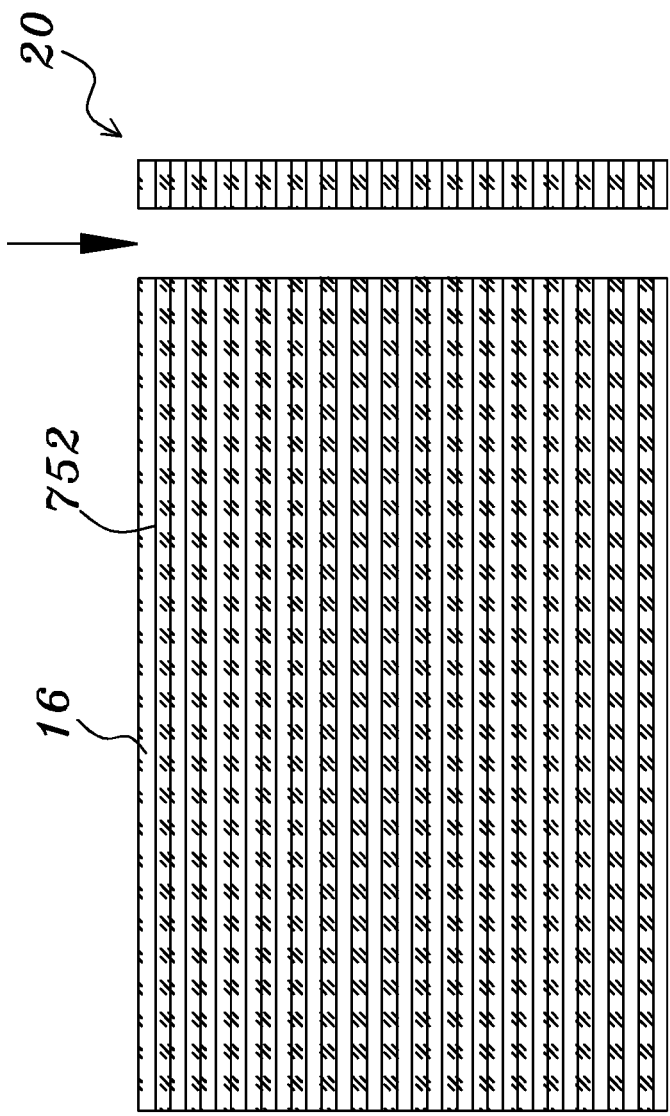

Next, referring to FIG. 7n, cutting the column 25 to produce multiple first substrates 20, wherein the first substrate 20 has a thickness between 20 and 100 micrometers, between 50 and 150 micrometers, between 100 and 300 micrometers or between 150 and 2000 micrometers or greater than 1000 micrometers. The first substrates 20 may be make a planarization process using a suitable process, such as a chemical mechanical polishing (CMP) procedure, mechanical grinding, or laser drilling.

Figure 7O:
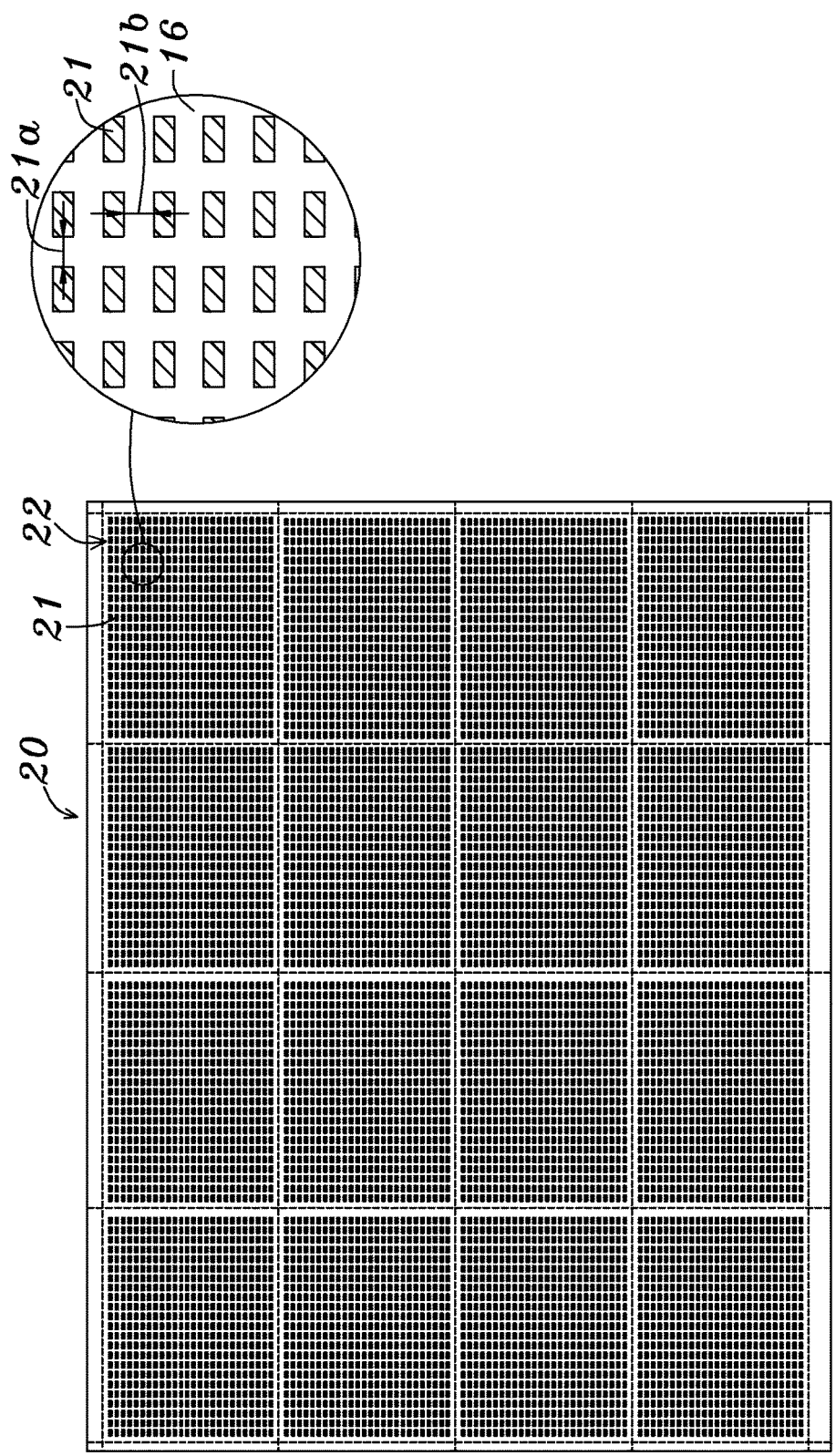

Next, referring to FIG. 7o, the first substrate 20 comprises multiple second substrates 22. The second substrates 22 are well-regulated an array in the first substrate 20. Each of the second substrates has multiple metal plugs 21, wherein the metal plug 21 is formed from the non-circular metal traces 752. The metal plug 21 has the same material, structure and shape with the non-circular metal traces 752. A first pitch 21a and a second pitch 21b is between the metal plugs 21, wherein the first pitch 21a is controlled or the same-2 by a distance of the gap 754 and wherein the second pitch 21b is controlled by a distance of adjacent the non-circular traces 752.

Figure 7R:
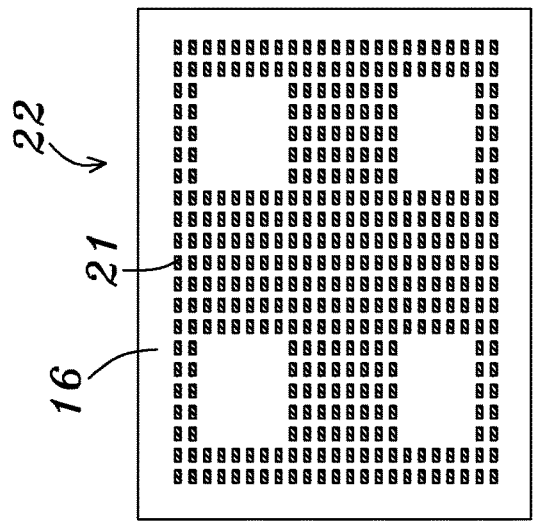
Figure 7Q:
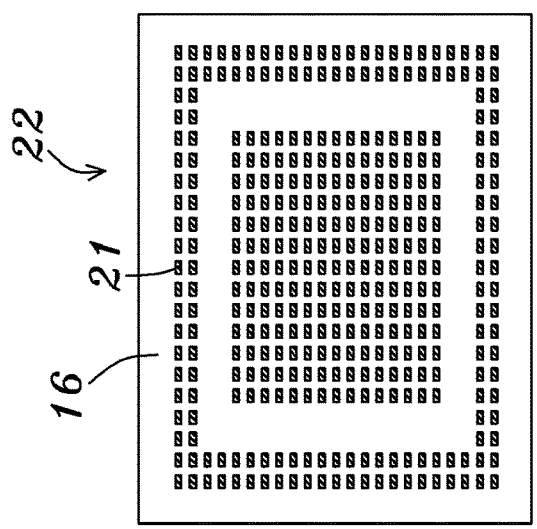
Figure 7P:
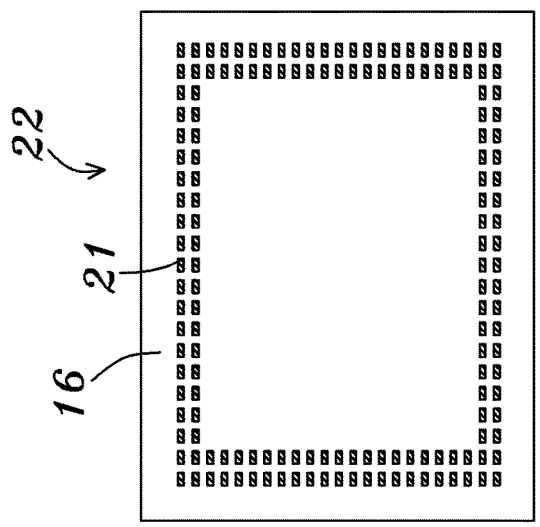

Next, referring to FIG. 7p-7r, the metal plugs 21 may be arranged different types, such as FIG. 7p, the metal plugs 21 are arranged on the side portions of the second substrate 22, or such as FIG. 7q, the metal plugs 21 are arranged on the side portions and center portion of the second substrate 22, or such as FIG. 7r, some portions of the second substrate 22 are not arranged the metal plugs 21.

Figure 8A:
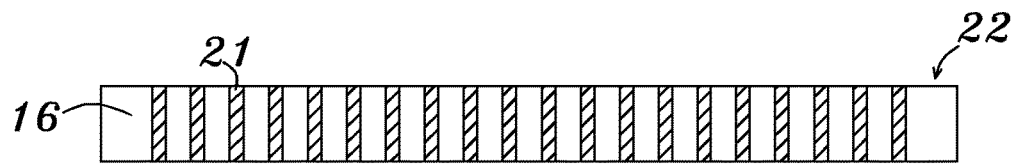
FIGS. 8a-8d illustrate cross-section views of the glass substrate and the metal plug, in accordance with the present disclosure.

FIG. 8a illustrates a cross-section view of the second substrate 22 illustrates a cross-section view of the metal plug 21. The second substrate 22 comprise an amorphous solid glass layer/body 16 and multiple metal plugs 21, wherein the amorphous solid glass layer/body 16 having a top surface and an opposing bottom surface and the metal plugs 21 extending through the amorphous solid glass layer/body 16 beginning at the top surface and ending at the bottom surface. The top surface of the metal plugs 21 are the same area as the bottom surface of the metal plugs 21.

Figure 8B:
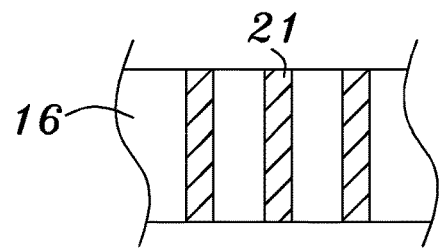

Please referring FIG. 8b, the top surface of the metal plugs 21 and the top surface of the amorphous solid glass layer/body 16 are substantially coplanar. The bottom surface of the metal plugs 21 and the bottom surface of the amorphous solid glass layer/body 16 are substantially coplanar.

Figure 8C:
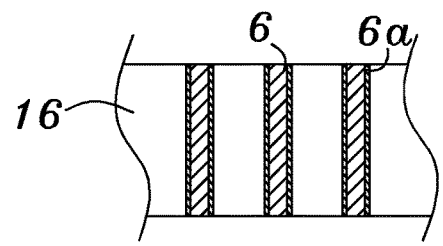

Please referring FIG. 8c, the top surface of the metal plugs 21 comprises a top surface of the metal traces 6/metal traces 752 and a top surface of the first covering layer 6a are substantially coplanar with the top surface of the amorphous solid glass layer/body 16. The bottom surface of the metal plugs 21 comprises a bottom surface of the metal traces 6/metal traces 752 and a bottom surface of the first covering layer 6a are substantially coplanar with the bottom surface of the amorphous solid glass layer/body 16.

Figure 8D:
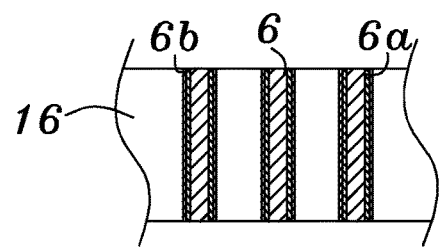

Please referring FIG. 8d, the top surface of the metal plugs 21 comprises a top surface of the metal traces 6/metal traces 752, a top surface of the first covering layer 6a and a top surface of the second covering layer 6b are substantially coplanar with the top surface of the amorphous solid glass layer/body 16. The bottom surface of the metal plugs 21 comprises a bottom surface of the metal traces 6/metal traces 752, a bottom surface of the first covering layer 6a and a bottom surface of the second covering layer 6b are substantially coplanar with the bottom surface of the amorphous solid glass layer/body 16.

Figure 9C:
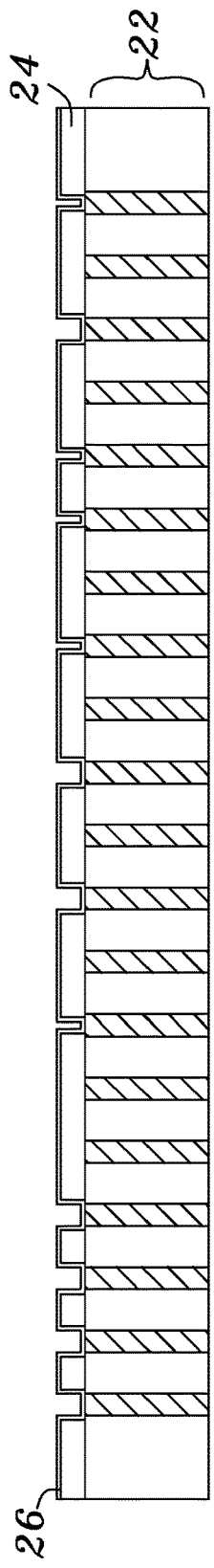
FIGS. 9a-9s illustrate a process to form multiple traces on a top surface and a bottom surface of the glass substrate, in accordance with the present disclosure.
FIGS. 9t-9u illustrate cross-section views of multiple chips formed on the glass substrate, in accordance with the present disclosure.
FIG. 9v illustrates a cross-section view of the metal bump, in accordance with the present disclosure.
FIG. 9w illustrates a cross-section view of multiple chips formed on a top surface and bottom surface of the glass substrate, in accordance with the present disclosure.
FIG. 9x illustrates a cross-section view of multiple chips and a 3D-IC package formed on a top surface and bottom surface of the glass substrate, in accordance with the present disclosure.
FIG. 9y illustrates a top views of the multiple chips on the glass substrate, in accordance with the present disclosure.
Figure 9D:
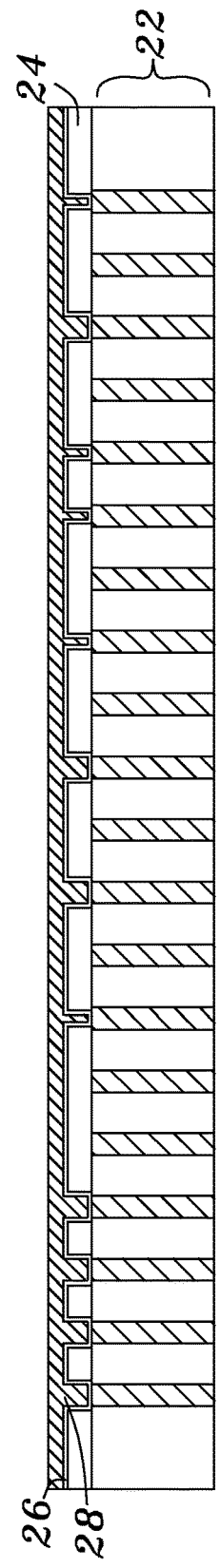
Figure 9G:
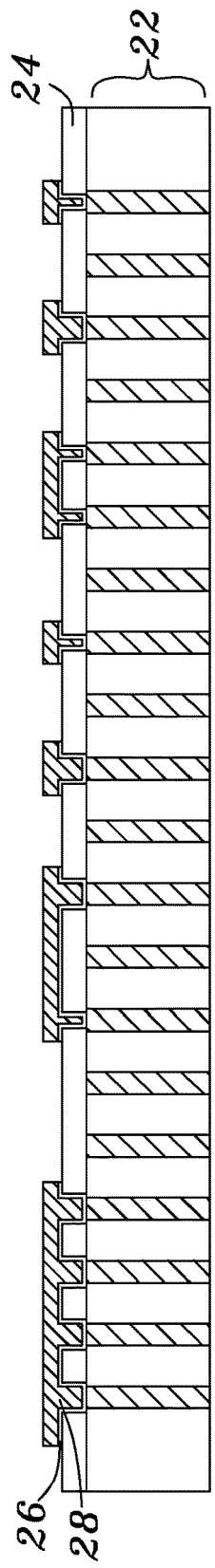
Figure 9H:
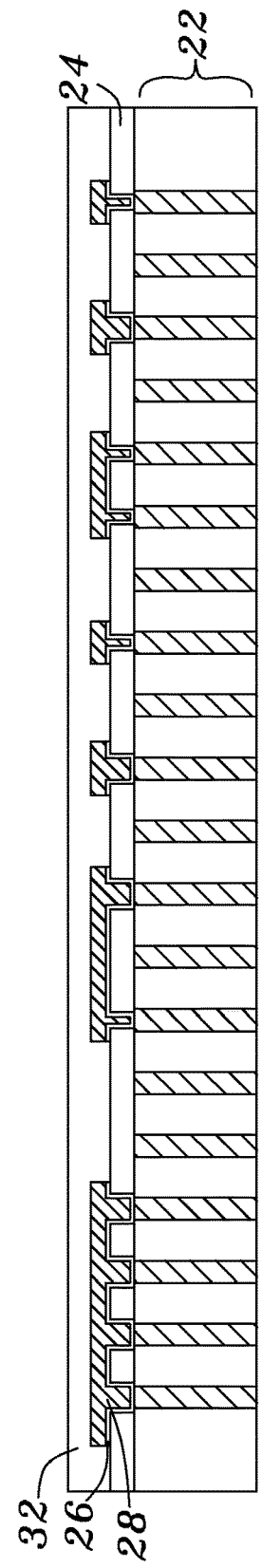
Figure 9I:
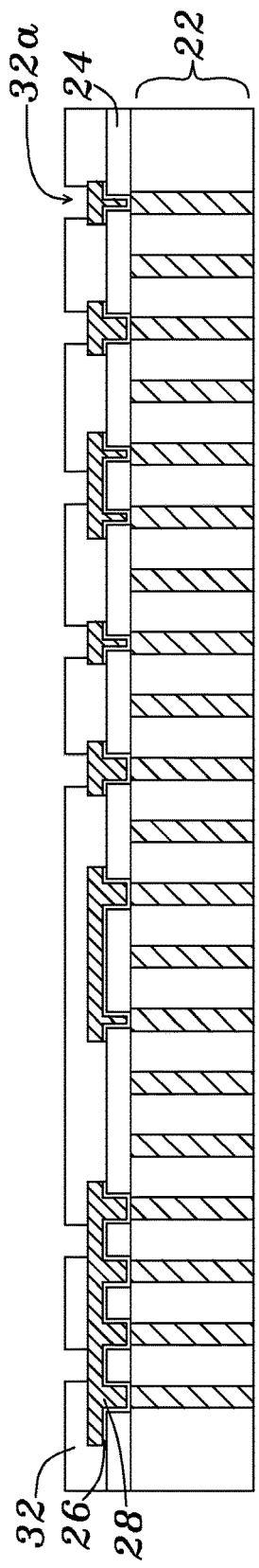
Figure 9J:
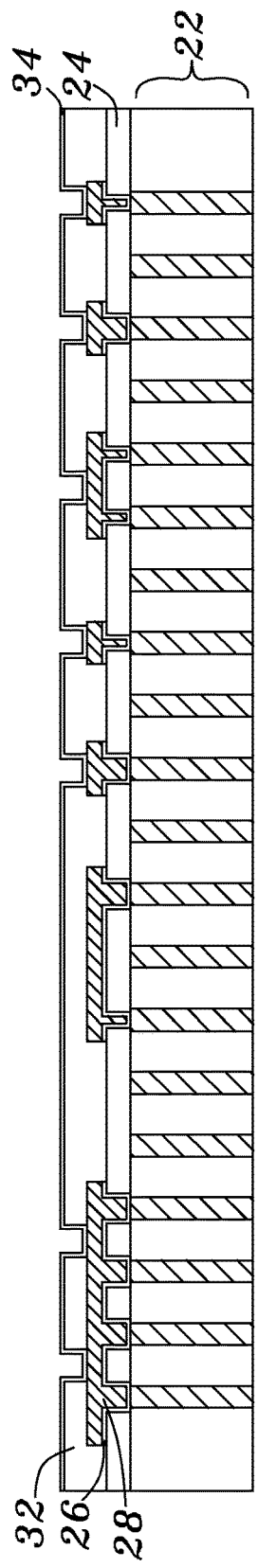
Figure 9K:
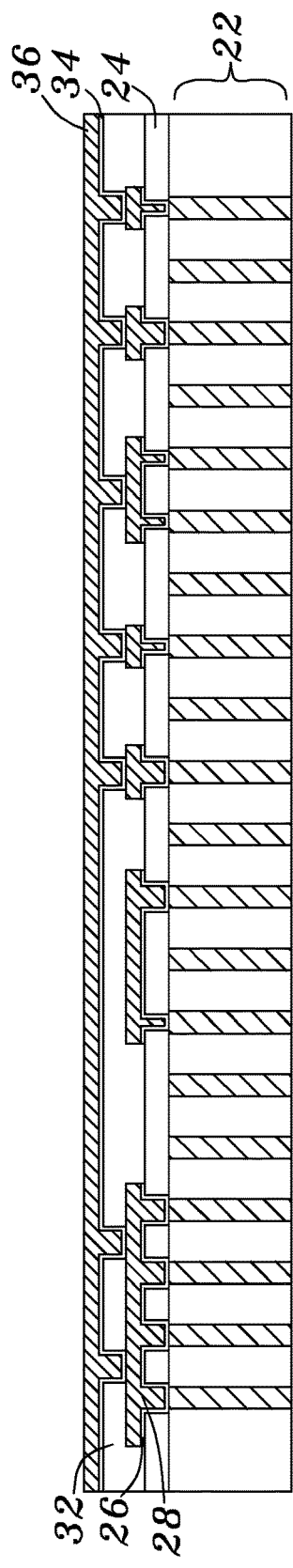
Figure 9L:
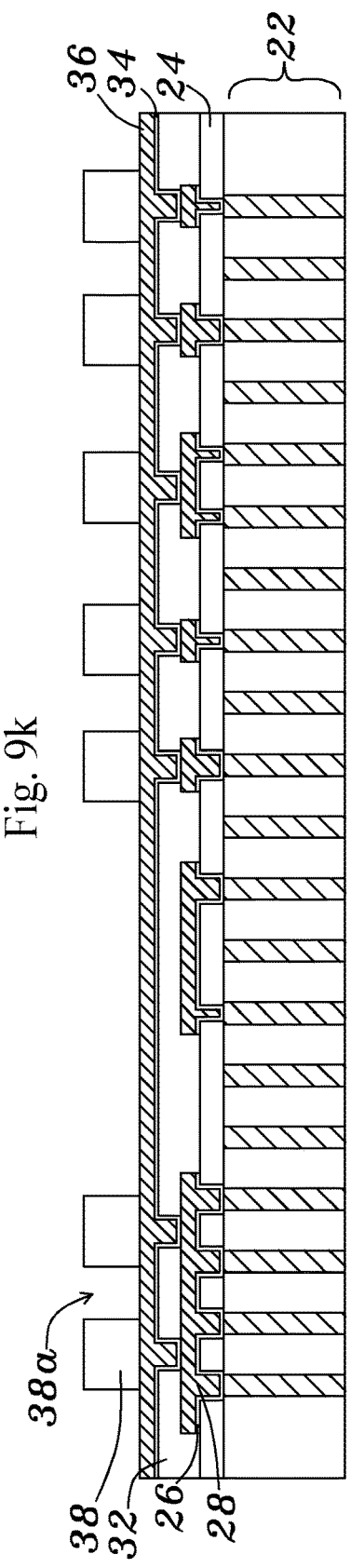
Figure 9M:
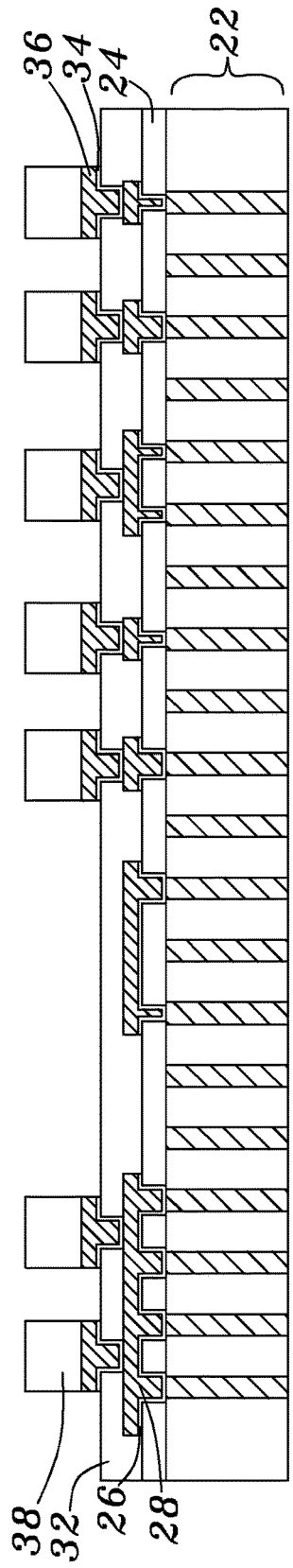
Figure 9N:
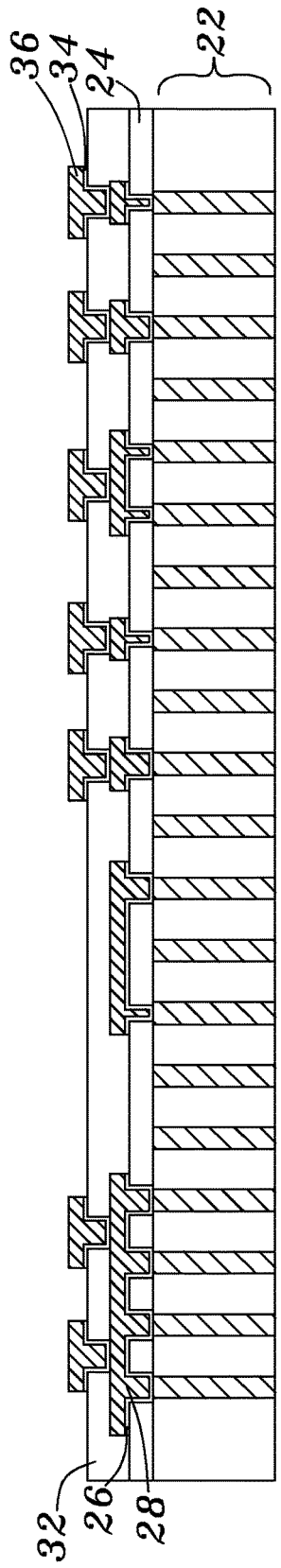
Figure 9O:
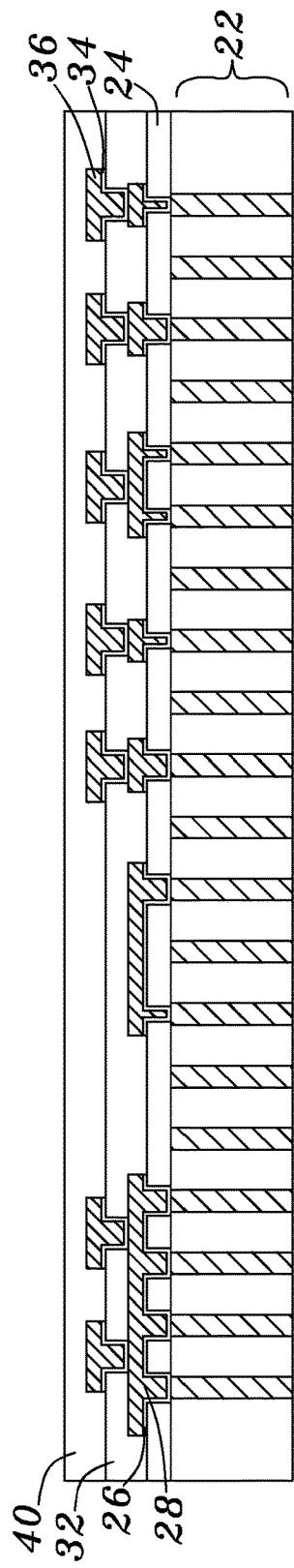
Figure 9P:
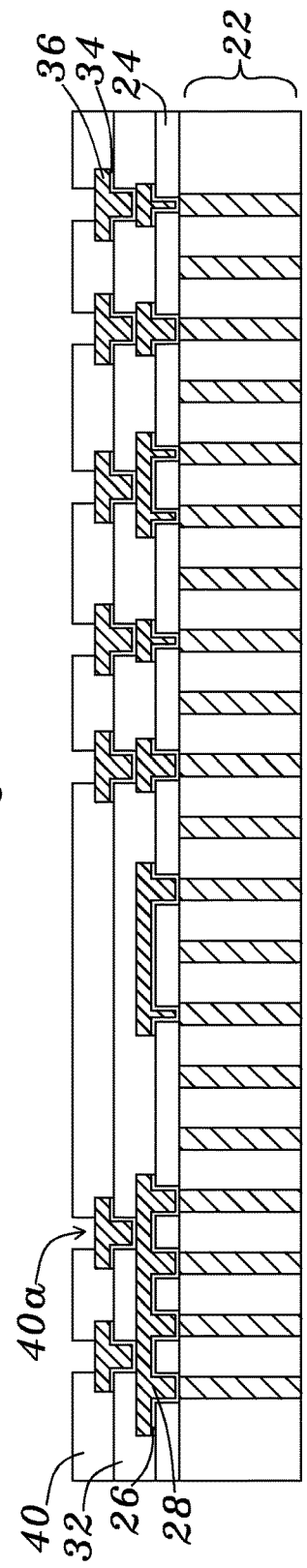
Figure 9Q:
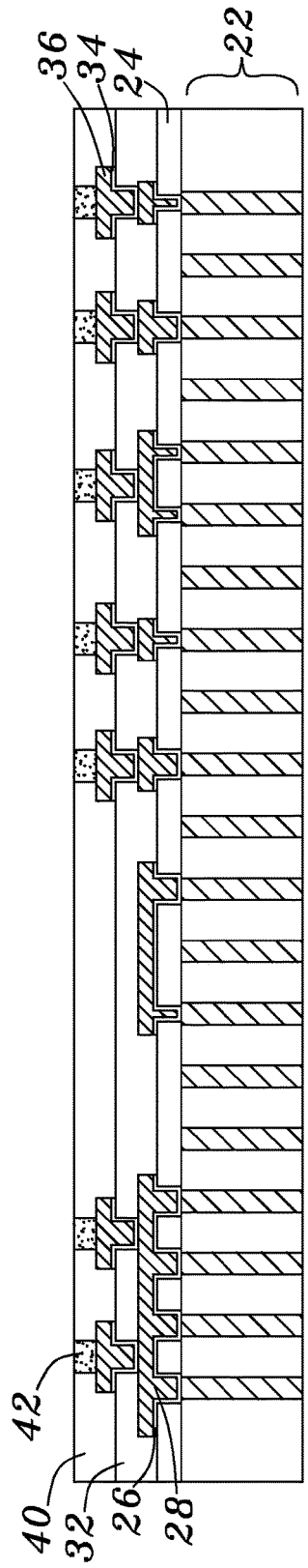
Figure 9R:
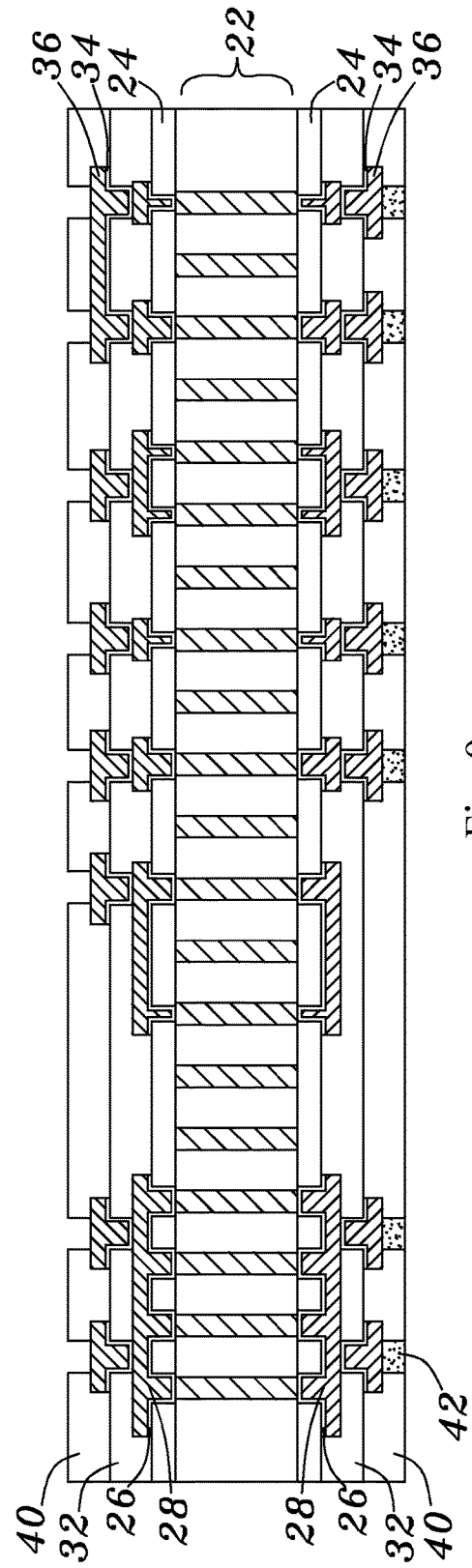
Figure 9S:
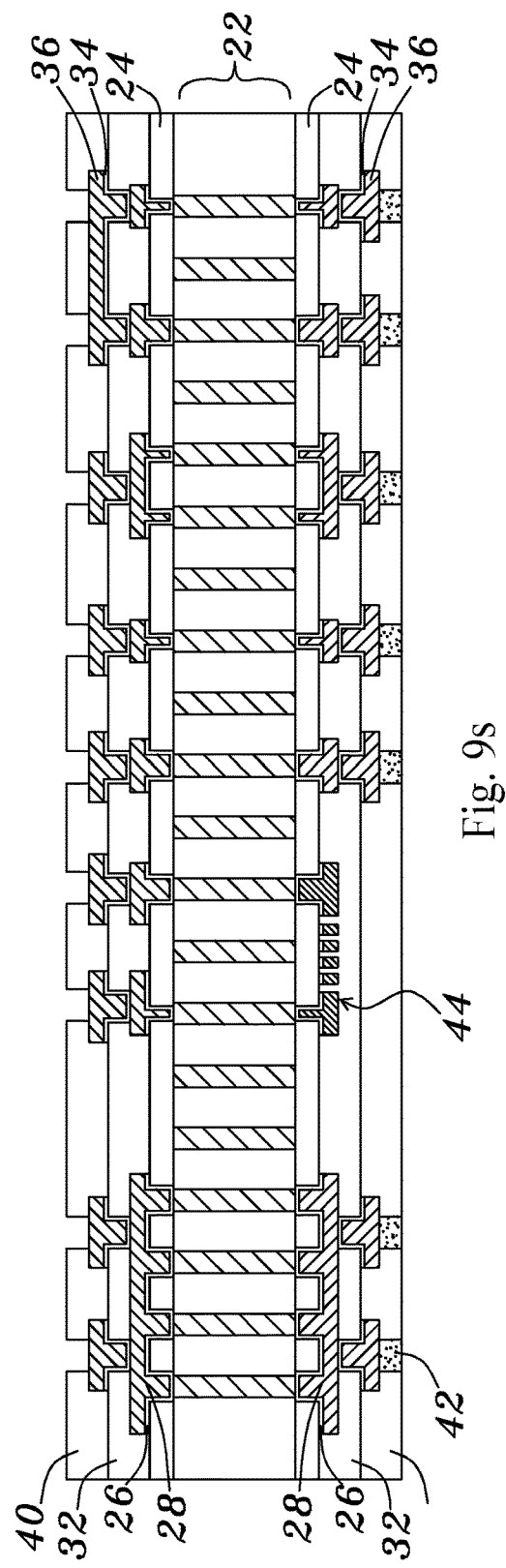
Figure 9T:
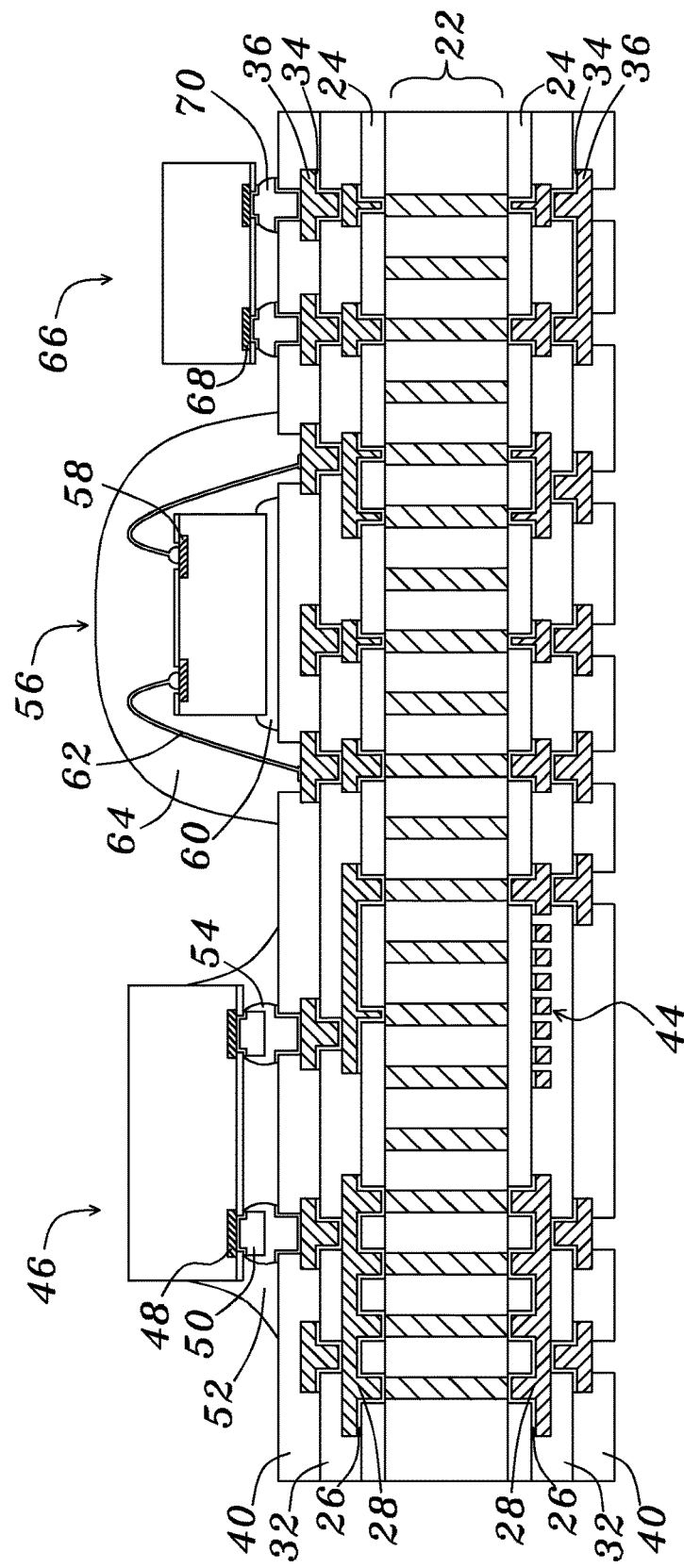

FIG. 9a-FIG. 9t illustrates a process to form multiple traces on a top surface and a bottom surface of the first substrate 20.

Next, referring to FIG. 9a, a first dielectric layer 24 is formed on the top surface of the first substrate 20, wherein the first dielectric layer 24 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), poly-phenylene oxide (PPO), epoxy, or silosane). The first dielectric layer 24 may be formed or deposited using a suitable process. The first dielectric layer 24 has a thickness between 0.3 and 5 micrometers, between 2 and 10 micrometers, between 1 and 30 micrometers or greater than 30 micrometers.

Next, referring to FIG. 9b, multiple openings 24a are formed in the first dielectric layer 24 to expose the metal plugs 21. The openings 24a may be formed in the first dielectric layer 24 by a suitable process, such as etching. The opening 24a has a width between 0.3 and 3 micrometers, between 0.5 and 8 micrometers, between 2 and 20 micrometers or between 2 and 50 micrometers.

Next, referring to FIG. 9c, a first metal layer 26 is formed on the first dielectric layer 24, on the metal plugs 21 and in the openings 24a. The first metal layer 26 may include an adhesion/barrier layer, such as a layer of titanium, a titanium-tungsten alloy, titanium nitride, chromium, tantalum, tantalum nitride, nickel or nickel vanadium formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 2 micrometers, between 0.3 and 3 micrometers or between 0.5 and 10 micrometers.

Next, referring to FIG. 9d, a second metal layer 28 is formed on the first metal layer 26. The second metal layer 28 may be comprises copper, nickel, gold or aluminum formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 5 micrometers, between 1 and 5 micrometers or between 5 and 30 micrometers.

Next, referring to FIG. 9e, a photoresist layer 30 is formed on the second metal layer 28 by using a suitable process, such as spin coating process or lamination process. Next, a photo exposure process using a 1× stepper and a development process using a chemical solution can be employed to form multiple openings 30a, exposing the second metal layer 28, in the photoresist layer. The photoresist layer 30 may have a thickness, e.g., between 3 and 50 micrometers, wherein the photoresist layer 30 may be a positive-type photo-sensitive resist layer or negative-type photo-sensitive resist layer.

Next, referring to FIG. 9f, remove the first metal layer 26 and the second metal layer 28 are under the openings 30a by using a suitable process, such as an etching process.

Next, referring to FIG. 9g, remove the photoresist layer 30 by using a clean process.

Next, referring to FIG. 9h, a second dielectric layer 32 is formed on the first dielectric layer 24 and on the second metal layer 28, wherein the second dielectric layer 32 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), poly-phenylene oxide (PPO), epoxy, or silosane). The second dielectric layer 32 may be formed or deposited using a suitable process. The second dielectric layer 32 has a thickness between 0.3 and 5 micrometers, between 2 and 10 micrometers, between 1 and 30 micrometers or greater than 30 micrometers.

Next, referring to FIG. 9i, multiple openings 32a are formed in the second dielectric layer 32 to expose the second metal layer 28. The openings 32a may be formed in the second dielectric layer 32 by a suitable process, such as etching. The opening 32a has a width between 0.3 and 3 micrometers, between 0.5 and 8 micrometers, between 2 and 20 micrometers or between 2 and 50 micrometers.

Next, referring to FIG. 9j, a third metal layer 34 is formed on the second dielectric layer 32, on the second metal layer 28 and in the openings 32a. The third metal layer 34 may include an adhesion/barrier layer, such as a layer of titanium, a titanium-tungsten alloy, titanium nitride, chromium, tantalum, tantalum nitride, nickel or nickel vanadium formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 2 micrometers, between 0.3 and 3 micrometers or between 0.5 and 10 micrometers.

Next, referring to FIG. 9k, a fourth metal layer 36 is formed on the third metal layer 34. The fourth metal layer 36 may be comprises copper, nickel, gold or aluminum formed using a suitable process, such as vacuum deposition, Physical Vapor Deposition (PVD), Plasma Enhanced Chemical Vapor Deposition (PECVD), sputtering process or an electroplating process, with a thickness, e.g., between 1 nanometer and 5 micrometers, between 1 and 5 micrometers or between 5 and 30 micrometers.

Next, referring to FIG. 9*l*, a photoresist layer 38 is formed on the fourth metal layer 36 by using a suitable process, such as spin coating process or lamination process. Next, a photo exposure process using a 1× stepper and a development process using a chemical solution can be employed to form multiple openings 38*a*, exposing the fourth metal layer 36, in the photoresist layer. The photoresist layer 38 may have a thickness, e.g., between 3 and 50 micrometers, wherein the photoresist layer 38 may be a positive-type photo-sensitive resist layer or negative-type photo-sensitive resist layer.

Next, referring to FIG. 9*m*, remove the third metal layer 34 and the fourth metal layer 36 are under the openings 38*a* by using a suitable process, such as an etching process.

Next, referring to FIG. 9*n*, remove the photoresist layer 38 by using a clean process.

Next, referring to FIG. 9*o*, a third dielectric layer 40 is formed on the second second dielectric layer 32 and on the fourth metal layer 36, wherein the third dielectric layer 40 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), low k dielectric layer (K between 0.5 and 3), or polymer (such as polyimide, benzocyclobutene (BCB), polybenzoxazole (PBO), poly-phenylene oxide (PPO), epoxy, or silosane). The third dielectric layer 40 may be formed or deposited using a suitable process. The third dielectric layer 40 has a thickness between 0.3 and 5 micrometers, between 2 and 10 micrometers, between 1 and 30 micrometers or greater than 30 micrometers.

Next, referring to FIG. 9*p*, multiple openings 40*a* are formed in the third dielectric layer 40 to expose the fourth metal layer 36. The openings 40*a* may be formed in the third dielectric layer 40 by a suitable process, such as etching. The opening 40*a* has a width between 0.3 and 3 micrometers, between 0.5 and 8 micrometers, between 2 and 20 micrometers or between 2 and 50 micrometers.

Next, referring to FIG. 9*q*, a protecting layer 42 is formed in the openings 40*a*, on the third dielectric layer 40 and on the fourth metal layer 36, which can protect the third dielectric layer 40 not to be damaged and the fourth metal layer 36 not be damaged and oxidated.

Next, referring to FIG. 9*r*, repeat the processes of FIG. 9*a*-FIG. 9*p* to form the first dielectric layer 24, the first metal layer 26, the second metal layer 28, the second dielectric layer 32, the third metal layer 34, the fourth metal layer 36 and the third dielectric layer 40 on the bottom surface of the first substrate 20.

Furthermore, referring to FIG. 9*s*, a passive device 44 may be formed in the first metal layer 28 and the second metal layer 36, such as an inductor, a capacitor or a resistor.

Next, referring to FIG. 9*t*, multiple chips 46 and chips 56 set up over the third dielectric layer 40 through a flip chip package process or a wirebonding package process, wherein the chip 46 and 56 comprises may be a memory chip, such as NAND-Flash memory chip, Flash memory chip, DRAM chip, SRAM chip or SDRAM chip, a central-processing-unit (CPU) chip, a graphics-processing-unit (GPU) chip, a digital-signal-processing (DSP) chip, a baseband chip, a wireless local area network (WLAN) chip, a logic chip, an analog chip, a global-positioning-system (GPS) chip, a "Bluetooth" chip, or a chip including one or more of a CPU circuit block, a GPU circuit block, a DSP circuit block, a memory circuit block (such as DRAM circuit block, SRAM circuit block, SDRAM circuit block, Flash memory circuit block, or NAND-Flash memory circuit block), a baseband circuit block, a Bluetooth circuit block, a GPS circuit block, a MEMS chip, a COMS image sensor device, a WLAN circuit block, and a modem circuit block, from the semiconductor wafer.

The chips 46 are set up on the third dielectric layer 40 through a flip chip package process, wherein the chip 46 comprises multiple metal pads 48 and multiple metal bumps 50 formed on the metal pads 48. The metal pad 48 may be an electroplated copper pad, a damascene copper pad or an aluminum pad. The metal bump 50 comprises an adhesion/barrier metal layer formed on the metal pad 48, an electroplated metal layer or an electro-less metal layer formed on the adhesion/barrier metal layer, wherein the adhesion/barrier metal layer comprises a titanium-containing layer, a chromium-containing layer, a tantalum-containing layer or a nickel layer, and the electroplated metal layer comprises a copper layer, a gold layer, a nickel layer, a tin-containing layer, a solder layer, a solder layer over a nickel layer and a copper layer, and the electro-less layer comprises a copper layer, a gold layer or a nickel layer. The electroplated metal layer has a thickness between 2 and 5 micrometers, between 5 and 30 micrometers or between 10 and 50 micrometers. The metal bumps 50 are connected to the fourth metal layer 36 exposed by the openings 40*a* through a solder layer 54, wherein the solder layer 54 is formed on the fourth metal layer 36 exposed by the openings 40*a* or is a portion of the metal bump 50. An underfill layer 52 is formed between the chips 46 and the third dielectric layer 40.

The chips 56 are set up over the third dielectric layer 40 through a polymer adhesion layer 60, wherein the chip 56 comprises multiple metal pads 58. The metal pad 58 may be an electroplated copper pad, a damascene copper pad or an aluminum pad. Multiple metal wires 62 are connected to the metal pads 58 and the fourth metal layer 36 exposed by the openings 40*a*, wherein the metal wires 62 comprises a gold wire, a copper wire, a metal alloy wire, a silver-containing wire, an aluminum-containing wire or gold-copper alloy wire. An underfill layer 64 is covered the chip 56, metal wires 62 and the metal pads 58.

Multiple discrete passive components 66 set up on the third dielectric layer 40, such as a discrete inductor, a discrete capacitor or a discrete resistor, wherein the discrete passive component 66 comprises a multiple metal pad 68. The discrete passive components 66 mounted on the third dielectric layer 40 through a solder layer 70.

Figure 9U:
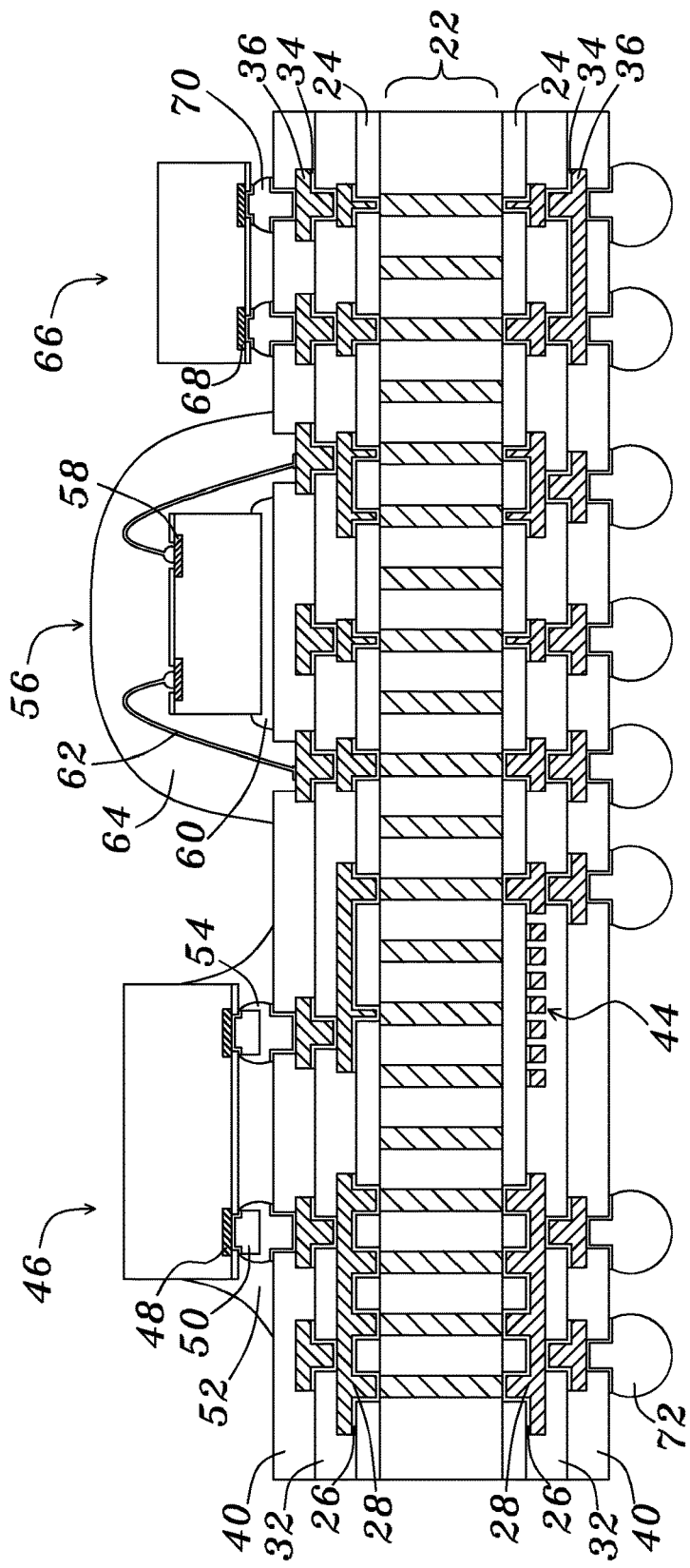

Next, referring to FIG. 9*u*, multiple metal bumps 72 are formed on the bottom surface of the substrate 20.

FIG. 9*v* is disclosed some structures of metal bump 72.

Lift side: $1^{st}$ type of structures of metal bump 72 comprises an adhesion/barrier metal layer 61 formed on the metal pad 48, a metal seed layer 63 formed on the adhesion/barrier metal layer 61, an electroplated metal layer 65 formed on the metal seed layer 63 and a solder layer 67 formed on the electroplated metal layer 65, wherein the adhesion/barrier metal layer 61 comprises a titanium-containing layer, a chromium-containing layer, a tantalum-containing layer or a nickel layer, wherein the first electroplated metal layer 65 comprises a copper layer, a gold layer, a nickel layer, wherein the solder layer 67 can be formed by screen plating, ball mounting, or an electroplating process, such as gold-tin alloy, tin-silver alloy, tin-silver-copper alloy, indium, tin-bismuth alloy, or other lead-free alloy. Lead alloy solders can also be used but may be less desirable in some embodiments due to toxicity considerations. The adhesion/barrier metal layer 61 has a thickness between 0.05 and 2 micrometers. The metal seed layer 63 has a thickness between 0.05 and 2 micrometers. The first electroplated metal layer 65 has a thickness between 1 and 5 micrometers, between 2 and 8 micrometers or between 5 and 20 micrometers. The solder layer 67 has a thickness between 30 and 80 micrometers, between 50 and 100 micrometers, between 80 and 150 micrometers or between 120 and 350 micrometers.

Right side: $2^{nd}$ type of structure of metal bump 72 comprises an adhesion/barrier metal layer 61 formed on the metal pad 48, a metal seed layer 63 formed on the adhesion/barrier metal layer 61, a first electroplated metal layer 65 formed on the metal seed layer 63 and a second electroplated metal layer 69 formed on the first electroplated metal layer 65, wherein the adhesion/barrier metal layer 61 comprises a titanium-containing layer, a chromium-containing layer, a tantalum-containing layer or a nickel layer, wherein the first electroplated metal layer 65 comprises a copper layer, a gold layer, a nickel layer, wherein the second electroplated metal layer 69 comprises a copper layer, a gold layer, a nickel layer. The adhesion/barrier metal layer 61 has a thickness between 0.05 and 2 micrometers. The metal seed layer 63 has a thickness between 0.05 and 2 micrometers. The first electroplated metal layer 65 has a thickness between 1 and 5 micrometers, between 2 and 4 micrometers, between 5 and 15 micrometers or between 10 and 25 micrometers. The second electroplated metal layer 69 has a thickness between 1 and 5 micrometers, between 2 and 4 micrometers, between 10 and 30 micrometers or between 20 and 60 micrometers.

Figure 9W:
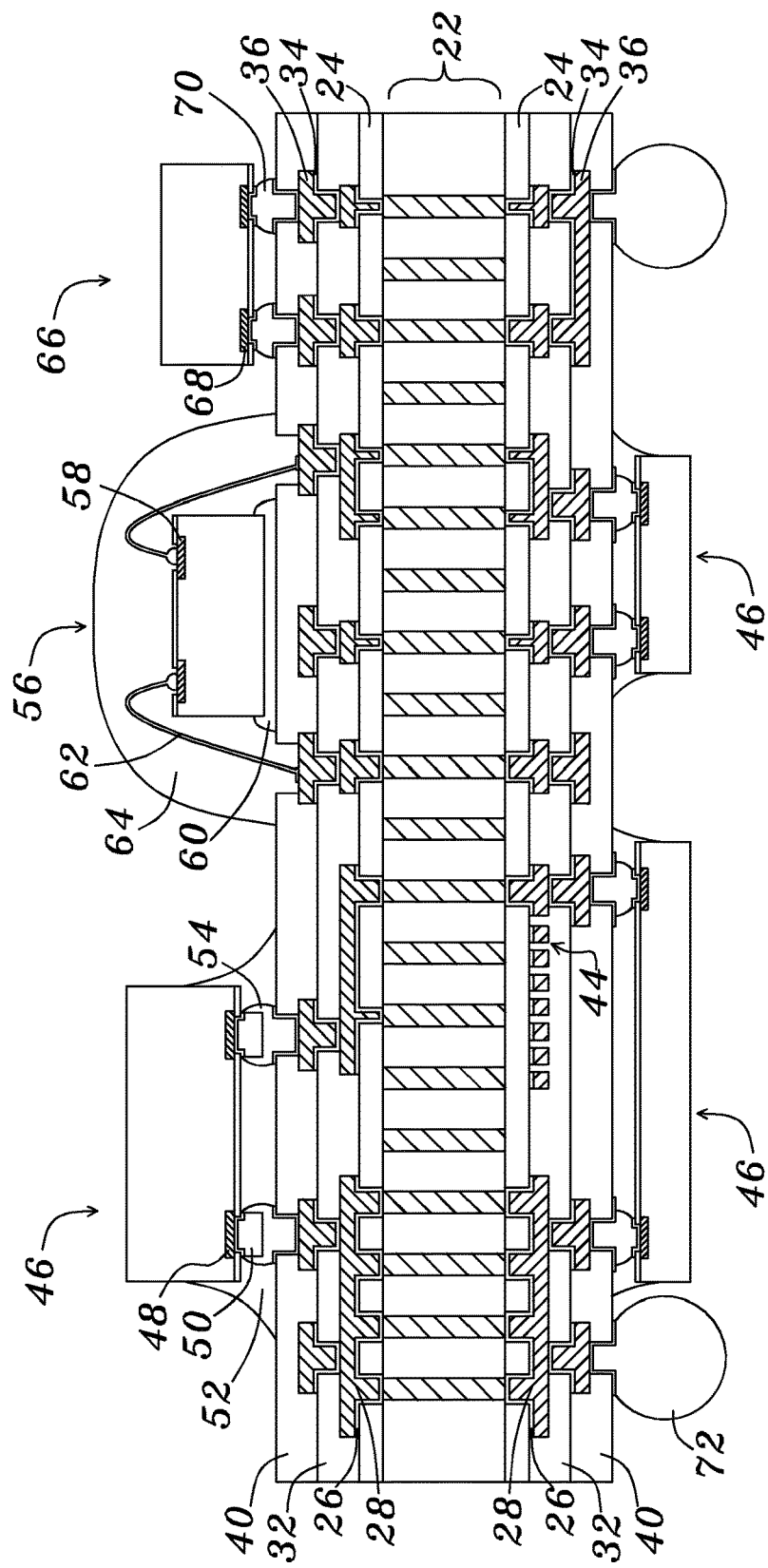

Furthermore, referring to FIG. 9*w*, the chips 46 may be set up on the bottom surface of the first substrate 20.

Figure 9X:
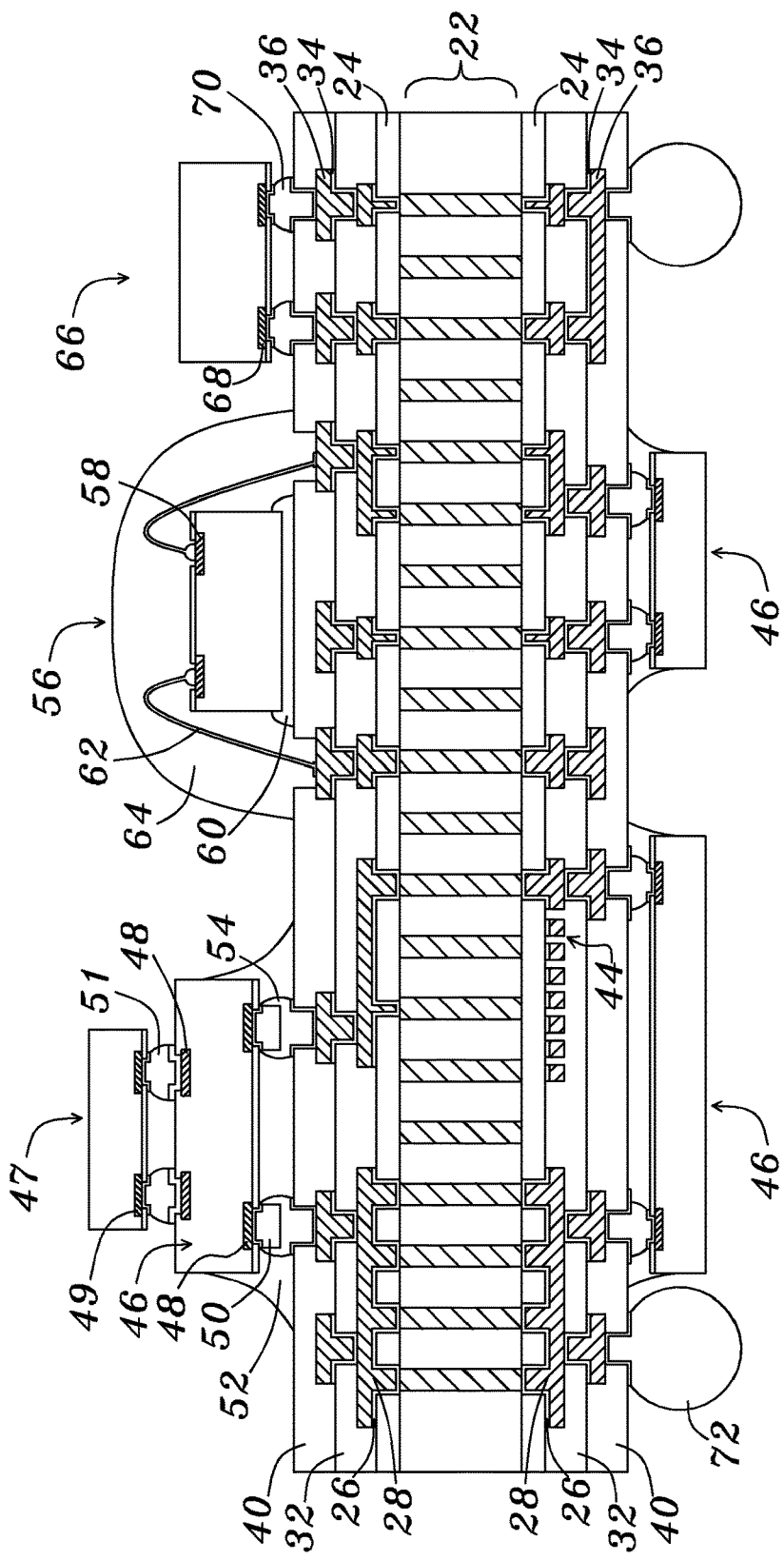

Furthermore, referring to FIG. 9*x*, the chip 46 may be replaced a 3D IC chip package, wherein the chip 46 comprises a multiple metal pad 48 formed on the top and bottom surface. The metal pads 48 of the top surface of the chip 46 are connected to the metal pads 48 of the bottom surface of the chip 46 through multiple through-silicon-via metal layers. A chip 47 is connected to the 3D IC chip 46 through the flip chip package process, wherein the chip 47 comprises multiple metal pads 49, wherein the metal pad 49 may be an electroplated copper pad, a damascene copper pad or an aluminum pad. The metal pads 49 are connected to the metal pads 48 through a solder layer 51.

Figure 9Y:
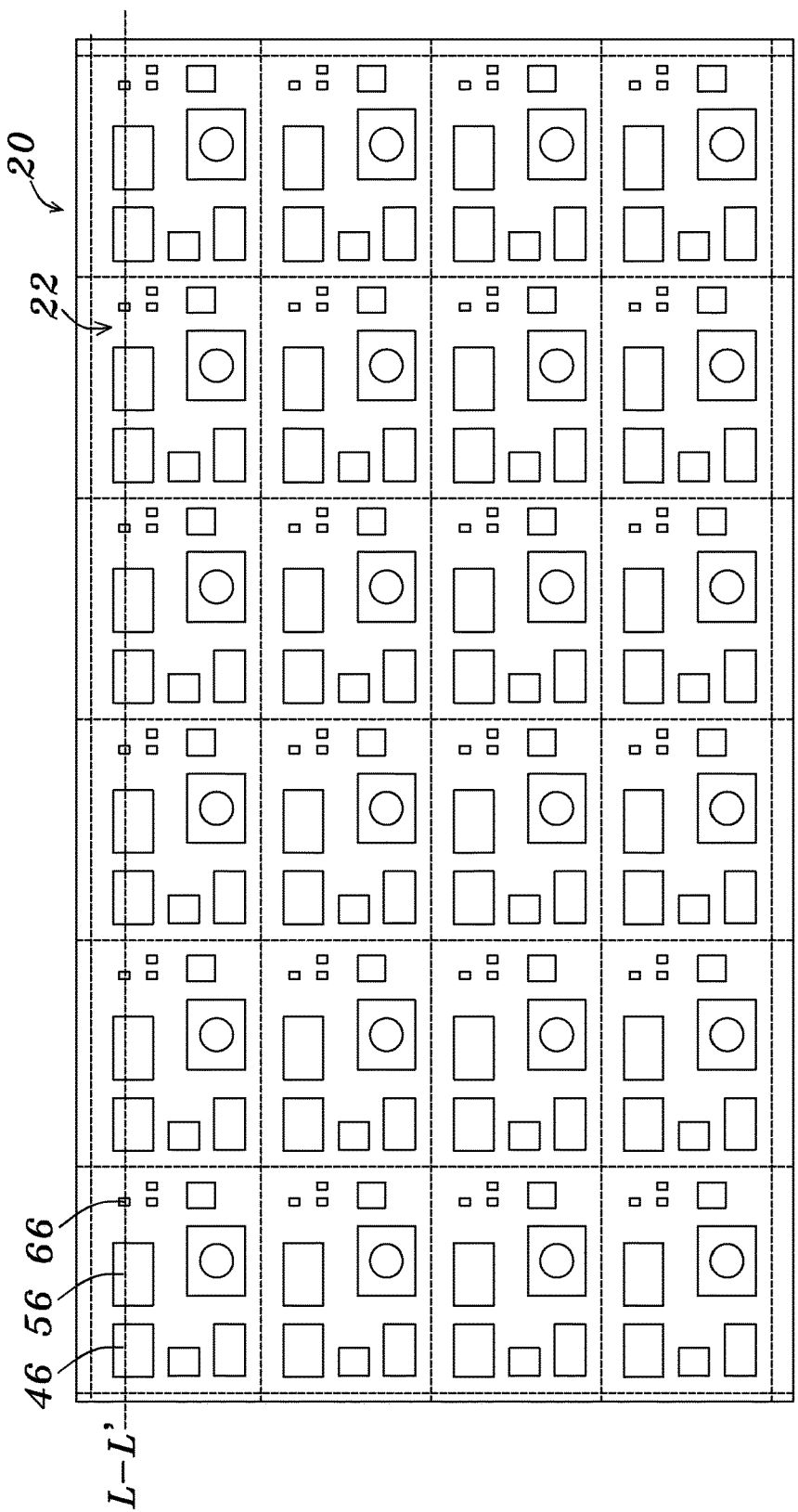

FIG. 9*y*, illustrates a top view of the first substrate 20. FIG. 9*u*-FIG. 9*w* illustrate a cross section view of Line L-L' in FIG. 9*y*. Multiple the chips 46, the chips 56 and the passive components 66 may also be provided in or on the first substrate 20.

Next, cutting the first substrate 20 to produce multiple second substrates 22.

FIG. 10*a*-FIG. 10*j* illustrates a damascene process to form the first metal layer 26, the second metal layer 28, the third metal layer 34 and the fourth metal layer 36 on a top surface and a bottom surface of the first substrate 20.

Figure 10A:
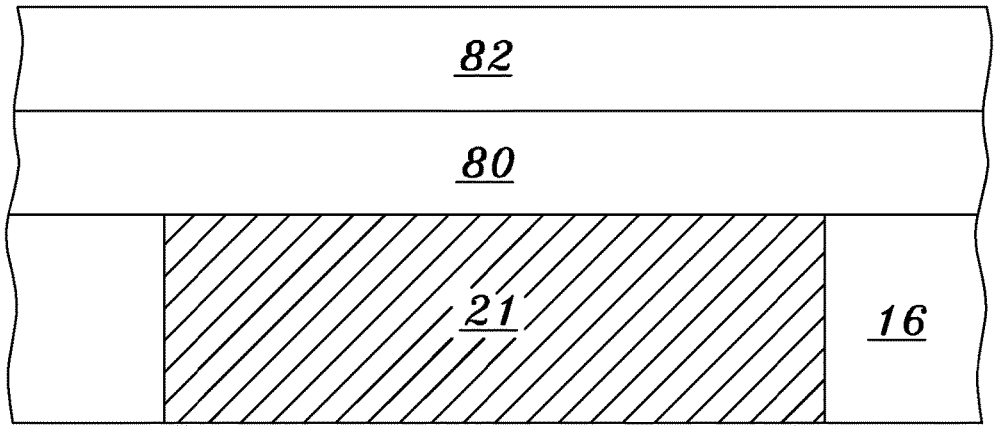
FIGS. 10a-10j illustrates a damascene process to form the metal layer on the glass substrate, in accordance with the present disclosure.
Figure 10B:
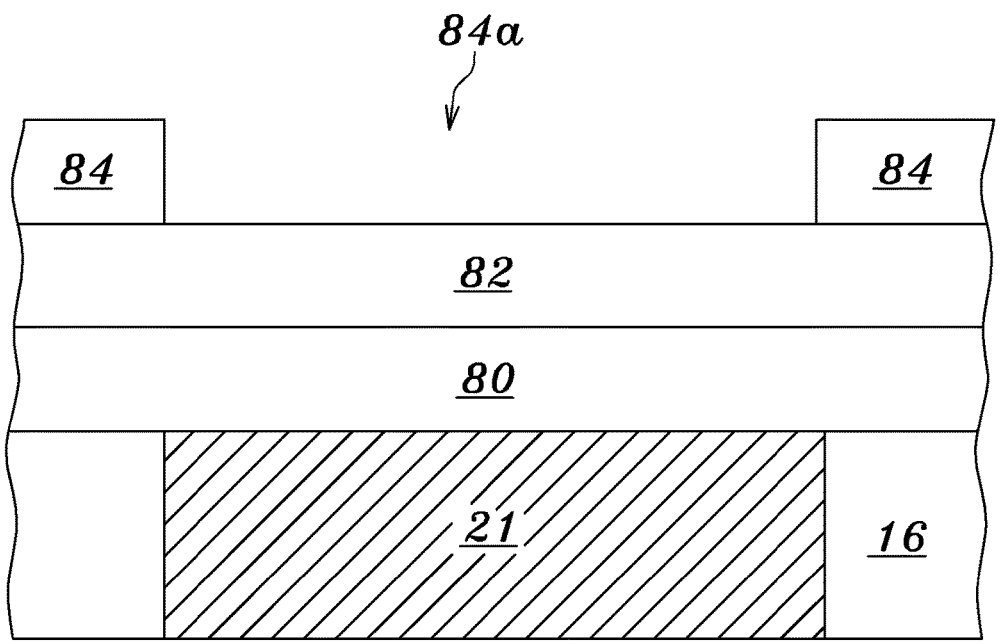
Figure 10C:
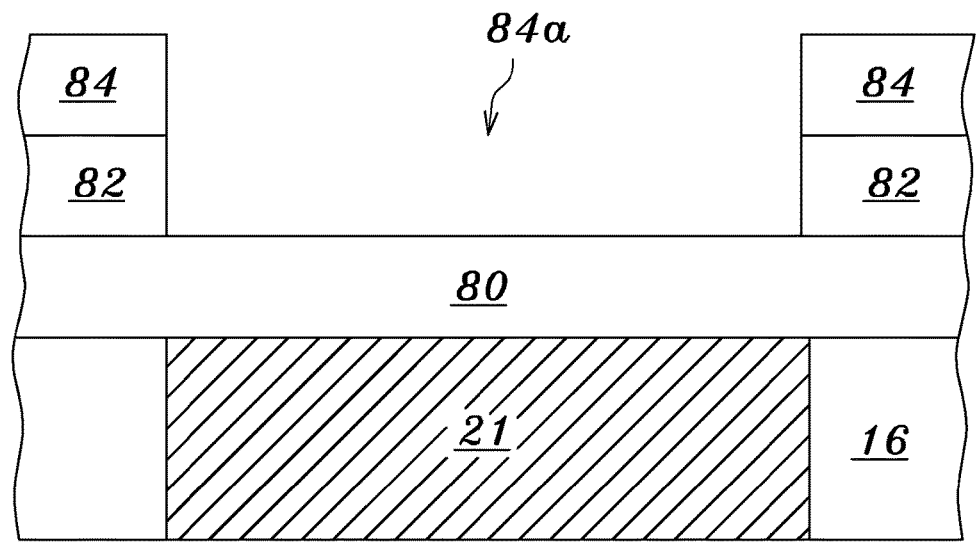
Figure 10D:
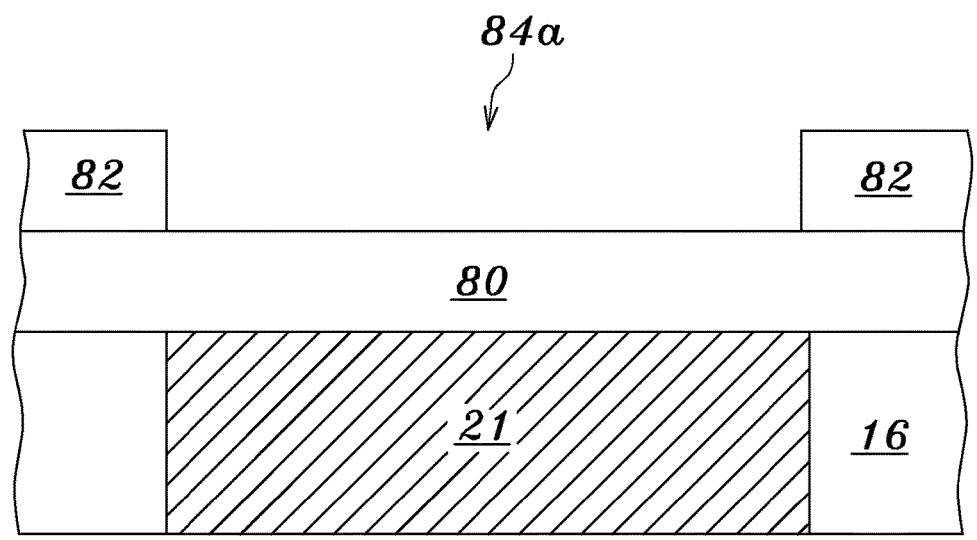
Figure 10E:
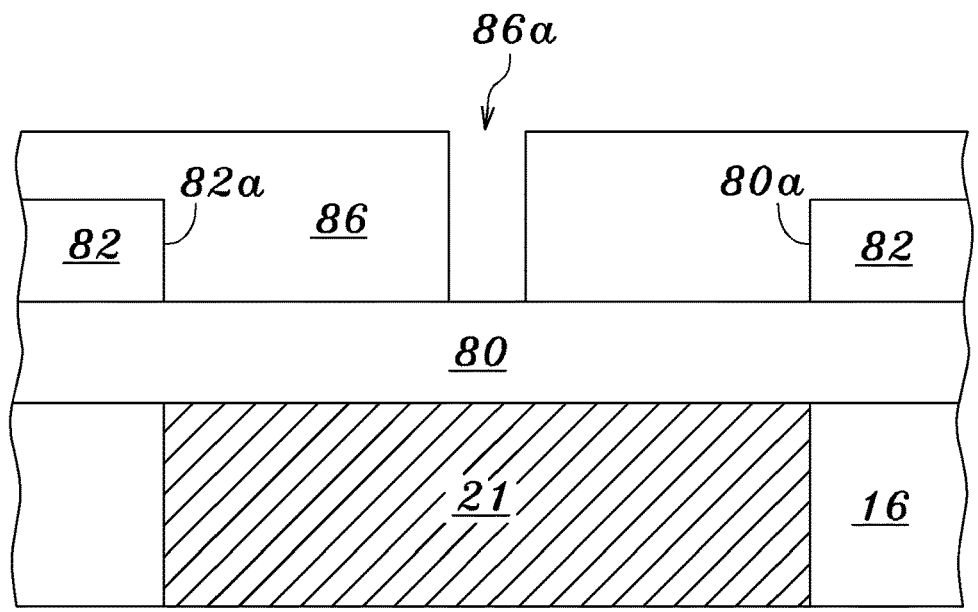
Figure 10F:
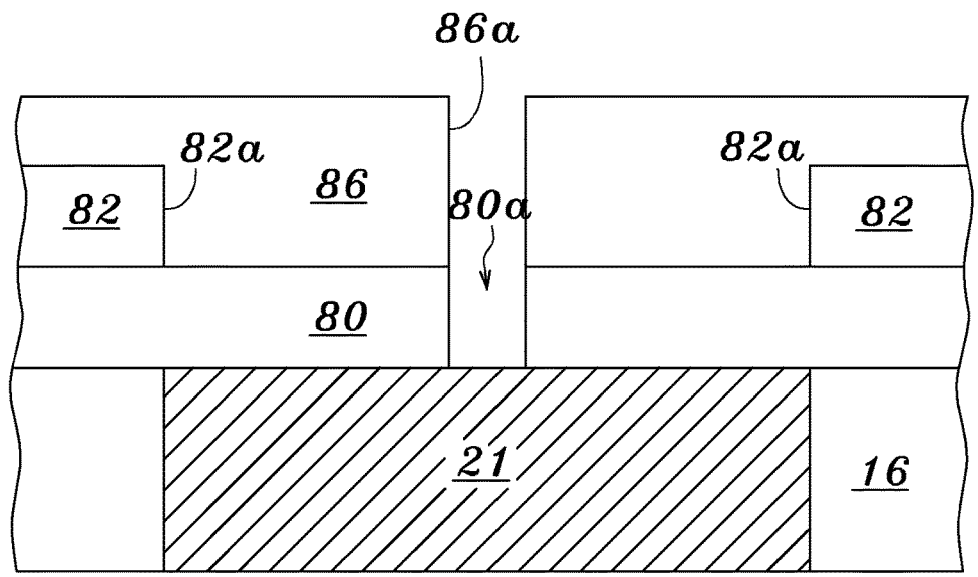
Figure 10G:
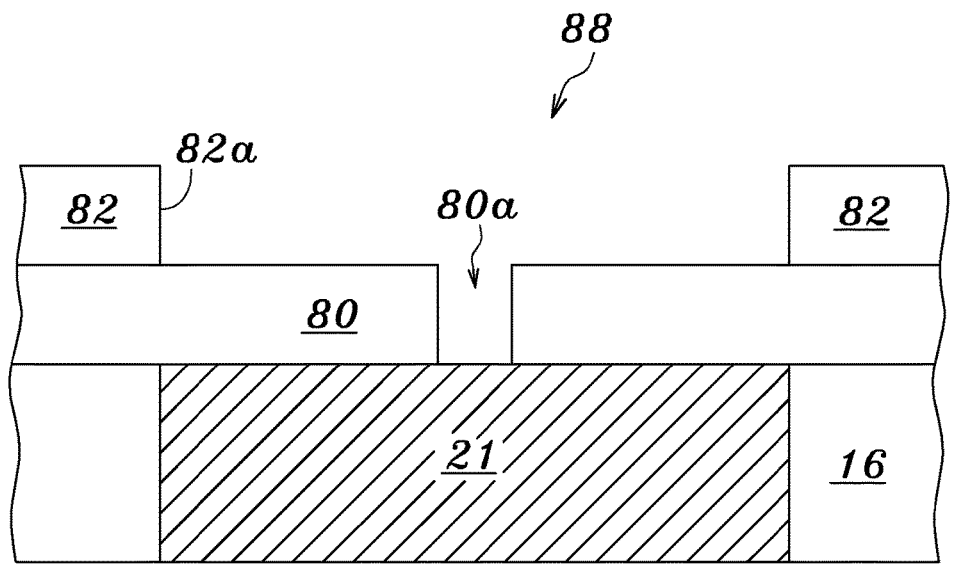
Figure 10H:
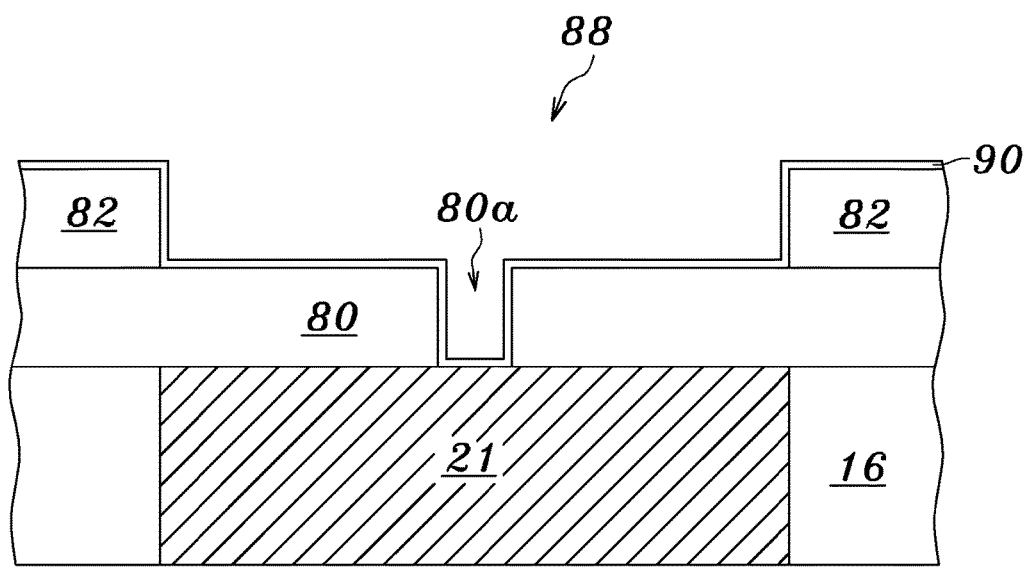
Figure 10I:
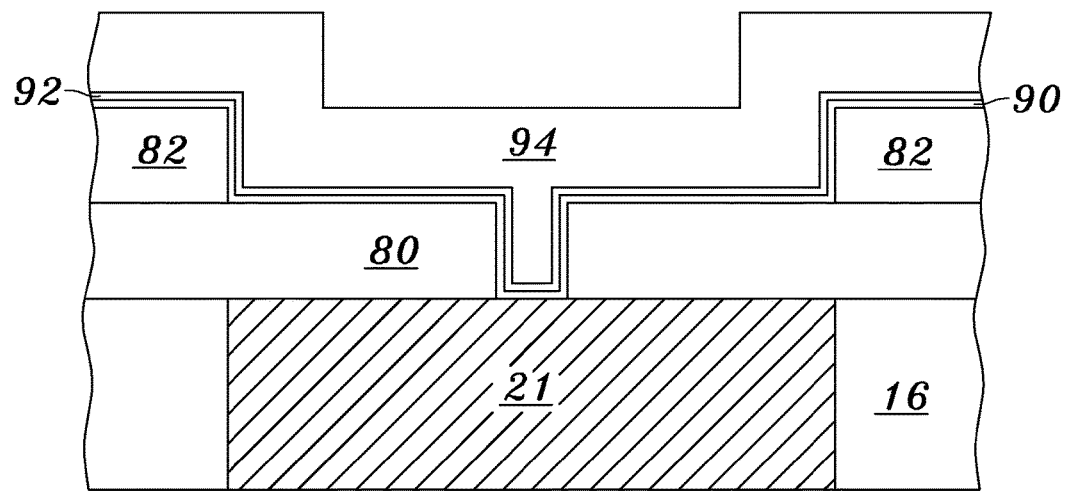
Figure 10J:
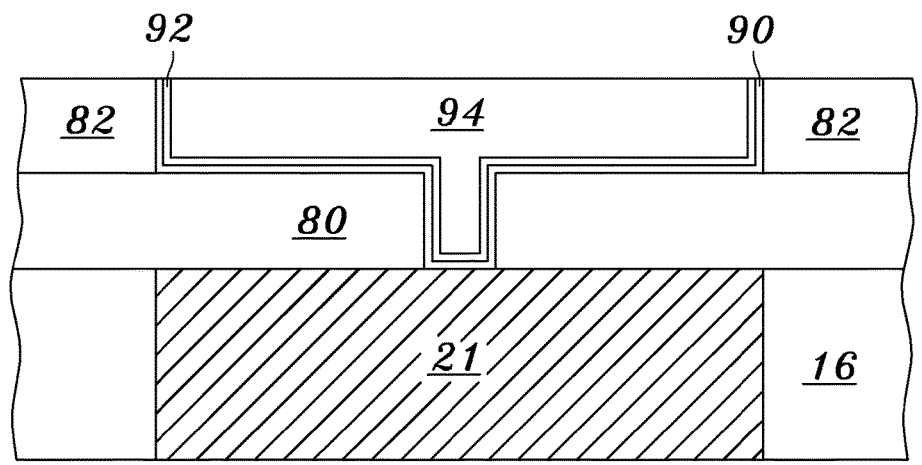

Referring to FIG. 10*a*, the dielectric layers 24 in FIG. 9*a* include two dielectric layers 80 and 82. The dielectric layer 80 is formed on the dielectric layer 82 by a chemical vapor deposition (CVD) process or a spin-on coating process, wherein each of the dielectric layers 80 and 82 may be composed of a low-K oxide layer with a thickness of between 0.3 and 5 μm, and preferably of between 0.5 and 3 μm, and an oxynitride layer on the low-K oxide layer, of a low-K polymer layer with a thickness of between 0.3 and 5 μm, and preferably of between 0.5 and 3 μm, and an oxynitride layer on the low-K polymer layer, of a low-K oxide layer with a thickness of between 0.3 and 5 μm, and preferably of between 0.5 and 3 μm, and a nitride layer on the low-K oxide layer, of a low-K polymer layer with a thickness of between 0.3 and 5 μm, and preferably of between 0.5 and 3 μm, and a nitride layer on the low-K polymer layer, or of a low-K dielectric layer with a thickness of between 0.3 and 5 μm, and preferably of between 0.5 and 3 μm, and a nitride-containing layer on the low-K dielectric layer. Next, referring to FIG. 10*b*, a photoresist layer 84 is formed on the dielectric layer 82, an opening 84*a* in the photoresist layer 84 exposing the dielectric layer 82. Next, referring to FIG. 10*c*, the dielectric layer 82 under the opening 84*a* is removed by a dry etching method to form a trench in the dielectric layer 82 exposing the dielectric layer 80. Next, referring to FIG. 10*d*, after forming the trench in the dielectric layer 82, the photoresist layer 84 is removed. Next, referring to FIG. 10*e*, a photoresist layer 86 is formed on the dielectric layer 82 and on the dielectric layer 80 exposed by the trench, an opening 86*a* in the photoresist layer 86 exposing the dielectric layer 80 exposed by the trench. Next, referring to FIG. 19*f*, the dielectric layer 80 under the opening 86*a* is removed by a dry etching method to form a via 80*a* in the dielectric layer 80 exposing the metal plugs 21 in the substrate 20. Next, referring to FIG. 10*g*, after forming the via 80*a* in the dielectric layer 80, the photoresist layer 86 is removed. Thereby, an opening 88 including the trench and the via 80*a* is formed in the dielectric layers 82 and 80. Next, referring to FIG. 10*h*, an adhesion/barrier layer 90 having a thickness of between 0.1 and 3 micrometers is formed on the metal plugs 21 exposed by the opening 88, on the sidewalls of the opening 88 and on the top surface of the dielectric layer 82. The adhesion/barrier layer 90 can be formed by a sputtering process or a chemical vapor deposition (CVD) process. The material of the adhesion/barrier layer 90 may include titanium, titanium nitride, a titanium-tungsten alloy, tantalum, tantalum nitride, or a composite of the abovementioned materials. For example, the adhesion/barrier layer 90 may be formed by sputtering a tantalum layer on the metallization structure exposed by the opening 88, on the sidewalls of the opening 88 and on the top surface of the dielectric layer 82. Alternatively, the adhesion/barrier layer 90 may be formed by sputtering a tantalum-nitride layer on the metallization structure exposed by the opening 88, on the sidewalls of the opening 88 and on the top surface of the dielectric layer 82. Alternatively, the adhesion/barrier layer 90 may be formed by forming a tantalum-nitride layer on the metallization structure exposed by the opening 88, on the sidewalls of the opening 88 and on the top surface of the dielectric layer 82 by a chemical vapor deposition (CVD) process. Next, referring to FIG. 10*i*, a seed layer 92, made of copper, having a thickness of between 0.1 and 3 micrometers is formed on the adhesion/barrier layer 90 using a sputtering process or a chemical vapor deposition (CVD) process, and then a copper layer 94 having a thickness of between 0.5 and 5 μm, and preferably of between 1 and 2 μm, is electroplated on the seed layer 92. Next, referring to FIG. 10*j*, the copper layer 94, the seed layer 92 and the adhesion/barrier layer 90 outside the opening 88 in the dielectric layers 82 and 80 are removed using a chemical mechanical polishing (CMP) process until the top surface of the dielectric layer 82 is exposed to an ambient.

FIG. 11*a*-FIG. 11*i* illustrates an embossing process to form the first metal layer 26, the second metal layer 28, the third metal layer 34 and the fourth metal layer 36 on a top surface and a bottom surface of the first substrate 20.

Referring to FIG. 11*a*, the metal plugs 21 are in the glass layer 16 of the first substrate 20, and the opening 96*a* in the dielectric layer 96 exposes the metal plugs 21.

Referring to FIG. 11*a*, a polymer layer 98 can be formed on the dielectric layer 96, and at least one opening 98*a* is formed in the polymer layer 98 by patterning the polymer layer 98 to expose at least one metal trace 6, as shown in FIG. 11*b* and FIG. 11*c*. The metal plugs 21 may include a center portion exposed by an opening 98*a* and a peripheral portion covered with the polymer layer 98, as shown in FIG. 11*b*. Alternatively, the opening 98*a* may expose the entire upper surface of the metal plugs 21 exposed by the opening 96*a* in the dielectric layer 96 and further may expose the upper surface of the dielectric layer 96 near the metal trace 6, as shown in FIG. 11*c*.

The material of the polymer layer 98 may include benzocyclobutane (BCB), polyimide (PI), polyurethane, epoxy resin, a parylene-based polymer, a solder-mask material, an elastomer, or a porous dielectric material. The polymer layer 98 has a thickness of between 3 and 25 μm or between 5 and 50 micrometers.

The polymer layer 98 can be formed by a spin-on coating process, a lamination process or a screen-printing process. Below, the process of forming a patterned polymer layer 98 is exemplified with the case of spin-on coating a polyimide layer on the dielectric layer 96 and then patterning the polyimide layer.

Referring to FIG. 11*d*, an adhesion/barrier layer 100 having a thickness of between 0.1 and 3 micrometers, and preferably between 0.5 and 2 micrometers, is formed on the polymer layer 98 and on the metal plugs 21. The adhesion/barrier layer 100 may be a titanium-tungsten-alloy layer, tantalum-containing layer, a chromium-containing layer or a titanium-nitride layer. The adhesion/barrier layer 100 may be formed by a sputtering method, an evaporation method, or a chemical vapor deposition (CVD) method.

Referring to FIG. 11*e*, a photoresist layer 102 can be formed on the adhesion/barrier layer 100 by a spin coating process or a lamination process. Referring to FIG. 11*f*, the photoresist layer 102 is patterned with the processes of exposure, development, etc., to form a photoresist opening 102*a* on the above-mentioned adhesion/barrier layer 100 over the metal plugs 21 exposed by the opening 98*a*.

Referring to FIG. 11*g*, an electroplated metal layer 104 is formed on the adhesion/barrier layer 100 in the opening 102*a*, wherein the electroplated metal layer 104 comprises a copper layer, gold layer, a nickel layer, has a thickness between 2 and 10 micrometers, between 5 and 20 micrometers or between 5 and 35 micrometers.

Figure 11H:
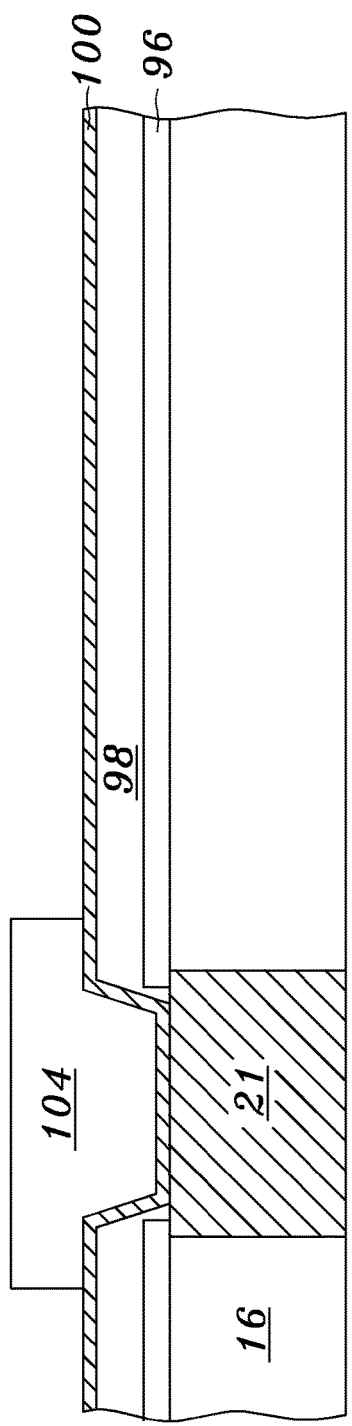

Referring to FIG. 11*h*, removing the photoresist layer 102.

Figure 11I:
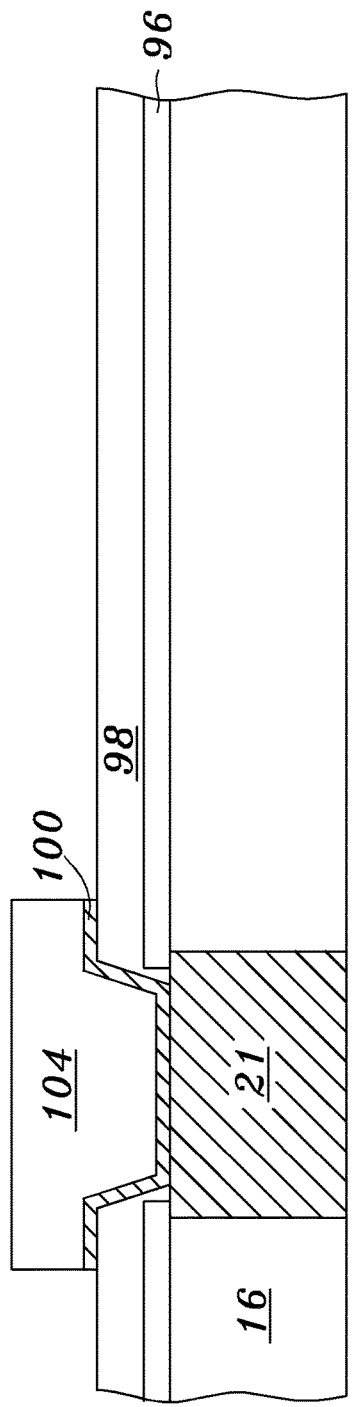

Referring to FIG. 11*i*, the above-mentioned adhesion/barrier layer 100 not under the electroplated metal layer 104 is removed with a dry etching method or a wet etching method. For example, the adhesion/barrier layer 100 made of titanium, titanium-tungsten alloy, titanium nitride, tantalum or tantalum nitride, not under the electroplated metal layer 104 is removed with a reactive ion etching (RIE) process.

First Application: Please referring to FIG. 12, the second substrates 22 is connected to a OLED display substrate through COG bonding process, wherein the OLED display substrate comprises a first glass substrate 106, a second glass substrate 108, an organic light-emitting diodes layer 110 (or a polymer light-emitting diodes layer, PLED layer) between the first glass substrate 106 and the second glass substrate 108 and multiple transparent electrodes 114. The metal bumps 72 are connected to the transparent electrodes 114 through an anisotropic conductive film (ACF) layer 116, wherein the ACF layer 116 comprises multiple conductive particles 117, such as nickel (Ni) particles, gold (Au) particles, nickel-gold alloy particles, silver-tin alloy particles, silver particles, gold plated particles, silver plated particles or nickel plated particles. The OLED display substrate comprises multiple OLED display panels. The OLED display substrate may comprise touch screen function. A least distance 106*a* between a centerline of the metal bump 72 and a boundary of the glass substrate 106 is between 3 micrometers and 10 micrometers, 5 micrometers and 15 micrometers, 10 micrometers and 25 micrometers or 20 micrometers and 40 micrometers.

Next, cutting the second substrates 22 and the OLED display substrate to produce multiple package units.

Figure 13:
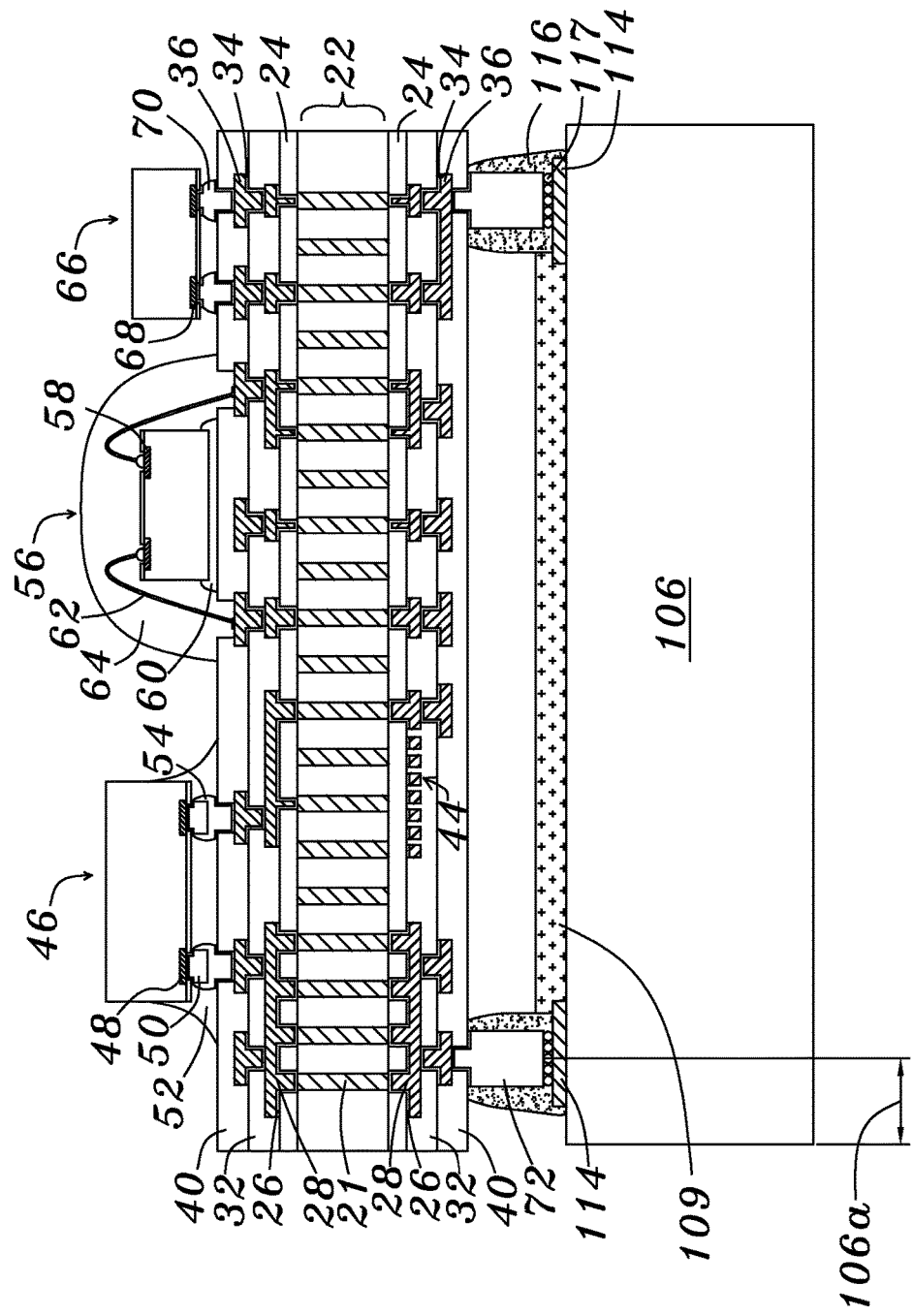
FIG. 13 illustrates a cross-section view of the glass substrate of the second application formed on a MEMs display substrate, in accordance with the present disclosure.

Second Application: Furthermore, the OLED display substrate can be replaced to a Micro Electro Mechanical Systems (MEMS) display substrate. Please referring to FIG. 13, the second substrates 22 is connected to a MEMS display substrate through COG bonding process, wherein the MEMS display substrate comprises a first glass substrate 106, a MEMS layer 109 and multiple transparent electrodes 114 formed on the first glass substrate 106. The metal bumps 72 are connected to the transparent electrodes 114 through an anisotropic conductive film (ACF) layer 116, wherein the ACF layer 116 comprises multiple conductive particles 117, such as nickel (Ni) particles, gold (Au) particles, nickel-gold alloy particles, silver-tin alloy particles, silver particles, gold plated particles, silver plated particles or nickel plated particles. The MEMS display substrate comprises multiple MEMS display panels. The MEMS display substrate may comprise touch screen function. A least distance 106*a* between a centerline of the metal bump 72 and a boundary of the glass substrate 106 is between 3 micrometers and 10 micrometers, 5 micrometers and 15 micrometers, 10 micrometers and 25 micrometers or 20 micrometers and 40 micrometers.

Next, cutting the second substrates 22 and the MEMS display substrate to produce multiple package units.

Figure 14:
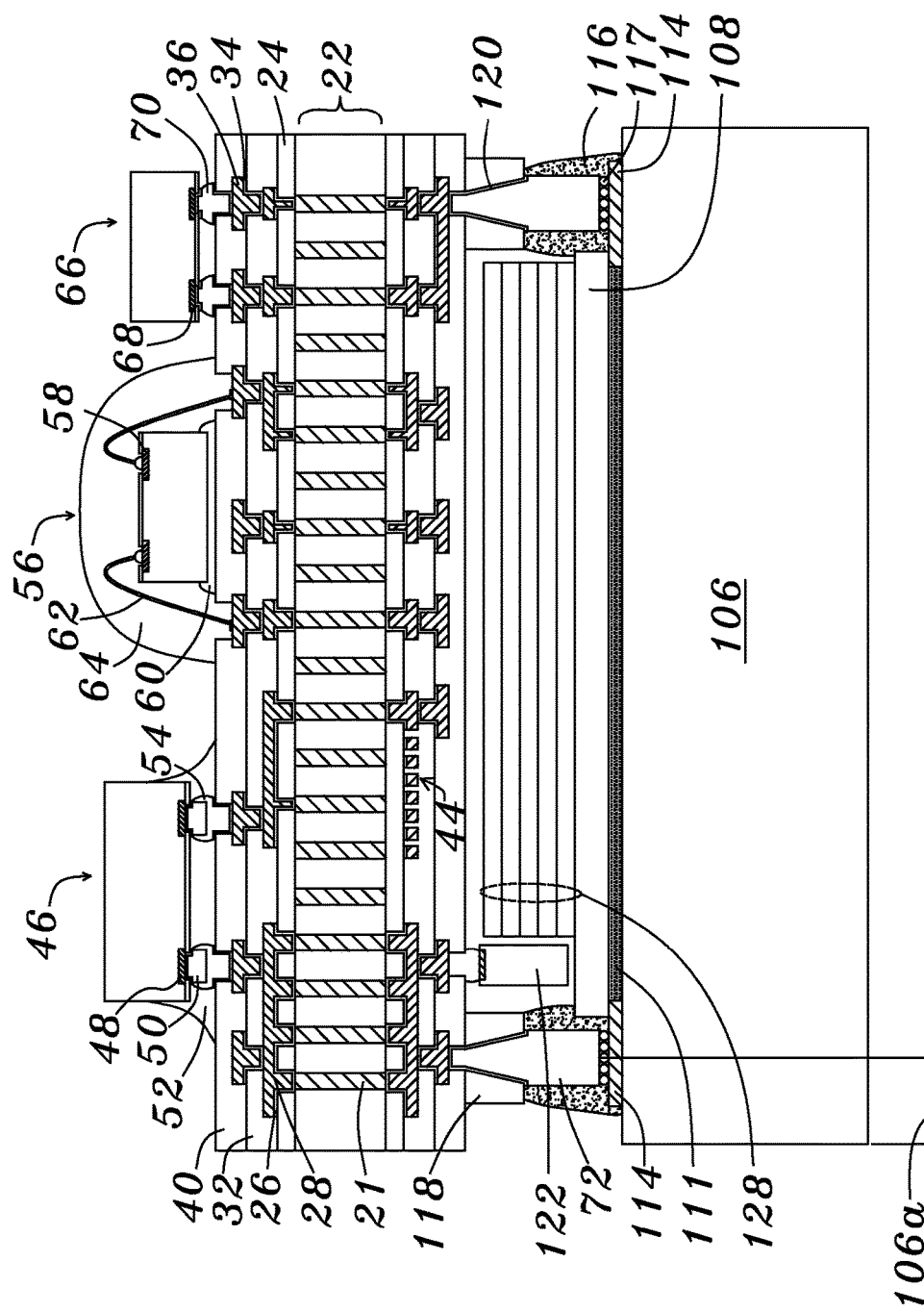
FIG. 14 illustrates a cross-section view of the glass substrate of the third application formed on a LCD display substrate, in accordance with the present disclosure.

Third application: Please referring to FIG. 14, multiple LED devices 122 are packaged on the bottom surface of the second substrates 22. The second substrates 22 is connected to a LCD display substrate through COG bonding process, wherein the LCD display substrate comprises a first glass substrate 106, a second glass substrate 108, and a transistor liquid crystal display layer 111 between the first glass substrate 106 and the second glass substrate 108 and multiple transparent electrodes 114. The metal bumps 72 are connected to the electrodes 114 through an anisotropic conductive film (ACF) layer 116, wherein the ACF layer 116 comprises multiple conductive particles 117, such as nickel (Ni) particles, gold (Au) particles, nickel-gold alloy particles, silver-tin alloy particles, silver particles, gold plated particles, silver plated particles or nickel plated particles. The LCD display substrate comprises multiple LCD display panels. The LCD display substrate may comprise touch screen function, wherein the LCD display substrate comprise an in-cell TFT LCD substrate. There are multiple optical layers 128 between the second substrates 22 and LCD display substrate, such as a diffuser sheet layer, a prism sheet layer, a diffuser layer (or diffuser plate) and a reflector layer. A least distance 106a between a centerline of the metal bump 72 and a boundary of the glass substrate 106 is between 3 micrometers and 10 micrometers, 5 micrometers and 15 micrometers, 10 micrometers and 25 micrometers or 20 micrometers and 40 micrometers.

Next, cutting the second substrates 22 and the LCD display substrate to produce multiple package units.

Figure 15:
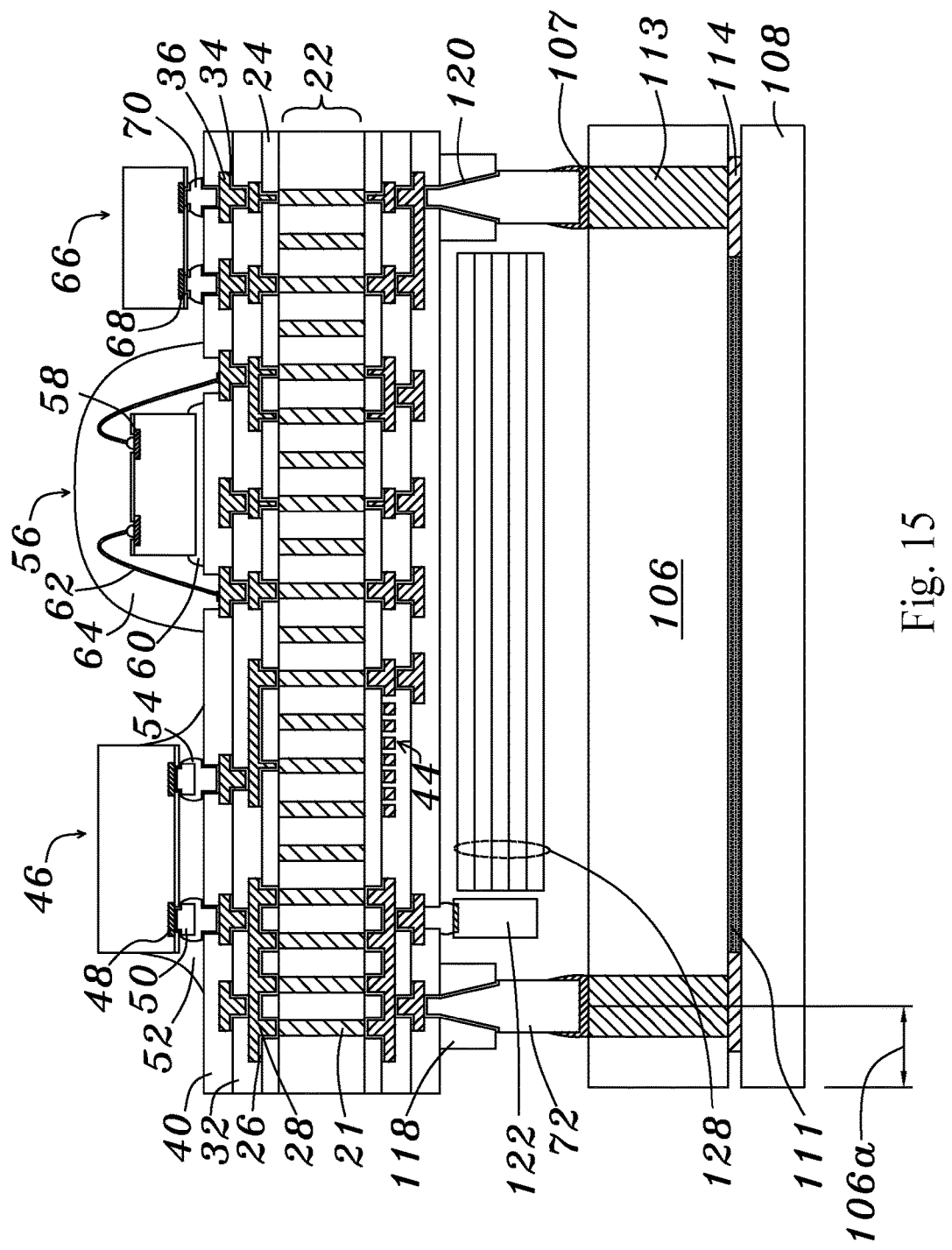
FIG. 15 illustrates a cross-section view of the glass substrate of the fourth application formed on an another LCD display substrate, in accordance with the present disclosure.

Fourth application: Referring to FIG. 15, this structure of the fourth application is similar to the structure of the third application in FIG. 14. The second substrates 22 is connected to a LCD display substrate through flip chip bonding process, wherein the LCD display substrate comprises a first glass substrate 106 and a second glass substrate 108, and a transistor liquid crystal display layer 111 and thin film transistor circuit layers (not shown) between the first glass substrate 106 and the second glass substrate 108, wherein multiple transparent electrodes 114 on bottom surface of the first glass substrate 106 and multiple metal plugs 113 in the first glass substrate 106, wherein the multiple metal plugs 113 are connected to the transparent electrodes 114 respectively. The structure of first glass substrate 106 can refer to the second substrates 22 in the invention. The metal bumps 72 are connected to the transparent electrodes 114 through a solder layer 107, wherein the solder layer 107 comprises gold-tin alloy, tin-silver alloy, tin-silver-copper alloy, indium, tin-bismuth alloy, or other lead-free alloy. The LCD display substrate comprises multiple LCD display panels. The LCD display substrate may comprise touch screen function, wherein the LCD display substrate comprising an in-cell TFT LCD substrate. There are multiple optical layers 128 between the second substrates 22 and LCD display substrate, such as a diffuser sheet layer, a prism sheet layer, a diffuser layer (or diffuser plate) and a reflector layer. A least distance 106a between a centerline of the metal bump 72 and a boundary of the glass substrate 106 is between 30 micrometers and 100 micrometers, 50 micrometers and 150 micrometers, 100 micrometers and 250 micrometers or 50 micrometers and 300 micrometers.

Figure 16:
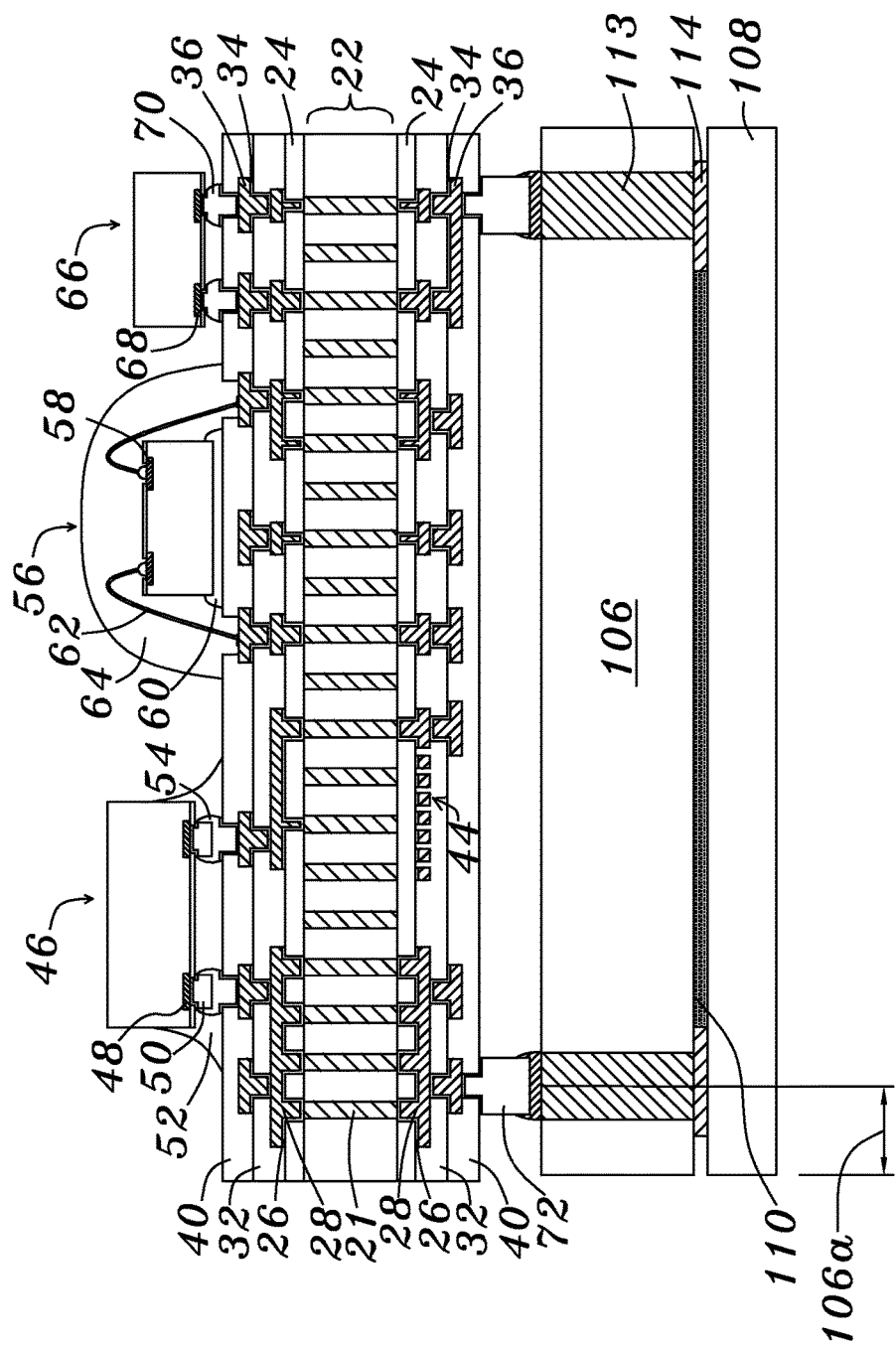
FIG. 16 illustrates a cross-section view of the glass substrate of the fifth application formed on an OLED display substrate, in accordance with the present disclosure.

Fifth application: Referring to FIG. 16, this structure of the fifth application is similar to the structure of the fourth application in FIG. 14. The organic light-emitting diodes layer 110 (or a polymer light-emitting diodes layer, PLED layer) is replaced to the liquid crystal display layer 111. The second substrates 22 is connected to a OLED display substrate through flip chip bonding process, wherein the OLED display substrate comprises a first glass substrate 106 and a second glass substrate 108, and an organic light-emitting diodes layer 110 (or a polymer light-emitting diodes layer, PLED layer) and thin film transistor circuit layers (not shown) between the first glass substrate 106 and the second glass substrate 108, wherein multiple transparent electrodes 114 on bottom surface of the first glass substrate 106 and multiple metal plugs 113 in the first glass substrate 106, wherein the multiple metal plugs 113 are connected to the transparent electrodes 114 respectively. The structure of first glass substrate 106 can refer to the second substrates 22 in the invention. The metal bumps 72 are connected to the transparent electrodes 114 through a solder layer 107, wherein the solder layer 107 comprises gold-tin alloy, tin-silver alloy, tin-silver-copper alloy, indium, tin-bismuth alloy, or other lead-free alloy. The OLED display substrate comprises multiple OLED display panels. The OLED display substrate may comprise touch screen function, wherein the OLED display substrate comprising an in-cell TFT OLED substrate. A least distance 106a between a centerline of the metal bump 72 and a boundary of the glass substrate 106 is between 30 micrometers and 100 micrometers, 50 micrometers and 150 micrometers, 100 micrometers and 250 micrometers or 50 micrometers and 300 micrometers.

Figure 17A:
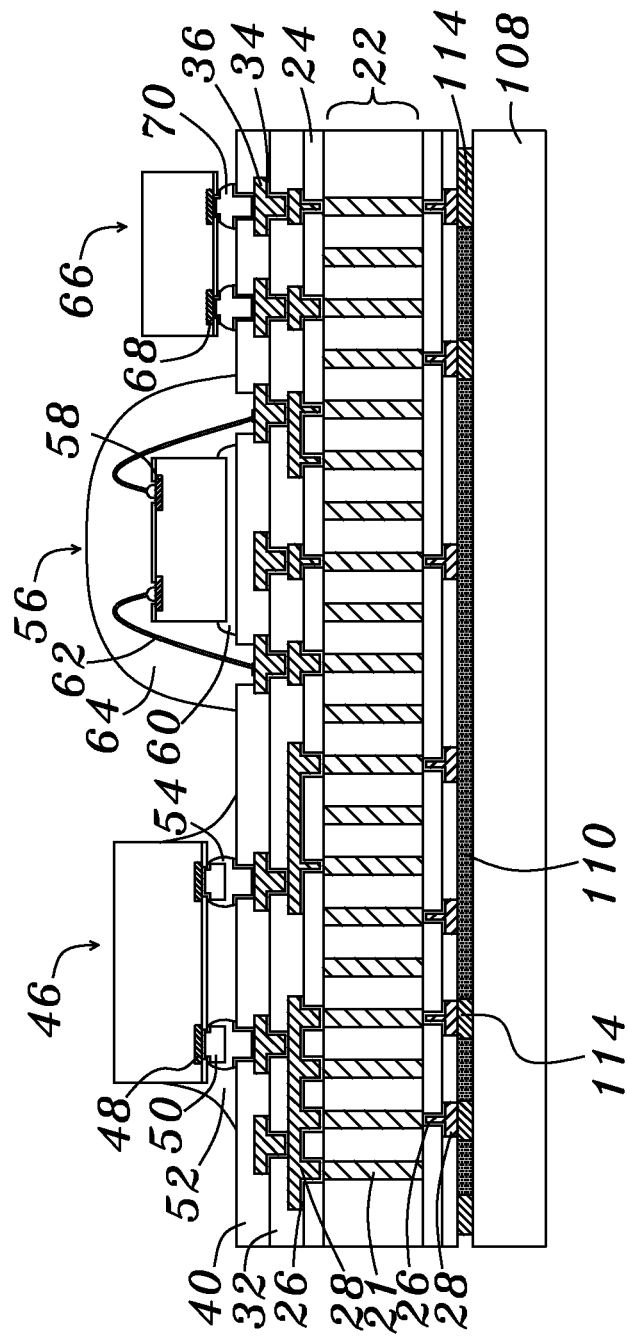
FIG. 17a illustrates a cross-section view of the glass substrate of the sixth application formed on an OLED display substrate, in accordance with the present disclosure.

Sixth application: Referring to FIG. 17a, the second substrates 22 can be a port of an OLED display substrate. The OLED display substrate comprises the second substrates 22 and second glass substrate 108, and an organic light-emitting diodes layer 110 (or a polymer light-emitting diodes layer, PLED layer), thin film transistor circuit layers (not shown) and transparent electrodes 114 between the second substrates 22 and second glass substrate 108, wherein the metal plugs 21 connected to transparent electrodes 114 through the first metal layer 26. The OLED display substrate comprises multiple OLED display panels. The OLED display substrate may comprise touch screen function, wherein the OLED display substrate comprising an in-cell TFT OLED substrate.

Figure 17B:
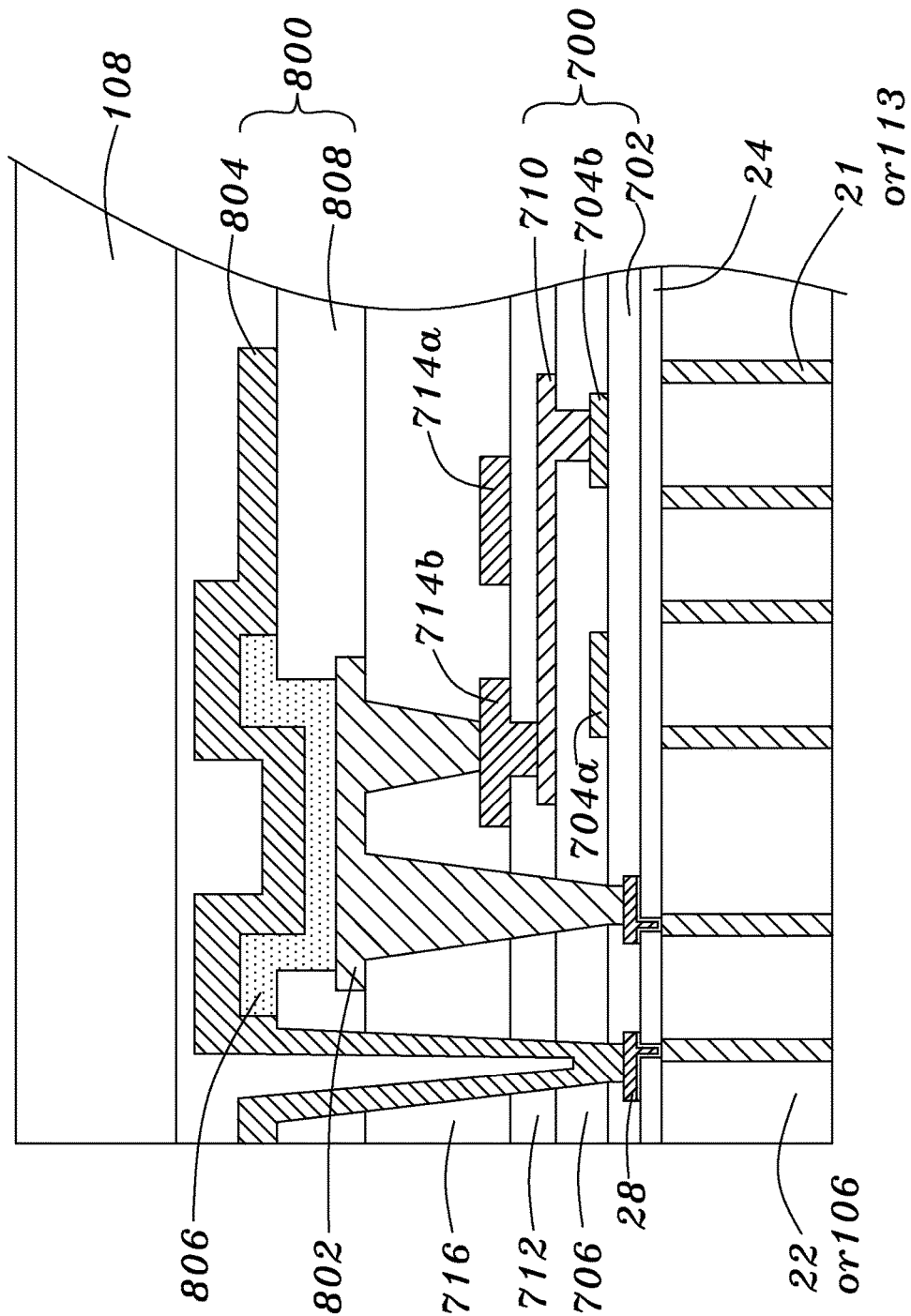
FIG. 17b illustrates a cross-section view of the structure of the OLED display substrate, in accordance with the present disclosure.

Referring to FIG. 17b, the structure of the OLED display substrate comprises multiple thin film transistors circuits 700 and multiple organic light-emitting components 800 between the second substrates 22 and second glass substrate 108, wherein the thin film transistors circuit 700 comprises a buffer layer 702, a first gate electrode 704a and a first source electrode 704b formed on the buffer layer 702, a first insulating layer 706 formed on the first gate electrode 704a, the first source electrode 704b and the buffer layer 702. An oxide semiconductor layer 710 is formed on the first insulating layer 706 over the first gate electrode 704a and the first source electrode 704b, wherein the oxide semiconductor layer 710 is connected to the first source electrode 704b through the opening in the first insulating layer 706. A second insulating layer 712 is formed on the oxide semiconductor layer 710. A second gate electrode 714a and a second source electrode 714b formed on the second insulating layer 712, wherein the second source electrode 714b connected to the oxide semiconductor layer 710 through an opening in the second insulating layer 712. A protection layer 716 is formed on the second gate electrode 714a, the second source electrode 714b and the second insulating layer 712. The organic light-emitting component 800 formed on the protection layer 716 and connected to the second source electrode 714b through an opening in the protection layer 716.

The oxide semiconductor layer 710 comprises a ZnO containing layer, wherein the ZnO containing layer can be doped with a group selected from the group constituted of at least one ionic: Gallium (Ga), indium (In), tin (Sn), zirconium (Zr), hafnium (Hf), cadmium (Cd), magnesium (Mg), vanadium (V). The first gate electrode 704a, the first source electrode 704b, the second gate electrode 714a and the second source electrode 714b are formed of a metal selected from the following groups: tungsten (W), titanium (Ti), molybdenum (Mo), silver (Ag), tantalum (Ta), aluminum (Al), copper (Cu), gold (Au), chromium (Cr) or niobium (Nb).

The organic light-emitting component 800 comprises an anode layer 802, a cathode layer 804 and an organic light-emitting layer 806 between the anode layer 802 and the cathode layer 804, wherein the anode layer 802 formed on the protection layer 716 and connected to the second source electrode 714b. A third insulating layer 808 formed on the protection layer 716 and the anode layer 802, then formed a hole/opening in the third insulating layer 808 and on the anode layer 802. Forming the organic light-emitting layer 806 in the opening and on the third insulating layer 808, then formed the cathode layer 804 on the third insulating layer 808 and on the organic light-emitting layer 806. The anode layer 802 is connected to the metal plugs 21 via a conductive layer formed on the opening through the buffer layer 702, a first insulating layer 706 and second insulating layer 712. The cathode layer 804 is connected to the metal plugs 21 via a conductive layer formed on the opening through the buffer layer 702, the first insulating layer 706, second insulating layer 712 and third insulating layer 808. The buffer layer 702, first insulating layer 706, second insulating layer 712 and third insulating layer 808 comprises a polyimide, polyamide, acryl resin, benzocyclobutene, phenol resin, oxide layer (buffer layer 702), nitride layer (buffer layer 702).

The anode layer 802 may contain one or more transparent materials such as indium tin oxide (ITO), indium zinc oxide (IZO), zinc oxide (ZnO), indium gallium oxide (IGO), aluminum zinc oxide (AZO) and In2O3, or non-transparent materials such as Ag, Mg, Al, Pt, Pd, Au, Ni, Nd, Ir, Cr, Li, Ca, Mo, Ti, W, MoW, and Al/Cu. The cathode layer 804 may contain one or more transparent materials such as indium tin oxide (ITO), indium zinc oxide (IZO), zinc oxide (ZnO), indium gallium oxide (IGO), aluminum zinc oxide (AZO) and In2O3.

The organic light-emitting layer 806 may include a hole transport layer (HTL) and a hole injection layer (HIL) stacked toward the pixel electrode (anode layer 802 or cathode layer 804), and an electron transport layer (ETL) and an electron injection layer (EIL) stacked toward the pixel electrode (anode layer 802 or cathode layer 804). Furthermore, various other layers may be stacked if required. Further, the light-emitting layer 806 comprises a carbazole biphenyl(CBP), (III)(bis(1-phenylisoquinoline) (acetyl acetonate)iridium, PIQIr(acac)), (III)(bis(1-phenylquinoline)(acetylacetonate)iridium, PQIr(acac)), (III)(tris(1-phenylquinoline)iridium (PQIr), octaethylporphyrin platinum, PtOEP, (III))(tris(dibenzoylmethane)(o-phenanthroline)europium(III), PED:Eu(DBM)3(Phen)), perylene, N,N'-Di(naphthalene-1-yl)-N,N'-diphenyl-benzidine, tris-8-hydroxyquinoline aluminum (PEDOT), copper phthalocyanine, CuPc, 4,4',4"-tris(N-(3-methylphenyl)-N-phenylamino)triphenylamine (MTDATA).

Figure 18:
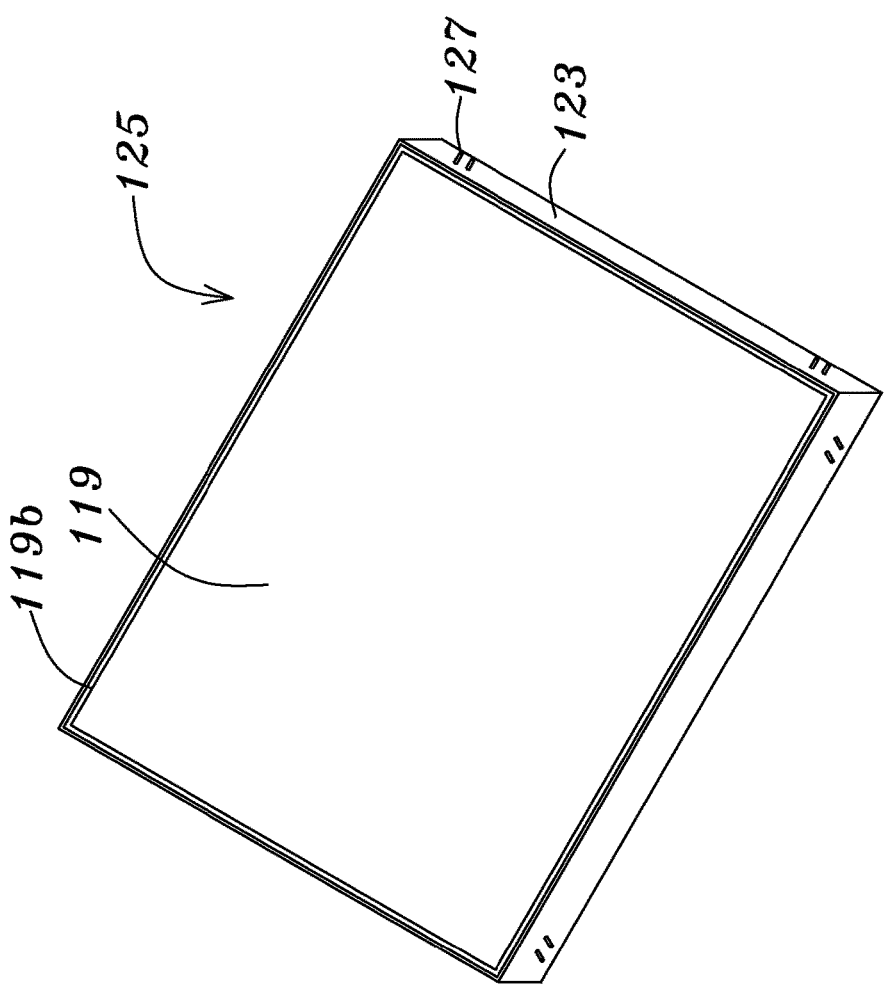
FIG. 18 illustrates a three-dimensional view of the display device, in accordance with the present disclosure.
Figure 19:
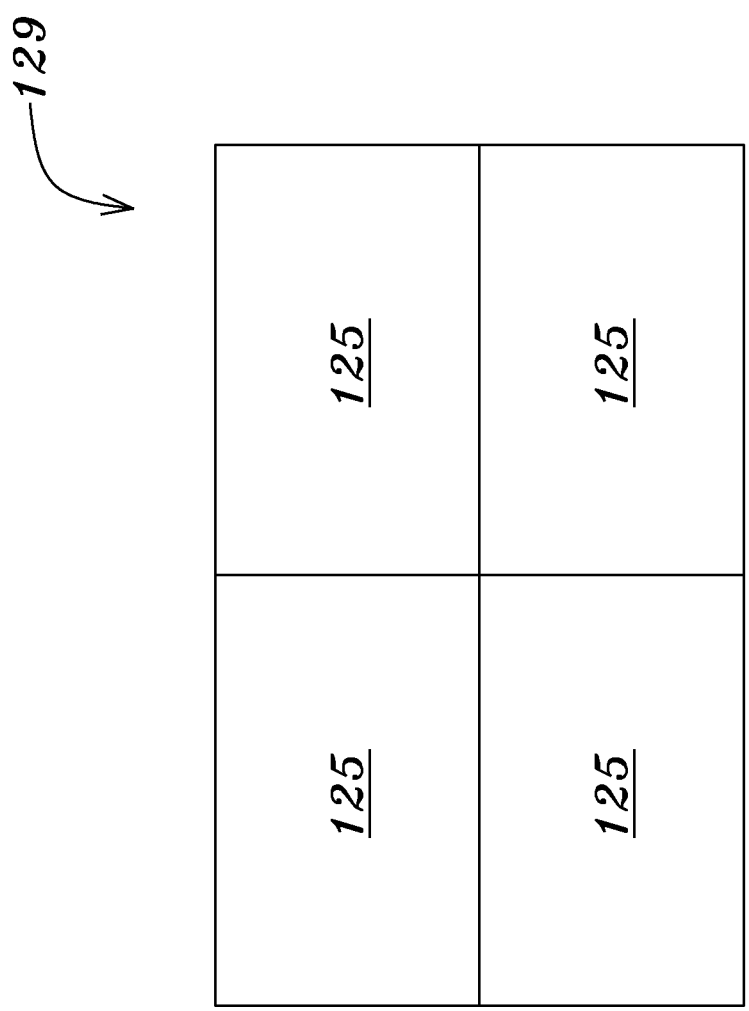
FIG. 19 illustrates a big display device combined from multiple display device, in accordance with the present disclosure.

Referring to FIG. 18 and FIG. 19, an outward of display substrate produced from above first application to sixth application is an unframed display 119, wherein the unframed display 119 comprises a display area 119a has four edges 119b, wherein a gap between the each edge 119b and one of four boundaries of the unframed display 119 has a least distance smaller than 15 micrometers, 20 micrometers, 30 micrometers, 50 micrometers, 100 micrometers, 150 micrometers or 200 micrometers. The unframed display 119 is installed in a shell 123 of a display device 125. Some components (not showed in drawings) can install in the display device 125 (or installed on the second substrates 22), for example, a speaker component, a battery component, a microphone component, a signal receiver component, a wireless signal receiver component, a wireless signal transmitter module.

Referring to FIG. 19, the display device 125 comprises multiple connecting ports 127 on the shell 123, wherein the connecting ports 127 comprise a signal connecting port, a power connecting port, and/or a ground connecting port. The display device 125 can connect to another one display device 125b to become a bigger display device 129, wherein the connecting ports 127 of the display device 125 are connected to the connecting ports 127 of the display device 125b. Multiple display devices 125 can be combined a big display device, an advertising billboards. The display devices 125 can be used as a tile on the wall of the building. The display devices 125 can be a display unit on a surface of a magic cube.

Figure 12:
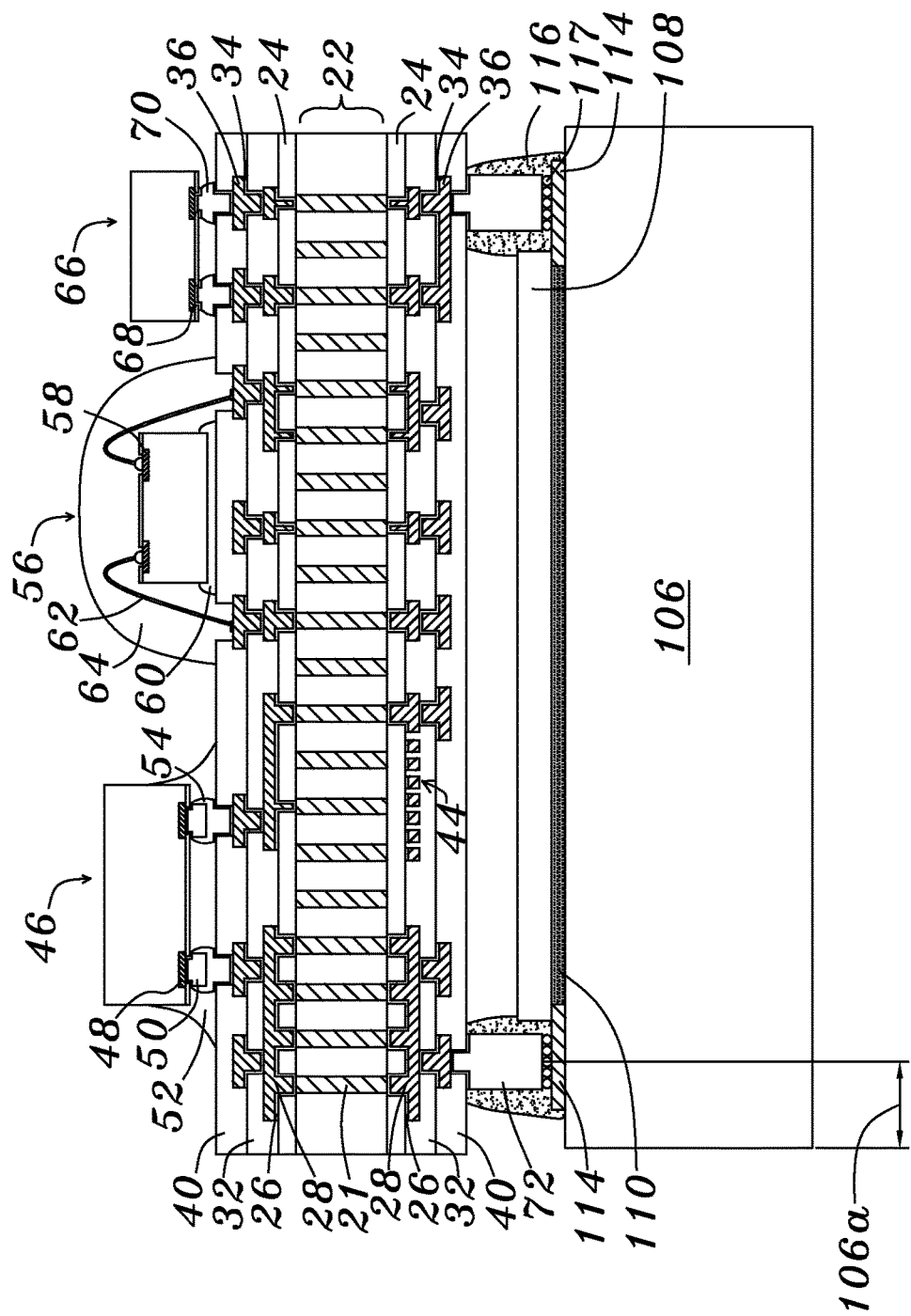
FIG. 12 illustrates a cross-section view of the glass substrate of the first application formed on an OLED display substrate, in accordance with the present disclosure.

The structure of the OLED display substrate disclosed in the FIG. 12 and FIG. 16 can be referred to the paragraph [00125] to the paragraph [00131].

Those described above are the embodiments to exemplify the present disclosure to enable the person skilled in the art to understand, make and use embodiments of the present disclosure. This description, however, is not intended to limit the scope of the present disclosure. Any equivalent modification and variation according to the spirit of the present disclosure is to be also included within the scope of the claims stated below.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Suitable software can include computer-readable or machine-readable instructions for performing methods and techniques (and portions thereof) of designing and/or controlling the fabrication and design of integrated circuit chips according to the present disclosure. Any suitable software language (machine-dependent or machine-independent) may be utilized. Moreover, embodiments of the present disclosure can be included in or carried by various signals, e.g., as transmitted over a wireless radio frequency (RF) or infrared (IR) communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. The scope of protection is limited solely by the claims. That scope is intended and should be interpreted to be as broad as is consistent with the ordinary meaning of the language that is used in the claims when interpreted in light of this specification and the prosecution history that follows and to encompass all structural and functional equivalents.

What is claimed is:

1. A OLED display panel device comprising:
    a first glass substrate has a first surface and a second surface opposed to said first surface, wherein said first surface is parallel to said second surface, multiple metal conductors extending through said first glass substrate beginning at said first surface and ending at said second surface, wherein a first metal layer is over said first surface, a second metal layer is over said first surface and a top most dielectric layer is over said first and second metal layers, wherein said first and second metal layers are connected to one of said metal conductors respectively, wherein a bottom most metal layer is under said second surface and a bottom most dielectric layer is cover said bottom most, metal layer, wherein said bottom most metal layer is connected to one of said metal conductors;

a second glass substrate stacks over said first glass substrate;

multiple organic light-emitting (OLED) components between said first and second glass substrates, wherein one of said organic light-emitting component comprises an anode layer, a cathode layer and an organic light-emitting layer between said anode layer and said cathode layer, wherein said anode layer is directly connected to said first metal layer through a first opening in said top most dielectric layer, wherein said a portion of said anode layer is in said first opening, and wherein said cathode layer is directly connected to said second metal layer through a second opening in said top most dielectric layer; and a first chip bonded and under said first glass substrate, wherein said first chip comprises a metal bump connected to said bottom most metal layer through a third opening in said bottom most dielectric layer, wherein said metal bump is connected to said anode layer through said third opening, said bottom most metal layer, said one of said metal conductors and said first metal layer.

2. The OLED display panel device of claim 1, wherein said anode layer comprises a transparent electrode layer.

3. The OLED display panel device of claim 1, wherein said cathode layer comprises a transparent electrode layer.

4. The OLED display panel device of claim 1, wherein said anode layer comprises copper.

5. The OLED display panel device of claim 1, wherein said bottom most dielectric layer comprises a polymer layer.

6. The OLED display panel device of claim 1, wherein said metal conductor comprises a copper metal layer.

7. The OLED display panel device of claim 1, wherein said metal bump comprises a gold metal layer.

8. The OLED display panel device of claim 1, wherein said metal bump comprises a copper metal layer and gold metal layer over said copper layer.

9. The OLED display panel device of claim 1, wherein said metal bump comprises a solder layer.

10. The OLED display panel device of claim 1 further comprising a second chip under said second glass substrate, wherein a metal pad of said second chip is connected to one of said metal conductors through a metal wire.

11. The OLED display panel device of claim 1, wherein said first metal layer comprises an adhesion metal layer and a third metal layer over said adhesion metal layer.

12. The OLED display panel device of claim 1 further comprising a metal trace formed on said first glass substrate, wherein said metal trace is connected to said metal bump and one of said metal conductors.

13. The OLED display panel device of claim 12, wherein said metal trace comprises a copper layer.

14. The OLED display panel device of claim 12, wherein said metal trace comprises an aluminum layer.

15. The OLED display panel device of claim 1 further comprising a metal connection structure is on said first surface, wherein said metal connection structure comprises a first dielectric layer on said first surface, wherein a third opening is in said first dielectric layer and exposed a top surface of said metal conductor, a second dielectric layer on said first dielectric layer, wherein a fourth opening is in said second dielectric layer and exposed said top surface of said metal conductor, said third opening and a top surface of said first dielectric layer, a third metal layer on said top surface of said metal conductor, on said a sidewall of said third opening, on said top surface of said first dielectric layer and on said sidewall of said fourth opening and a fourth metal layer on said third metal layer and in said first and fourth openings, wherein a top surface of said fourth metal layer, a top surface of said second dielectric layer, a top surface of said third metal layer are coplanar.

16. The OLED display panel device of claim 1 further comprising a metal connection structure is on said second surface, wherein said metal connection structure comprises a first dielectric layer on said second surface, wherein a third opening is in said first dielectric layer and exposed a bottom surface of said metal conductor, a second dielectric layer on said first dielectric layer, wherein a fourth opening is in said second dielectric layer and exposed said bottom surface of said metal conductor, said third opening and a bottom surface of said first dielectric layer, a third metal layer on said bottom surface of said metal conductor, on said a sidewall of said third opening, on said bottom surface of said first dielectric layer and on said sidewall of said fourth opening and a fourth metal layer on said third metal layer and in said first and fourth openings, wherein a bottom surface of said fourth metal layer, a bottom surface of said second dielectric layer, a bottom surface of said third metal layer are coplanar.

17. The OLED display panel device of claim 1 further comprising multiple discrete passive components formed on said second glass substrate.

18. The OLED display panel device of claim 17, wherein said discrete passive component comprises a discrete capacitor.

19. The OLED display panel device of claim 1 further comprising a first metal trace formed on said first surface and a second metal trace formed on said second surface, wherein said first metal trace is connected to said second metal trace through one of said metal conductors.

20. The OLED panel display device of claim 1, wherein said third metal layer comprises an adhesion metal layer and a fifth metal layer over said adhesion metal layer.

* * * * *